(12) United States Patent
Ema

(10) Patent No.: US 7,741,213 B2
(45) Date of Patent: Jun. 22, 2010

(54) SEMICONDUCTOR DEVICE, DRAM INTEGRATED CIRCUIT DEVICE, AND METHOD OF PRODUCING THE SAME

(75) Inventor: Taiji Ema, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/285,848

(22) Filed: Oct. 15, 2008

(65) Prior Publication Data

US 2009/0121318 A1    May 14, 2009

Related U.S. Application Data

(60) Division of application No. 11/060,796, filed on Feb. 18, 2005, now Pat. No. 7,495,275, which is a continuation of application No. PCT/JP03/16781, filed on Dec. 25, 2003.

(30) Foreign Application Priority Data

Dec. 27, 2002  (JP) ............................. 2002-380637

(51) Int. Cl.
*H01L 21/4763* (2006.01)
(52) U.S. Cl. .................. 438/622; 438/243; 438/256; 438/386; 438/618; 257/E21.585
(58) Field of Classification Search ............... 438/243, 438/256, 386, 399, 618, 622, 637; 257/E21.585
See application file for complete search history.

(56) References Cited

U.S. PATENT DOCUMENTS

| | | | |
|---|---|---|---|
| 6,020,644 A | 2/2000 | Tanigawa | |
| 6,043,528 A | 3/2000 | Aoki et al. | |
| 6,259,149 B1 | 7/2001 | Burkhardt et al. | |
| 6,417,533 B2 | 7/2002 | Kawata et al. | |
| 6,433,381 B2 | 8/2002 | Mizutani et al. | |
| 6,541,333 B2 | 4/2003 | Shukuri et al. | |

(Continued)

FOREIGN PATENT DOCUMENTS

JP    05-152449    6/1993

(Continued)

OTHER PUBLICATIONS

Japanese Office Action mailed Feb. 17, 2009, issued in corresponding Japanese Application No. 2004-564530.

(Continued)

*Primary Examiner*—Jack Chen
(74) *Attorney, Agent, or Firm*—Westerman, Hattori, Daniels & Adrian, LLP

(57) ABSTRACT

A semiconductor device with a multi-layer wiring structure includes a first conductive region: a second conductive region that has an upper surface located in a higher position than the first conductive region with respect to the substrate; an insulating that covers the first and second conductive regions; a wiring groove that is formed in the insulating film so as to expose the second conductive region; a contact hole that is formed in the insulating film so as to expose the first conductive region; and a wiring pattern that fills the wiring groove and the contact hole. In this semiconductor device, the upper surface of the wiring pattern is located on the same plane as the upper surface of the insulating film.

3 Claims, 47 Drawing Sheets

U.S. PATENT DOCUMENTS

| | | |
|---|---|---|
| 6,780,707 B2 * | 8/2004 | Lee .................... 438/241 |
| 2002/0014648 A1 | 2/2002 | Mizutani et al. |
| 2002/0153548 A1 | 10/2002 | Mizutani et al. |
| 2002/0153554 A1 | 10/2002 | Kajita et al. |
| 2002/0179955 A1 | 12/2002 | Morimoto et al. |
| 2004/0135185 A1 | 7/2004 | Yabuki |

FOREIGN PATENT DOCUMENTS

| | | |
|---|---|---|
| JP | 9-232534 A | 9/1997 |
| JP | 10-200075 | 7/1998 |
| JP | 10-223858 A | 8/1998 |
| JP | 11-214650 | 8/1999 |
| JP | 11-354749 A | 12/1999 |
| JP | 2000-077407 A | 3/2000 |
| JP | 2001-274328 A | 10/2001 |
| JP | 2002-050748 | 2/2002 |
| JP | 2002-134607 A | 5/2002 |
| JP | 2002-319625 A | 10/2002 |
| JP | 2004-134611 A | 4/2004 |

OTHER PUBLICATIONS

Japanese Office Action mailed Jan. 5, 2010, issued in corresponding Japanese Application No. 2004-564530.

* cited by examiner

SEMICONDUCTOR DEVICE, DRAM INTEGRATED CIRCUIT DEVICE, AND METHOD OF PRODUCING THE SAME

CROSS REFERENCE TO RELATED APPLICATIONS

The present invention is a divisional of U.S. patent application Ser. No. 11/060,796, filed on Feb. 18, 2005, which is a continuation application filed under 35 U.S.C. 111 (a) claiming benefit under 35 U.S.C. 120 and 365(c) of PCT application JP2003/016781 filed on Dec. 25, 2003 based on Japanese priority application 2002-380637 filed on Dec. 27, 2002, the entire contents of each are incorporated herein as reference.

BACKGROUND OF THE INVENTION

The present invention generally relates to semiconductor devices including DRAM integrated circuit devices and methods of producing the semiconductor devices, and, more particularly, to a semiconductor device and a DRAM integrated circuit device that have a multi-layer wiring structure with contact plugs or via plugs having different depths.

At present, a semiconductor device normally has a multi-layer wiring structure that is flattened by a CMP (chemical mechanical polishing) technique to connect with a number of elements formed on a substrate. In a typical multi-layer wiring structure, wiring layers and interlayer insulating films are alternately formed, and wiring layers or conductive portions having an interlayer insulating film in between are electrically connected to each other with a contact plug or the like. The contact plugs formed in such a multi-layer wiring structure have different depths depending on the conductive portions to be connected, such as the locations of diffusion regions or gate regions.

Particularly, in the case of a minute DRAM integrated circuit device or an integrated circuit device including DRAMs, scattering of the charge accumulated in the memory cell capacitors should preferably be restricted, and a sufficiently long refreshing period should be secured. To so do, it is necessary to restrict the occurrence of lattice defects in the diffusion regions in the MOSFETS that form the memory cell transistor. Therefore, it is also necessary to reduce the impurity concentration in the diffusion regions. Contact plug to be in contact with diffusion regions with low impurity concentration are preferably made of polysilicon of the same conductivity type, so as to obtain low contact resistance with respect to Si.

SUMMARY OF THE INVENTION

Meanwhile, a DRAM integrated circuit device or an integrated circuit device containing DRAMs normally includes peripheral circuits or various logical circuits, as well as DRAM memory cells. Those circuits usually include CMOS circuits. In such CMOS circuits, contact plugs cannot be made of polysilicon of a certain conductivity type. Therefore, the contact resistance needs to be reduced by increasing the impurity concentration in the diffusion regions with metal plugs having the optimum work function with respect to either an n-type diffusion region or a p-type diffusion region.

However, if DRAMs each having the above described structure are combined, the process for producing a semiconductor integrated circuit device becomes very complicated.

To counter this problem, contact holes with different depths may be formed at the same time. However, this method causes the following problems.

FIG. 1 is a cross-sectional view of a hypothetical semiconductor device in which a polysilicon plug is formed in a contact hole, a metal plug is formed in another contact hole, and contact holes with different depths are simultaneously formed with one mask.

As shown in FIG. 1, this hypothetical semiconductor device is formed on a silicon substrate 570 that has a device shallow trench isolation (STI) region 570A. Gate structures 570G are formed on the silicon substrate 570 via a gate insulating film 571I. Each of the gate structures 570G includes a polycide gate electrode 571 and a nitride film pattern 572 formed on the gate electrode 571. The gate structures 570G are covered with a side wall insulating film 573 that is made of nitride film.

An interlayer insulating film 570B is formed on the silicon substrate 570, so as to cover the gate structure 570G. Contact holes 595 and 596 are formed in the interlayer insulating film 570B. The contact holes 595 and 596 serve to obtain electric connection with diffusion regions 561A and 561B formed in the silicon substrate 570. Also, a contact hole 597 is formed in the interlayer insulating film 570B. The contact hole 597 serves to obtain electric connection with the polycide gate electrode 571.

In the structure shown in FIG. 1, a polysilicon plug 581 is formed in contact with the diffusion region 561B, so as to reduce the contact resistance even with very low concentration of n-type diffusion region. The contact hole 596 is formed to expose the polysilicon plug 581.

In this manner, the contact holes 595, 596, and 597 with different depths are formed in the hypothetical semiconductor device.

However, when the contact holes 595 through 597 with different depths from one another are formed at the same time, the polysilicon plug 581 in the contact hole 596 is etched, as etching is performed so that the deeper contact hole 595 reaches the diffusion region 561. In some cases, even the gate electrodes 571 are exposed by the etching. As a result, overetching as indicated by reference numerals 591 and 592 is caused.

As the contact hole 596 is filled with a conductor such as tungsten to complete the semiconductor device, a degradation of breakdown or shortage is caused between the gate electrodes 571 adjacent to the diffusion region 561B and a wiring pattern that is connected to the diffusion region 561B via the contact hole 596.

Especially, in a case where the contact hole 596 has a great diameter or a misalignment to polysilicon plug is caused, etching is performed until the gate electrodes 571 are exposed, resulting in short-circuiting between the gate electrodes 571 and the metal material filling the contact hole 596 as explained in FIG. 2.

FIG. 2 is a cross-sectional view of a semiconductor device that is produced by performing the etching where the resist pattern for the contact hole 596 is misaligned to polysilicon plug.

As shown in FIG. 2, if an opening 599 is not aligned with the polysilicon plug 581, overetching 593 is caused on the gate electrode 571, and the problem of short-circuiting between the metal material filling the contact hole 596 and the gate electrode 571.

In a very fine DRAM integrated circuit device or an integrated circuit device containing DRAMs, it is important to reduce the parasitic capacitance of the wiring pattern in the DRAM memory cell region, because the capacitance of the memory cell capacitors is very small. On the other hand, in the peripheral circuit region or the logical circuit region, it is important to reduce the resistance of the wiring pattern so as to increase the operating speed.

For example, Japanese Laid-Open Patent Application No. 2002-50748 discloses a structure in which an already formed wiring pattern is partially etched so as to lower the height of the wiring pattern and reduce the parasitic resistance of the wiring pattern. In this conventional structure, however, as the surface of the existing wiring pattern is etched, the etching is facilitated on the grain boundaries of the metallic crystals that form the wiring pattern. As a result, the thickness of the wiring pattern is locally varied, and problems with the reliability of the semiconductor device, such as deterioration of electromigration immunity, are caused. Also in this conventional structure, as all the contact plugs are made of metal, it is necessary to increase the impurity concentration in the diffusion region in contact with the contact plugs. In a DRAM memory cell transistor or the like, the charge accumulated in the memory cell capacitors is easily lost due to a lattice defect, and therefore, a refreshing operation needs to be performed at short intervals. If the impurity concentration in the diffusion region is reduced to prevent this problem, the problem of an increase in contact resistance is caused due to a Schottky barrier.

Japanese Laid-Open Patent Application No. 10-223858 discloses a structure in which a step portion is formed in an interlayer insulating film between the memory cell region and the peripheral circuit region, and a shallow wiring groove is formed in the memory cell region while a deep wiring groove is formed in the peripheral circuit region. In this structure, the parasitic capacitance of the wiring pattern is reduced in the memory cell region, and the parasitic resistance of the wiring pattern is reduced in the peripheral circuit region. In this conventional structure, however, it is necessary to form contact holes in the shallow wiring groove and the deep wiring groove at the same time. Therefore, the problem of a small depth of focus cannot be avoided at the time of exposure of the fine pattern having the step portion. In this prior art, the same problem as that shown in FIG. 2 is also caused, when a misalignment occurs at the time of formation of the contact holes.

Japanese Laid-Open Patent Application No. 10-200075 also discloses a structure in which a step portion is formed in an interlayer insulating film between the memory cell region and the peripheral circuit region, and a shallow wiring groove is formed in the memory cell region while a deep wiring groove is formed in the peripheral circuit region. In this conventional structure, however, the above described problem with the depth of focus cannot be avoided at the time of formation of the contact holes. Also, since contact plugs are simultaneously formed in all the contact holes including CMOS circuits in this conventional structure, the contact plugs need to be made of a metal. Therefore, the above described problems of leakage of accumulated charge and an increase in contact resistance cannot be avoided in the DRAM memory cell transistor.

Further, Japanese Laid-Open Patent Application No. 2000-77407 discloses a semiconductor device in which a self-aligned contact structure is combined with wiring patterns formed by the damascene technique. In this structure, a wiring groove in which a wiring pattern is to be formed is made shallow so as to reduce the parasitic capacitance of the wiring pattern, and a partially deeper wiring groove is also formed so as to obtain a wiring pattern with low parasitic resistance. In this conventional structure, however, the shallow wiring pattern is designed to be in contact with the upper surface of a via plug. Where the deeper wiring pattern passes over the via plug, the deeper wiring pattern cuts into the via plug, and short-circuiting might be caused between the deeper wiring pattern and another conductive member such as the gate electrode adjacent to the via plug. Therefore, when the deeper wiring pattern is brought into contact with the via plug, it is necessary to first bring the shallow wiring pattern into contact with the via plug, and then connect the deeper wiring pattern to the shallow wiring pattern. However, this process makes the circuit pattern very complicated. Also, all the contact plugs are formed at the same time in this conventional structure. Therefore, the contact plugs need to be made of a metal, and the above described problems of accumulated charge leakage and an increase in contact resistance cannot be avoided in the DRAM memory cell transistor.

As described so far, the requirements for a multi-layer wiring structure differ between the DRAM memory cell region and the region containing a logical circuit. Therefore, there is an increasing demand for a method of producing highly reliable semiconductor devices that can satisfy those requirements at low costs.

Therefore, a general object of the present invention is to provide a novel and useful semiconductor device and a method of producing such a semiconductor device in which the above problems can be eliminated.

A more specific object of the present invention is to provide a semiconductor device that includes a DRAM integrated circuit device that has a structure that has a wiring layer and conductive regions formed below the wiring layer. The conductive regions have different levels from each other with respect to the wiring layer, and are made of different materials from each other. The conductive regions are connected to the wiring layer. The DRAM integrated circuit device having such a structure has a restricted contact resistance, and can easily be produced with a smaller number of production procedures. The present invention also provides a method of producing such a DRAM integrated circuit device.

Another specific object of the present invention is to provide a semiconductor device that has the wiring layer with different thicknesses in a first region and a second region on a substrate, and a method of producing the semiconductor device.

The present invention provides a semiconductor device that has a multi-layer wiring structure on a substrate, including a first conductive region; a second conductive region that has an upper surface located in a higher position than the first conductive region with respect to the substrate; an insulating film that covers the first and second conductive regions; a wiring groove that is formed in the insulating film so as to expose the second conductive region; a contact hole that is formed in the insulating film so as to expose the first conductive region; and a wiring pattern that fills the wiring groove and the contact hole, the wiring pattern having an upper surface located on the same plane as the upper surface of the insulating film.

According to the present invention, the problem caused when formation of a contact hole is made for a high-level conductive region and for a low-level conductive region simultaneously in that the high-level conductive region, such as the upper electrode of a capacitor, undergoes excessive etching, leading to damaging of an underlying layer such as a capacitor insulation film underlying the upper electrode, and associated problem in that dielectric integrity of the capacitor insulation film such as long time reliability of MIM insulation film is degraded, are successfully avoided even when a continuous etching process is applied to the low-level conductive region for ensuring formation of the contact hole. Further, with the present invention, it becomes possible to form interconnection patterns in a multilayer interconnection structure with different thicknesses in the same interconnection layer, without causing damages in the underlying conductor structure.

Further, in accordance with one aspect of the present invention, in which there is provided a semiconductor device that has a multi-layer wiring structure formed by the dual damascene technique and includes conductive regions of different heights on the substrate, the difficulties in exposure due to a small depth of focus are eliminated at the time of formation of the contact hole a photolithography technique, even though the conductive regions have different heights from each other. Accordingly, using a high-resolution exposure optical system with a great numerical aperture, a very fine contact hole can be formed on the same plane as the flat surface.

Further, in accordance with the present invention, a contact plug that extends from the multi-layer wiring structure including the wiring pattern is made of a different material from the second conductive region in contact with the multi-layer wiring structure. For example, the second conductive region in a semiconductor integrated circuit device including a memory cell region and a peripheral circuit region or a logical circuit region may be made of polysilicon. Accordingly, the impurity concentration in the diffusion region in contact with the second conductive region on the substrate can be reduced, without an increase in contact resistance.

Further, with the present invention, the contact plug to be in contact with an n- or p-type diffusion region of a CMOS device is made of the same metal as the wiring pattern. By doing so, stable contact can be maintained, regardless of the conductivity type of the diffusion region.

Further, with the present invention, the wiring groove can be made deeper in the region in which the contact hole is to be formed than in the region to be in contact with the second conductive region. Accordingly, the resistance of the wirings can be reduced in the corresponding region of large groove depth. Further, the coupling capacitance of the wiring can be reduced also in the region of large groove depth with respect to the wirings formed in the grooves of small depth. Also, since the multi-layer wiring structure of the present invention is formed by the dual damascene technique, the wiring pattern and the contact plug can be made of a low-resistance metal such as Cu.

Thereby, by forming the substrate to have first and second device regions formed thereon such that the first conductive region is formed in the first device region, the second conductive region is formed in the second device region, and that the wiring groove has a first groove portion corresponding to the first device region, and a second groove portion corresponding to the second device region, the first groove portion having a greater depth than the second groove portion, it becomes possible to form a thick wiring pattern and a thin wiring pattern without damaging an underlying interconnection pattern.

Further, in another aspect, the present invention provides a semiconductor device that has a multi-layer wiring structure on a substrate, including a first conductive region; a second conductive region that has an upper surface located in a higher position than the first conductive region with respect to the substrate; an insulating film that covers the first and second conductive regions; a first contact hole that is formed in the insulating film and is designed to expose the first conductive region; a second contact hole that is formed in the insulating film and is designed to expose the second conductive region; and a wiring pattern that fills the wiring groove and the first and second contact holes, wherein the upper surface of the wiring pattern is located on the same plane as the upper surface of the insulating film, the substrate having first and second device regions formed thereon, the first conductive region being formed in the first device region, while the second conductive region being formed in the second device region, the wiring groove having a first groove portion corresponding to the first device region and a second groove portion corresponding to the second device region, the first groove portion having a greater depth than the second groove portion.

In accordance with the present invention, the wiring pattern with different depths can be formed in the multi-layer wiring structure when a multi-layer wiring structure is formed by the dual damascene technique. As a result, the resistance of the wiring pattern can be reduced in locations where a decrease in resistance is essential, and the parasitic capacitance can also be reduced where it is necessary. Here, the second conductive region located in the higher position is brought into contact with the wiring pattern via the second contact hole. Even if the height of the second conductive region is relatively small, a sufficient distance can be maintained between the wiring pattern and the substrate. Accordingly, the first wiring portion can be made sufficiently deep at the location where the parasitic resistance is to be reduced. Thus, the wiring parasitic resistance at the location can be effectively reduced.

Further, in another aspect of the present invention, there is provided a DRAM integrated circuit device having a multi-layer wiring structure, including a substrate that has a memory cell region and a peripheral circuit region formed thereon; a first interlayer insulating film that is formed on the substrate so as to collectively cover the memory cell region and the peripheral circuit region, the first interlayer insulating film covering a conductor pattern and a semiconductor element on the substrate; a polysilicon plug that penetrates the first interlayer insulating film in the memory cell region, and is in contact with a diffusion region formed in the memory cell region; a second interlayer insulating film that is formed on the first interlayer insulating film so as to collectively cover the memory cell region and the peripheral circuit region, the second interlayer insulating film covering the polysilicon plug; a first wiring groove that is formed in the second interlayer insulating film in the memory cell region, and exposes the polysilicon plug; a first contact hole that is formed in the first wiring groove, penetrates the first interlayer insulating film, and exposes a conductive region that is formed in the peripheral circuit region on the substrate and has a smaller height than the polysilicon plug; a first wiring pattern that fills the first wiring groove including the first contact hole; a second wiring groove that is formed in the second interlayer insulating film in the peripheral circuit region; a second contact hole that is formed in the second wiring groove, penetrates the first interlayer insulating film, and exposes a diffusion region that is formed in the peripheral circuit region; and a second wiring pattern that fills the second wiring groove including the second contact hole, the first wiring pattern and the second wiring pattern each having a principal surface located on the same plane as the principal surface of the second interlayer insulating film.

In accordance with the present invention, in a DRAM integrated circuit device having a multi-layer wiring structure formed by the dual damascene technique, the conductive plug to be in contact with a diffusion region that forms part of the memory cell transistor in the memory cell region on the substrate is made of polysilicon, so that the contact resistance between the conductive plug and the diffusion region is reduced, and the impurity concentration in the diffusion region is also reduced. As the impurity concentration in the diffusion region is reduced, the accumulated charge leakage in the memory cell capacitor extending from the diffusion region of the memory cell transistor is reduced, and the refreshing operation of the DRAM is improved. In the peripheral circuit region in which a CMOS circuit is to be formed on the substrate, on the other hand, contact is made between a device or a conductive region on the substrate and a conductive plug made of the same metal as the wiring pattern. Accordingly, stable contact can be maintained, whether the device or the conductive region is of a p-type or an n-type. Further in accordance with the present invention, the difficulties in exposure due to a small depth of focus can be eliminated, as the first and second contact holes are formed by a photolithography technique.

Further, in another aspect of the present invention, there is provided a method of producing a semiconductor device, which method includes the steps of: forming a first interlayer insulating film on a substrate; forming an opening in the first interlayer insulating film, the opening penetrating the first interlayer insulating film, so as to expose a first conductive region formed on the substrate; forming a second conductive region in the opening in such a manner that the second conductive region has an upper surface located in a higher position than a third conductive region that is formed on the substrate; forming a second interlayer insulating film on the first interlayer insulating film, so as to cover the second conductive region; forming a wiring groove in the second interlayer insulating film, the wiring groove exposing the upper surface of the first interlayer insulating film, so as to expose the second conductive region; forming a contact hole or a plurality of contact holes in the wiring groove by etching the first interlayer insulating film, so as to expose the third conductive region; filling the wiring groove, including the contact hole or the plurality of contact holes, with a conductive material; and forming a wiring pattern made of the conductive material in the wiring groove, and a contact plug or a plurality of contact plugs made of the conductive material in the contact hole or in the plurality of contact holes, after removing the conductive material on the second interlayer insulating film by a chemical mechanical polishing technique.

According to the present invention, the problem caused when formation of a contact hole is made for a high-level conductive region and for a low-level conductive region simultaneously in that the high-level conductive region, such as the upper electrode of a capacitor, undergoes excessive etching, leading to damaging of an underlying layer such as a capacitor insulation film underlying the upper electrode, and associated problem in that dielectric integrity of the capacitor insulation film such as long time reliability of MIM insulation film is degraded, are successfully avoided even when a continuous etching process is applied to the low-level conductive region for ensuring formation of the contact hole. Further, with the present invention, it becomes possible to form interconnection patterns in a multilayer interconnection structure with different thicknesses in the same interconnection layer, without causing damages in the underlying conductor structure.

Further, in accordance with an embodiment of the present invention, in which a semiconductor device having a multi-layer wiring structure is formed by a dual damascene technique such that a contact hole that forms the lower first conductive region is formed after a conductive groove is formed in the multi-layer wiring structure so as to expose the second conductive region, the problem of a small depth of focus in an exposure optical system is not caused at the time of exposure of the contact hole, even if there is a great difference in height between the first conductive region and the second conductive region. Also, in the present invention, the wiring groove is made deeper at the location where the contact hole is to be formed than at the location to be in contact with the second conducive region. Accordingly, the parasitic resistance of the wiring at the corresponding location can be reduced, and the parasitic capacitance at the location to be in contact with the second conductive region can also be reduced. Further, since the multi-layer wiring structure is formed by the dual damascene technique in the present invention, the wiring pattern and the contact plug can be made of a low-resistance metal such as Cu.

Further, in another aspect, the present invention provides a method of producing a semiconductor device, which method includes the steps of: forming a first interlayer insulating film on a substrate; forming an opening in the first interlayer insulating film, the opening penetrating the first interlayer insulating film, so as to expose a first conductive region that is formed on the substrate; forming a second conductive region in the opening in such a manner that the second conductive region has a greater height than a third conductive region that is formed on the substrate; forming a second interlayer insulating film on the first interlayer insulating film, so as to cover the second conductive region; simultaneously forming a first wiring groove and a second wiring groove in the second interlayer insulating film in such a manner that the first wiring groove passes over the second conductive region; forming a first contact hole in the first wiring groove, the first contact hole penetrating the second interlayer insulating film so as to expose the conductive region, and, at the same time, etching the second interlayer insulating film in the second wiring groove, so as to expose the first interlayer insulating film in the second wiring groove; forming a second contact hole in the second wiring groove, so as to expose the third conductive region on the substrate, by etching the first interlayer insulating film; filling the first and second wiring grooves, including the first and second contact holes, with a conductive material; and forming a first wiring pattern and a second wiring pattern made of the conductive material in the first and second wiring grooves, and a first contact plug and a second contact plug made of the conductive material in the first and second contact holes, after removing the conductive material on the second interlayer insulating film by a chemical mechanical polishing technique.

According to the present invention, the wiring pattern having different depths can be formed in the multi-layer wiring structure by a dual damascene process. As a result, the resistance of the wiring patterns can be reduced in the locations where a decrease in resistance is required. Here, the second conductive region located in the higher position is brought into contact with the wiring pattern via the second contact hole. Even if the height of the second conductive region is relatively small, a sufficient distance can be maintained between the wiring pattern and the substrate. Accordingly, the first wiring portion can be made sufficiently deep at the location where the wiring resistance is to be reduced. Further, coupling capacitance with other wiring patterns can be reduced at such a location of increased depth.

In another aspect, the present invention further provides a method of producing a semiconductor device, which method includes the steps of: forming a first interlayer insulating film on a substrate; forming an opening in the first interlayer insulating film, the opening penetrating the first interlayer insulating film, so as to expose a first conductive region that is formed on the substrate; forming a second conductive region in the opening in such a manner that the second conductive region has a greater height than a third conductive region that is formed on the substrate; forming a second interlayer insulating film on the first interlayer insulating film, so as to cover the second conductive region; forming a first contact hole in the second interlayer insulating film, the first contact hole penetrating the first interlayer, so as to expose the third conductive region; simultaneously forming a first wiring groove and a second wiring groove in the second interlayer insulating film in such a manner that the first wiring groove passes over the second conductive region, and the second wiring groove passes across the first contact hole; exposing the first interlayer insulating film in the second wiring groove by forming a second contact hole in the first wiring groove, the second contact hole penetrating the second interlayer insulating film so as to expose the conductive region, and by etching the second interlayer insulating film in the second wiring groove; filling the first and second wiring grooves, including the first and second contact holes, with a conductive material; and forming a first wiring pattern and a second wiring pattern made of the conductive material in the first and second wiring grooves, and a first contact plug and a second contact plug made of the conductive material in the first and second contact holes, after removing the conductive material on the second interlayer insulating film by a chemical mechanical polishing technique.

In accordance with the present invention, the deeper contact holes are formed by a photolithography technique before the wiring grooves are formed. Accordingly, when a multi-layer wiring structure that has wiring grooves with different depths is formed by the dual damascene technique, an exposure defect due to a small depth of focus in an exposure optical system can be avoided. Also, the contact holes are aligned with the pattern formed on the substrate, and the wiring grooves are aligned with the contact holes. Thus, the wiring grooves can be aligned with the pattern on the substrate with high precision.

In another aspect, the present invention provides a method of producing a semiconductor device that has a capacitor, which method includes the steps of: forming a first interlayer insulating film on a substrate that has first and second device regions formed thereon, the first interlayer insulating film collectively covering the first and second device regions; forming a first wiring pattern in the first interlayer insulating film in the first device region, and a second wiring pattern in the first interlayer insulating film in the second device region; forming the capacitor on the first interlayer insulating film in the first device region, the capacitor being electrically in contact with the first wiring pattern; forming a second interlayer insulating film on the first interlayer insulating film, the second interlayer insulating film collectively covering the capacitor over the first and second device regions; forming a first wiring groove in the second interlayer insulating film, so as to expose the upper surface of the capacitor in the first device region; forming a second wiring groove in the second interlayer insulating film in the second device region at the same time as the formation of the first wiring groove; forming a contact hole in the second wiring groove in the second device region, so as to expose the second wiring pattern, the contact hole extending through the second interlayer insulating film; filling the first and second wiring grooves, including the contact hole, with a conductive material; and forming wiring patterns made of the conductive material in the first and second wiring grooves, and a contact plug made of the conductive material in the contact hole, after removing the conductive material on the second interlayer insulating film by a chemical mechanical polishing technique.

In another aspect, the present invention provides a method of producing a semiconductor device that has a capacitor, which method includes the steps of: forming a first interlayer insulating film on a substrate that has first and second device regions formed thereon, the first interlayer insulating film collectively covering the first and second device regions; forming a first wiring pattern in the first interlayer insulating film in the first device region, and a second wiring pattern in the first interlayer insulating film in the second device region; forming the capacitor on the first interlayer insulating film in the first device region, the capacitor being electrically in contact with the first wiring pattern; forming a second interlayer insulating film on the first interlayer insulating film, the second interlayer insulating film collectively covering the capacitor over the first and second device regions; simultaneously forming a first wiring groove in the second interlayer insulating film in the first device region, and a second wiring groove in the second interlayer insulating film in the second device region; forming a contact hole in the second interlayer insulating film, so as to expose the capacitor in the first wiring groove; making the depth of the second wiring groove greater than the depth of the first wiring groove by etching the second interlayer insulating film in the second wiring groove at the same time as the formation of the contact hole; forming a contact hole in the second wiring groove in the second device region, so as to expose the second wiring pattern, the contact hole extending through the second interlayer insulating film; filling the first and second wiring grooves, including the contact holes, with a conductive material; and forming wiring patterns made of the conductive material in the first and second wiring grooves, and contact plugs made of the conductive material in the contact holes, after removing the conductive material on the second interlayer insulating film by a chemical mechanical polishing technique.

According to the present invention, the problem caused when formation of a contact hole is made for a high-level conductive region and for a low-level conductive region simultaneously in that the high-level conductive region, such as the upper electrode of a capacitor, undergoes excessive etching, leading to damaging of an underlying layer such as a capacitor insulation film underlying the upper electrode, and associated problem in that dielectric integrity of the capacitor insulation film such as long time reliability of MIM insulation film is degraded, are successfully avoided even when a continuous etching process is applied to the low-level conductive region for ensuring formation of the contact hole. Further, with the present invention, it becomes possible to form interconnection patterns in a multilayer interconnection structure with different thicknesses in the same interconnection layer, without causing damages in the underlying conductor structure.

Further, according to an embodiment of the present invention, in which a capacitor such as a MIM capacitor is formed on the first interlayer insulation film, the contact holes can be formed with high precision even if there is a great difference in height between the upper electrode of the capacitor and the conductive region on the substrate, without causing the problem of small depth of focus. Thus, multi-layer wiring structures to be in contact with capacitors and conductive regions can be produced in high yield.

The other aspects and features of the present invention will become apparent from the detailed description provided later with reference to the following drawings.

DESCRIPTION OF THE PREFERRED EMBODIMENTS

The following is a description of embodiments of the present invention, with reference to the accompanying drawings.

First Embodiment

Figure 1:
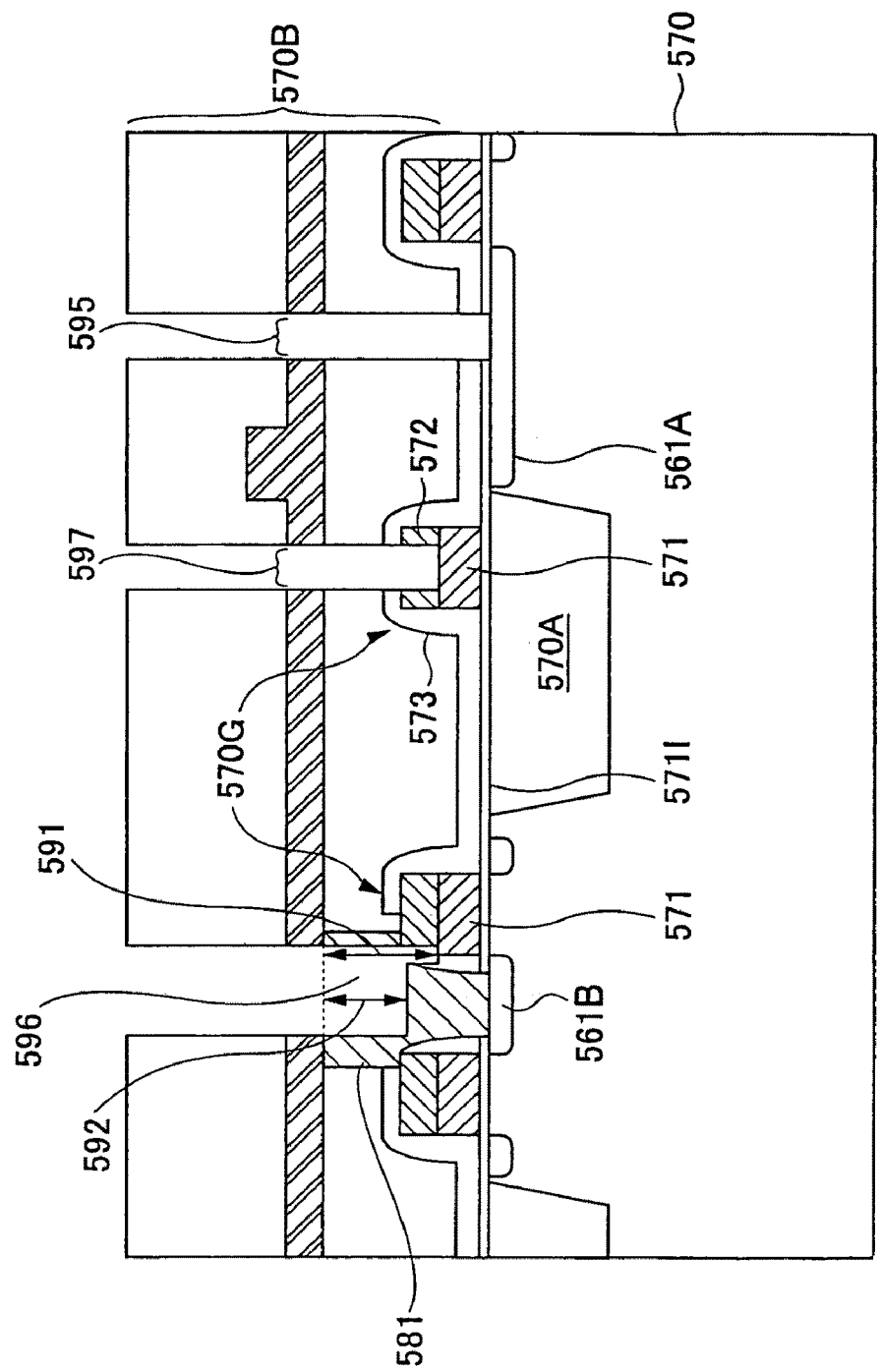
FIG. 1 is a cross-sectional view of a semiconductor device illustrating the problem with a case where contact holes with different depths are formed at the same time.
Figure 2:
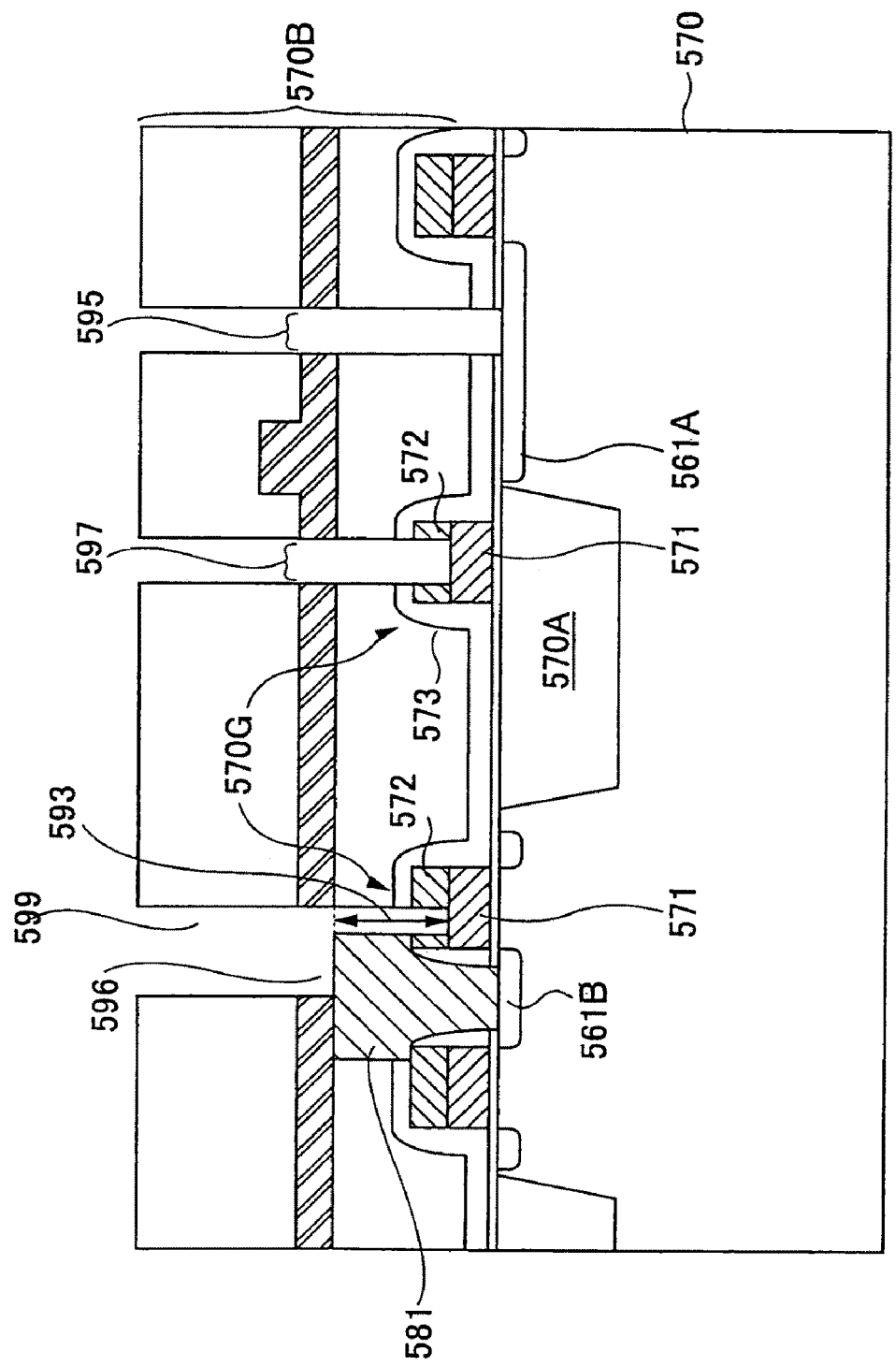
FIG. 2 is a cross-sectional view of a semiconductor device, illustrating the problem with a case where etching is performed while the resist patterns are not aligned.
Figure 3:
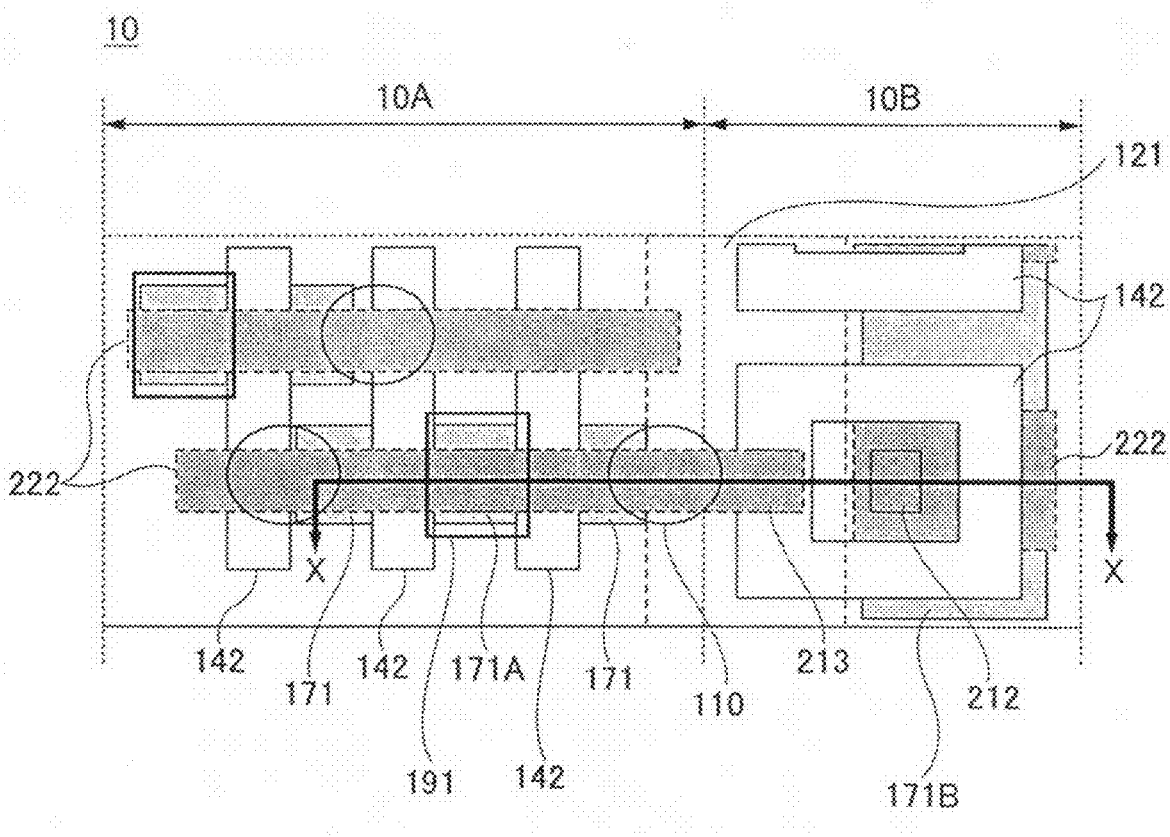
FIG. 3 is a plan view of a DRAM integrated circuit device in accordance with a first embodiment of the present invention.

FIG. 3 is a plan view illustrating the structure of a DRAM integrated circuit device 10 in accordance with a first embodiment of the present invention.

As shown in FIG. 3, the DRAM integrated circuit device 10 includes a memory cell region 10A and a peripheral circuit region 10B. The left-side of FIG. 3 shows the memory cell region 10A, and the right-side region of FIG. 3 shows the peripheral circuit region 10B.

The memory cell region 10A has diffusion regions 171 and 171A, an isolation region 121, a plurality of word-lines 142 and wirings 222, and a polysilicon plug 191 formed thereon. The polysilicon plug 191 connects the diffusion region 171A and the corresponding wiring 222. The word-lines 142 function as gate electrodes of memory transistors, and the wirings 222 function as bit lines.

The peripheral region 10B has a diffusion region 171B, gate electrodes 142, a wiring 222, and contacts 212 and 213 formed thereon. The contact 212 connects the wiring 222 and the diffusion region 171B. The contact 213 connects the wiring 222 and the gate electrodes 142.

Figure 4:
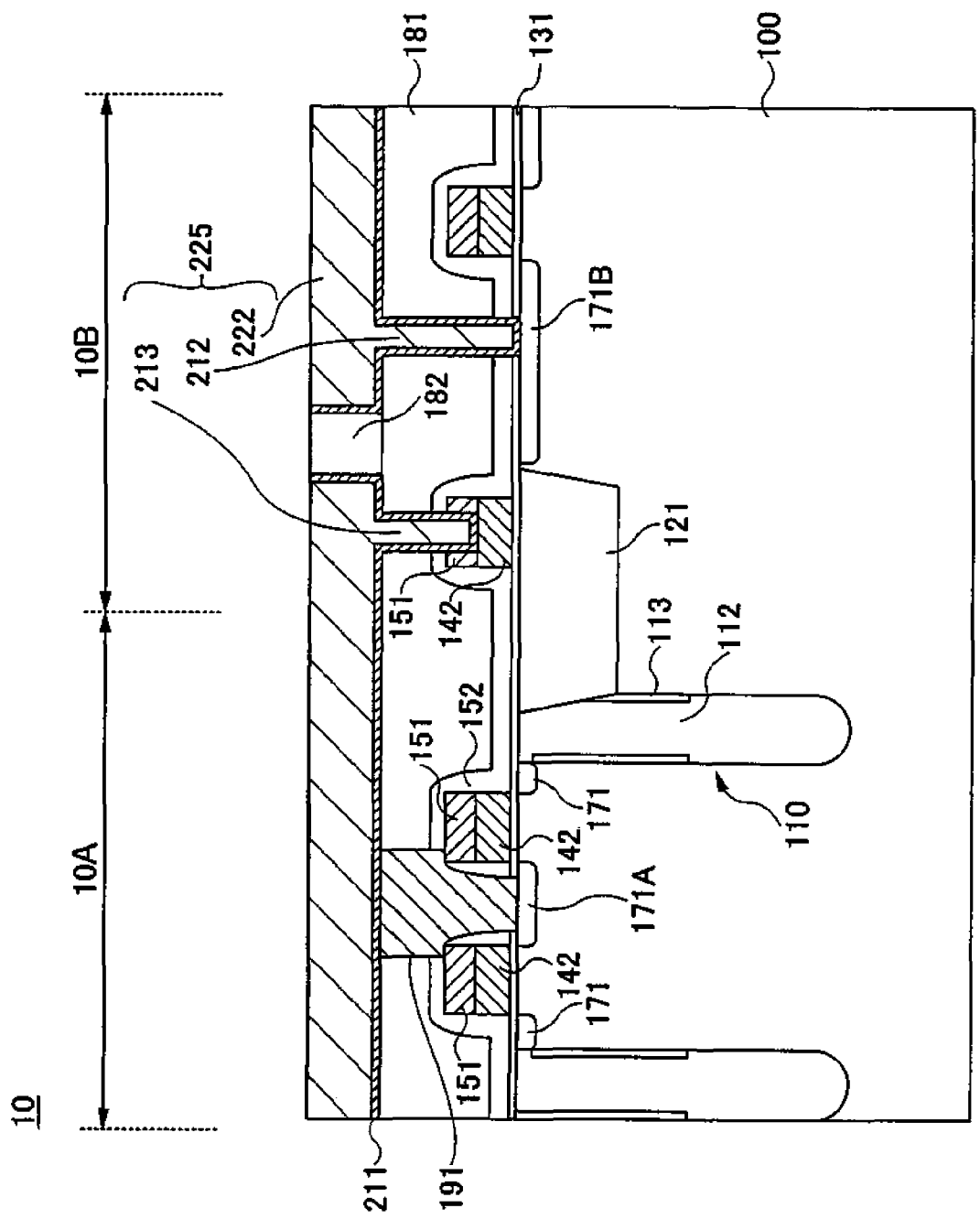
FIG. 4 is a cross-sectional view of the DRAM integrated circuit device in accordance with the first embodiment.

FIG. 4 is a cross-sectional view of the DRAM integrated circuit device 10, taken along the line X-X of FIG. 3.

Referring to FIG. 4, the structure of the DRAM integrated circuit device 10 of the first embodiment is first described.

As shown in FIG. 4, in the memory cell region 10A and the peripheral circuit region 10B, a trench capacitor 110 to store memory information, the isolation region 121, and the diffusion regions 171, 171A, and 171B are formed on a p-type silicon substrate 100. Three-layer gate structures each having a gate oxide film 131, a gate electrode 142, and a silicon nitride film 151 are further formed on the p-type silicon substrate 100. A silicon nitride film 152 is formed on the side walls of each of the gate structures. A BPSG (boro-phosphosilicate glass) film 181 is further formed on the silicon nitride film 152.

In the memory cell region 10A, the BPSG film 181 has the polysilicon plug 191 formed therein. Here, the polysilicon plug 191 is self-aligned to the gate electrodes 142, so that the diffusion region 171A formed between two gate structures and the wiring pattern 222 formed in a BPSG film 182 are electrically connected to each other.

Meanwhile, in the peripheral circuit region 10B, the BPSG film 181 has the contact plug 212 formed therein, so that the gate electrodes 142 and the diffusion region 171B are electrically connected to the wiring pattern 222.

Referring now to FIGS. 5 through 20, the procedures for producing the DRAM integrated circuit device 10 in accordance with the first embodiment of the present invention are described based on the sectional view of FIG. 4.

FIGS. 5 through 20 illustrate the procedures for producing the DRAM integrated circuit device 10 in accordance with the first embodiment of the present invention.

Figure 5:
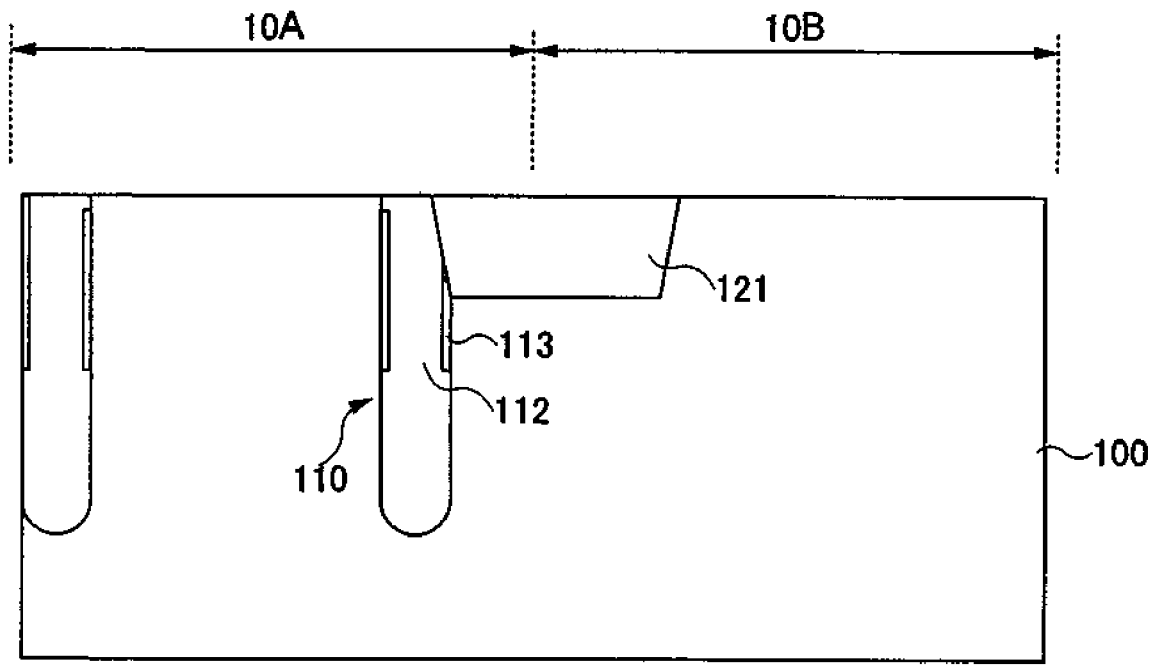
FIGS. 5 through 20 illustrate the procedures for producing the DRAM integrated circuit device in accordance with the first embodiment.

As shown in FIG. 5, in the memory cell region 10A, the trench capacitor 110 that is formed with a polysilicon pillar 112 and an oxide collar is formed in the p-type silicon substrate 100. The isolation region 121 is also formed in the p-type silicon substrate 100. The isolation region 121 may be a STI (shallow trench isolation) structure, for example, and can be formed by a known technique of filling an isolation groove with insulating film such as silicon oxide film.

Figure 6:
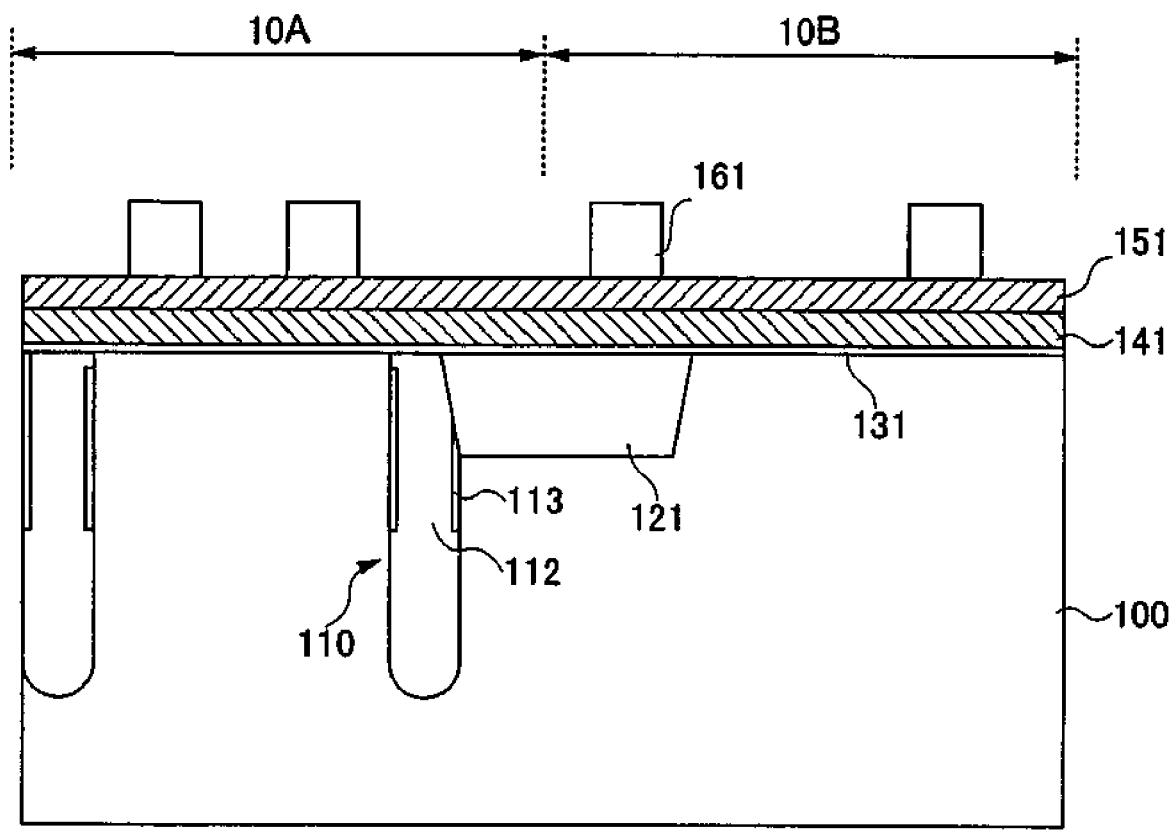

In the next procedure shown in FIG. 6, the gate oxide film 131 with a thickness of 5 nm is formed on the silicon substrate 100, and a polycide film 141 that is made of a 100 nm thick polysilicon film and a 100 nm thick tungsten silicide film is formed on the gate oxide film 131. Further, a 200 nm thick silicon nitride film 151 is formed on the polycide film 141, and a resist pattern 161 that is compatible with a gate electrode structure to be produced is formed on the silicon nitride film 151.

Figure 7:
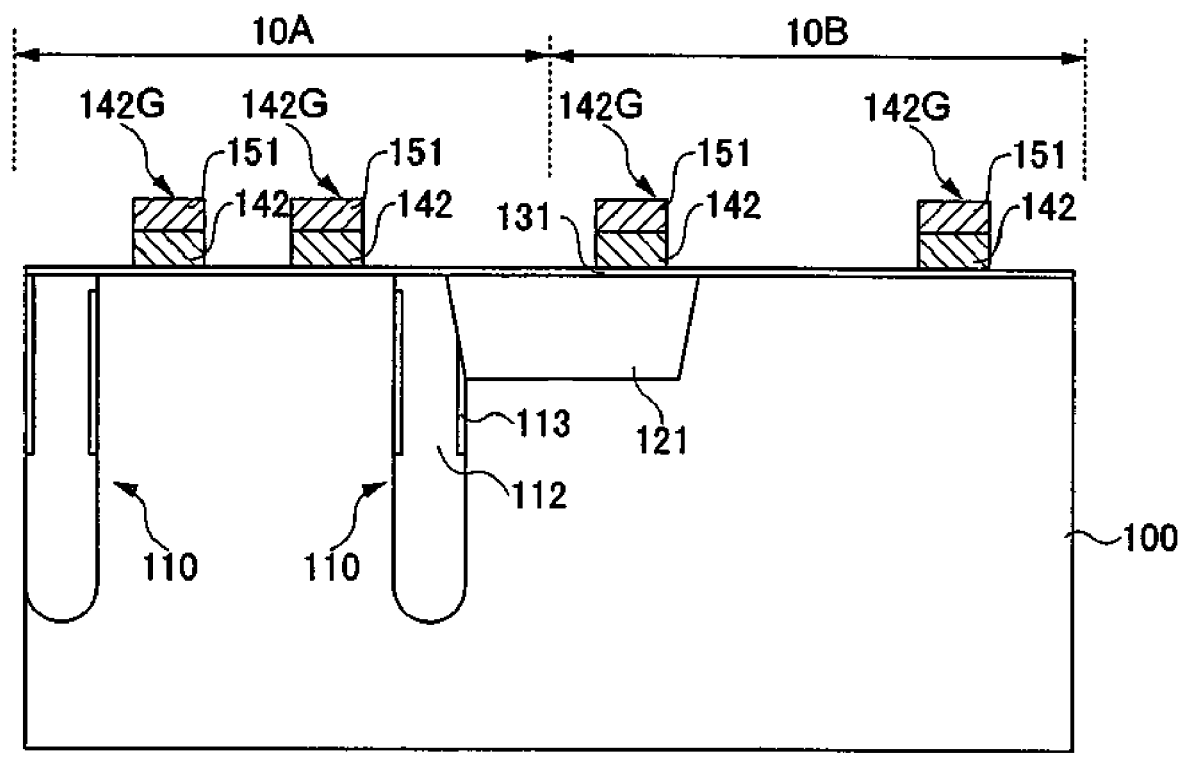

In the next procedure shown in FIG. 7, the silicon nitride film 151 and the polycide film 141 are patterned in order, with the resist pattern 161 serving as a mask. Thus, the gate electrode pattern 142 to form the word-lines is produced. The resist film 161 is then removed. The gate electrode pattern 142, together with the nitride film pattern 151 formed thereon, forms gate electrode structures 142G.

Figure 8:
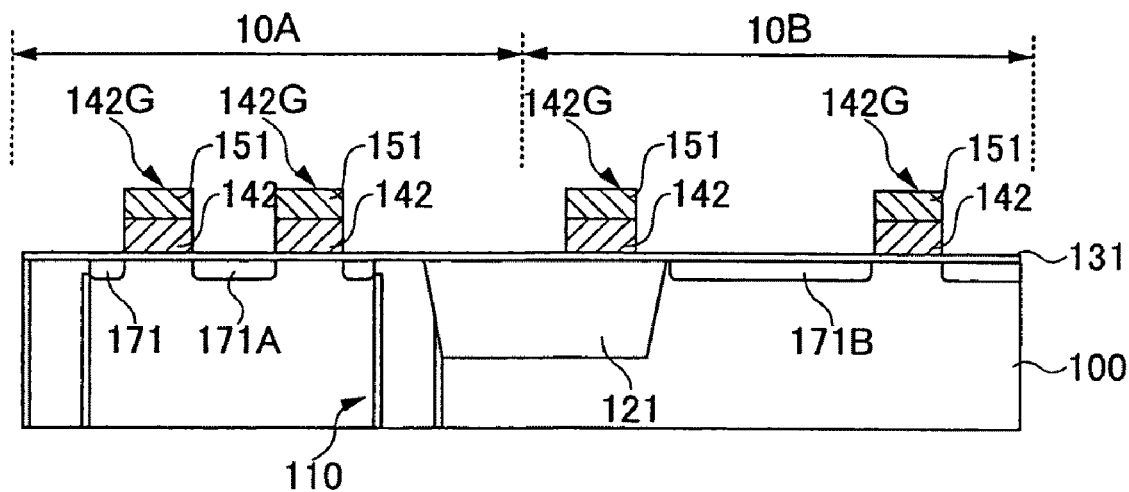
Figure 9:
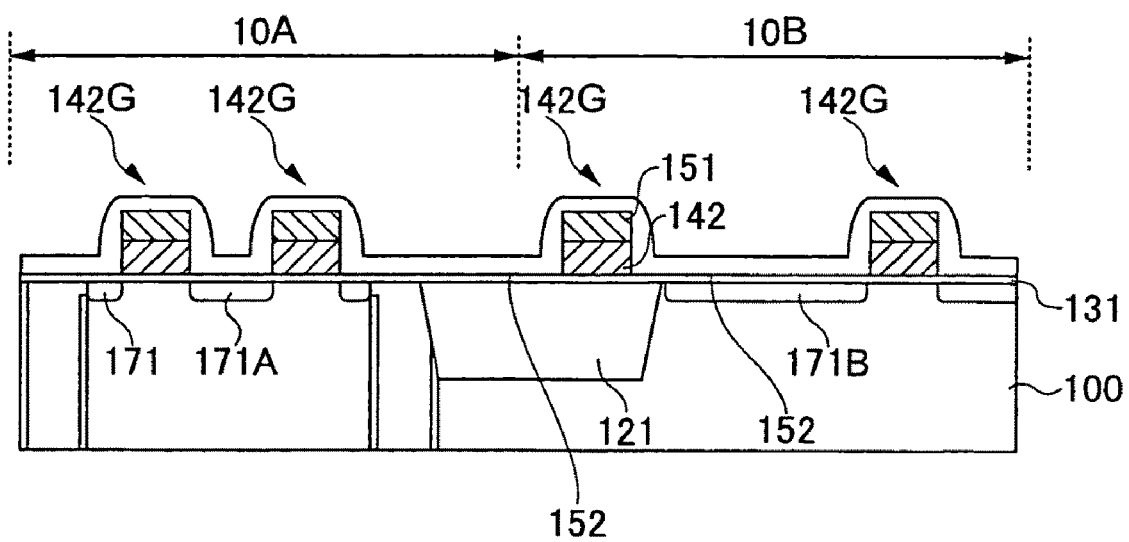

In the next procedure shown in FIG. 8, n-type impurity elements are introduced into the silicon substrate 100 by an ion implanting technique, with the gate electrode structures 142G and the isolation region 121 serving as masks. Thus, the n-type diffusion regions 171, 171A, and 171B are formed in the p-type silicon substrate 100. In the procedure shown in FIG. 9, the silicon nitride film 152 with a thickness of 100 nm is formed so as to cover the gate electrode structures 142G. In the peripheral circuit transistor, the formation of the side wall insulating film and the formation of the high-concentration impurity diffusion regions are carried out by a known technique, and therefore, explanation of them is omitted in this description.

Figure 10:
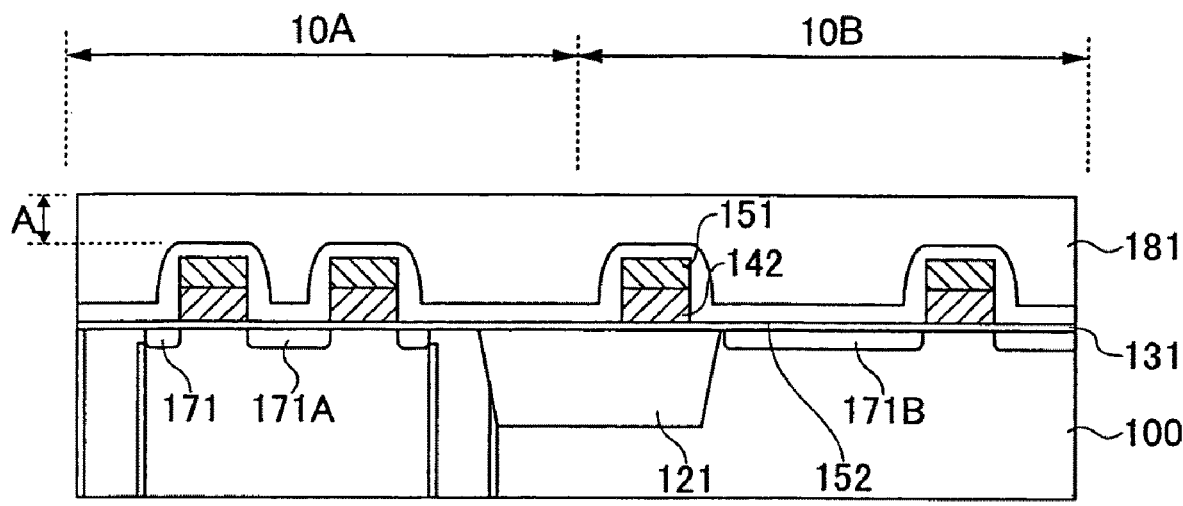

In the next procedure shown in FIG. 10, the BPSG film 181 that is to be a first interlayer insulating film is formed with a thickness of 500 nm on the silicon nitride film 152. The BPSG film 181 is reflowed through heat treatment, and is then polished by CMP. Thus, the surface of the BPSG film 181 is flattened. The film thickness A shown in FIG. 10 indicates the thickness of the BPSG film 181, measured from the surface of the silicon nitride film 152 covering the upper surface of each of the gate electrode structures 142G. The polishing procedure is carried out in such a manner that the film thickness A becomes 200 nm after the polishing.

Next, the procedures for forming a polysilicon plug on the diffusion region formed between two of the gate electrodes 142 in the memory cell region 10A are described. As already mentioned, the polysilicon plug is formed to reduce the contact resistance between the wiring pattern and the diffusion region.

Figure 11:
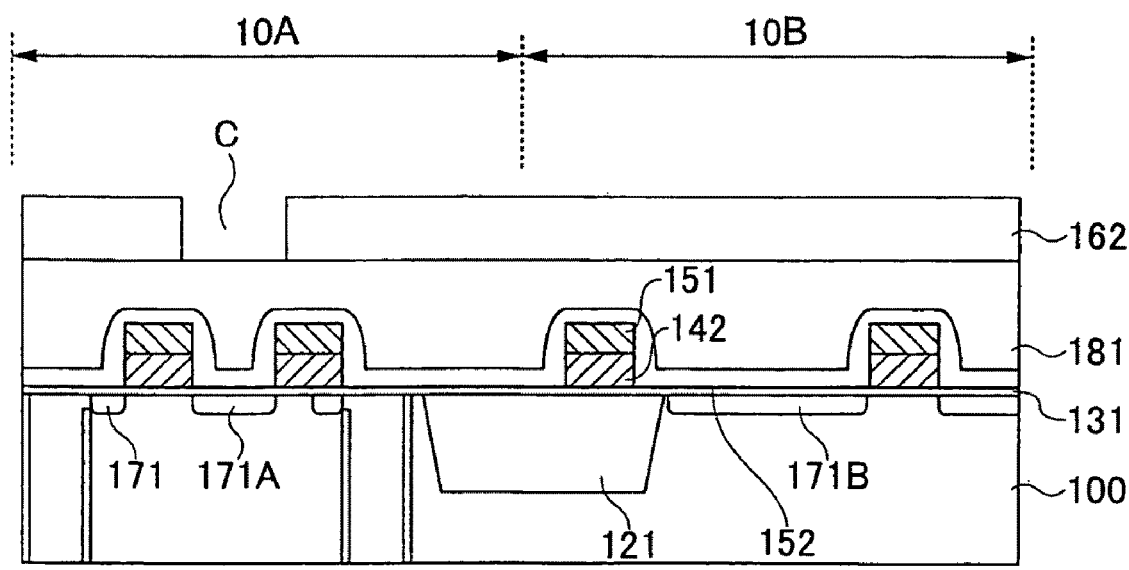

As shown in FIG. 11, a resist pattern 162 that has an opening C corresponding to the diffusion region 171A in which the polysilicon plug is to be formed between the two of the gate electrodes 142 in the memory cell region 10A is formed on the BPSG film 181. In the next procedure shown in FIG. 12, etching is performed by the RIE technique, with the resist pattern 162 serving as a mask. Thus, an opening D is formed to expose the diffusion region 171A between the gate electrodes 142.

Figure 12:
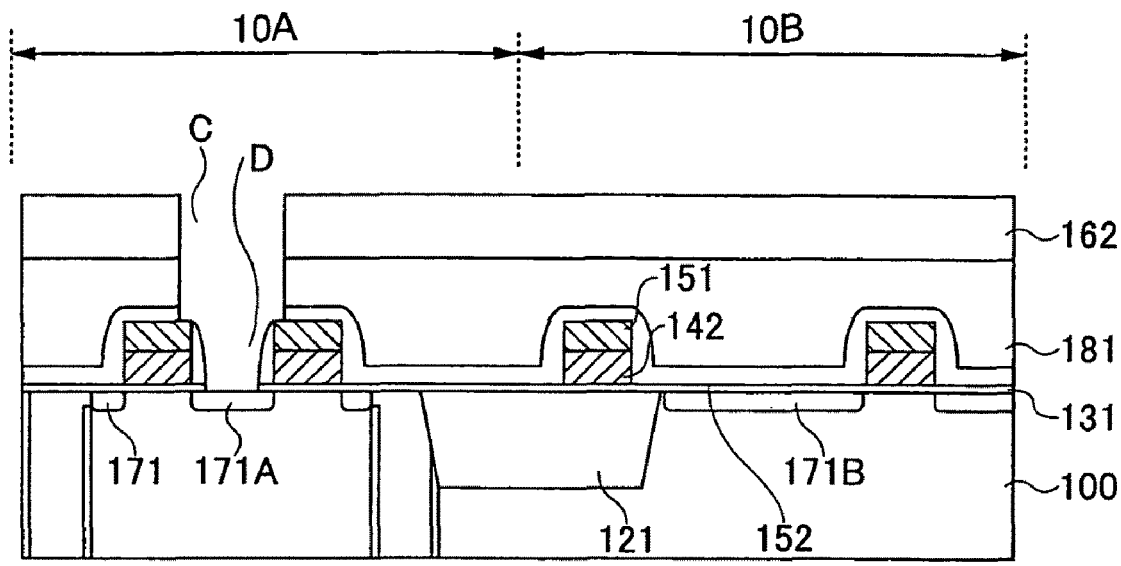

The etching process in the procedure shown in FIG. 12 is carried out on the condition that the etching rate of the BPSG film 181 is higher, and the etching rate of the silicon nitride film 152 is lower. After the silicon nitride film 152 is exposed, the silicon nitride film 152 and the gate oxide film 131 are etched. After the opening D is formed, the resist pattern 162 is removed.

Figure 13:
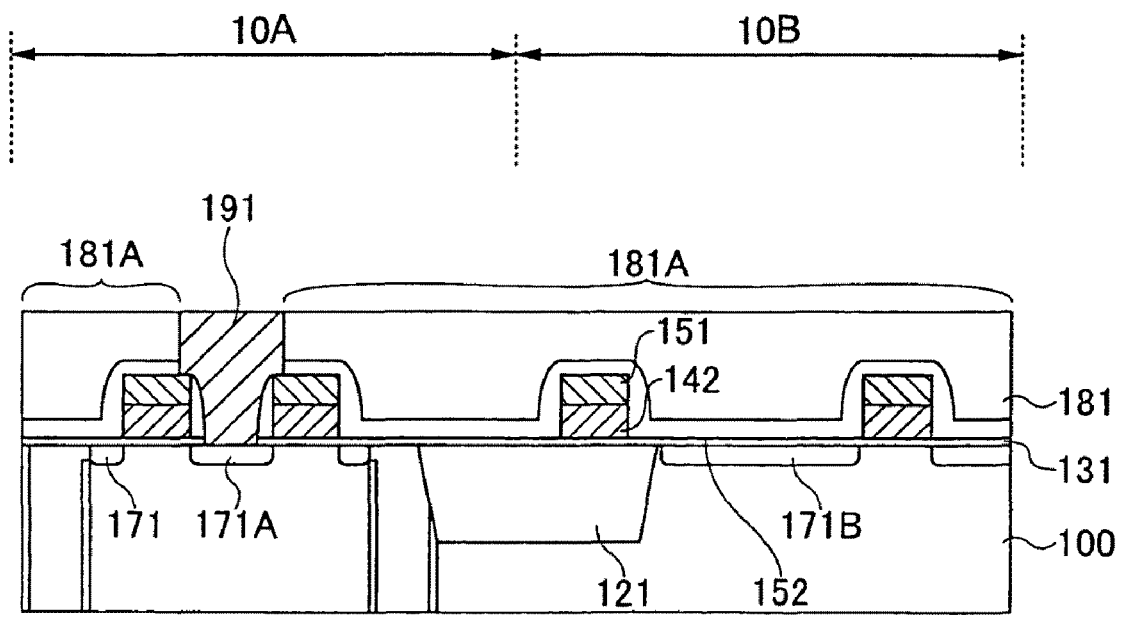

In the next procedure shown in FIG. 13, a polysilicon film having n-type impurity elements doped therein is formed in the opening D shown in FIG. 12 and the BPSG film 181. The polysilicon film is then polished by the CMP technique until the surface 181A of the BPSG film 181 is exposed, so that the polysilicon plug 191 formed with a polysilicon pattern having n-type impurity elements doped therein is produced in the opening D.

Next, the procedures for forming the wiring grooves to be formed on the polysilicon plug 191 and the BPSG film 181 are described.

Figure 14:
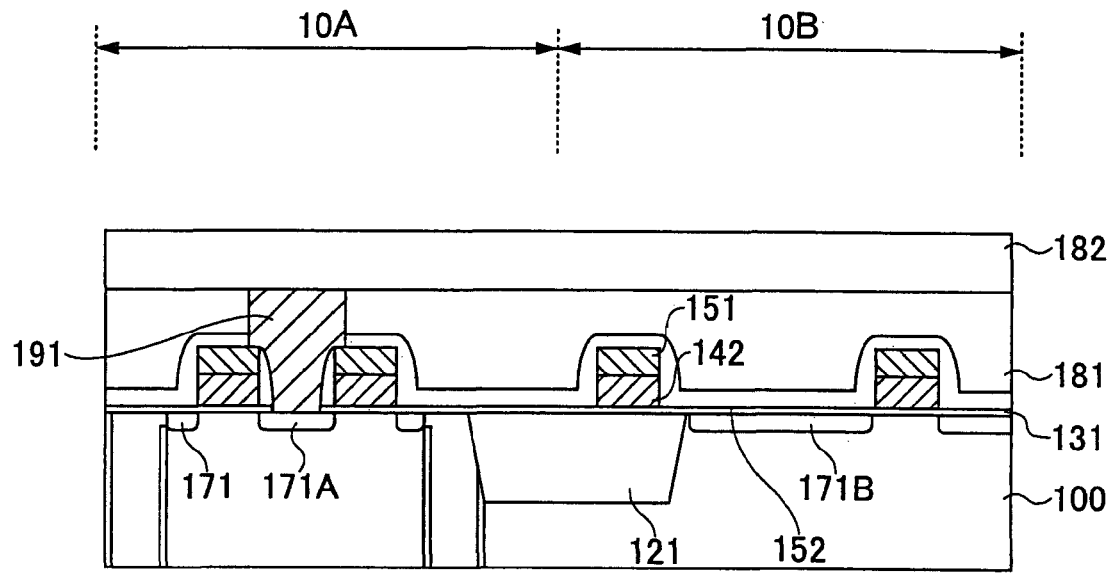
Figure 15:
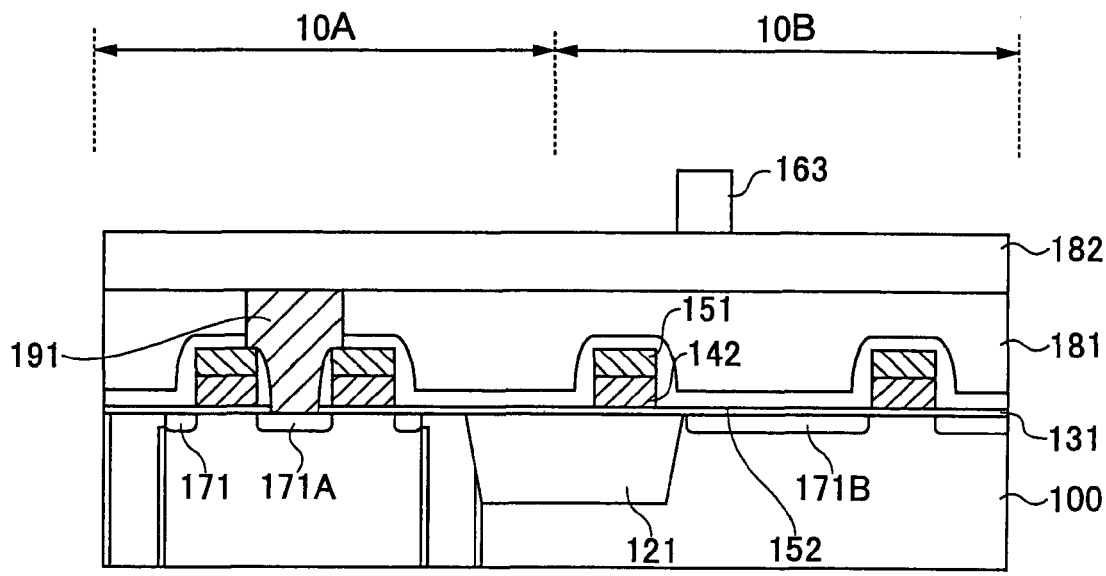

In the procedure shown in FIG. 14, the BPSG film 182 that is to be a second interlayer insulating film is formed with a thickness of 200 nm on the structure shown in FIG. 13. As shown in FIG. 15, so as to form wiring grooves corresponding to the wiring pattern to be brought into contact with the polysilicon plug 191 in the BPSG film 182, a corresponding resist pattern 163 is formed on the BPSG film 182.

Figure 16:
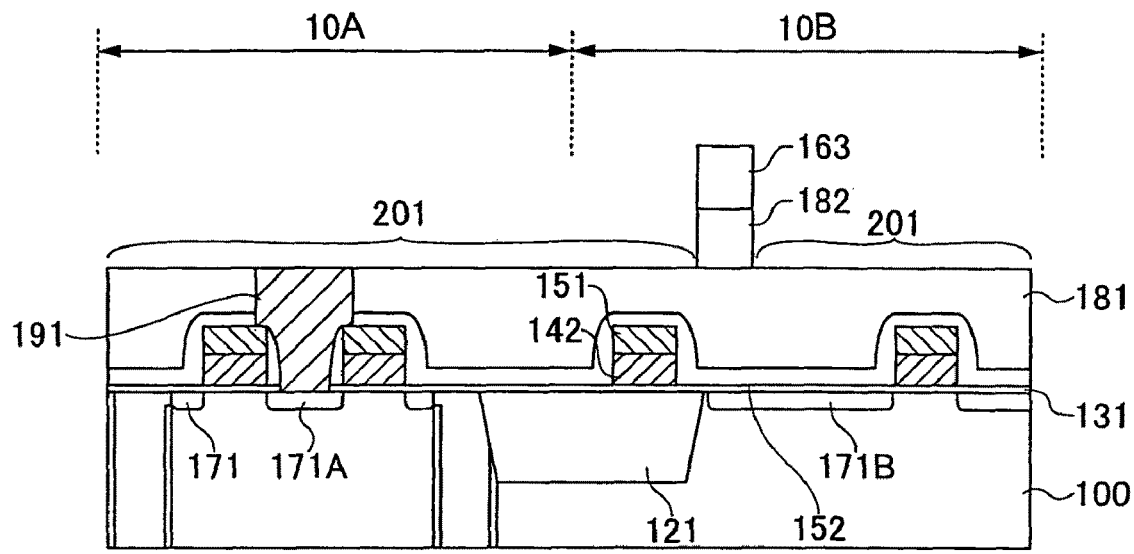

In the next procedure shown in FIG. 16, with the resist pattern 163 serving as a mask, the BPSG film 182 is etched by the RIE technique until the polysilicon plug 191 is exposed. Thus, wiring grooves 201 through which the polysilicon plug 191 is exposed are formed in the BPSG film 182. After the wiring grooves 201 are formed, the resist film 163 is removed.

As described above, in the procedures for forming the wiring grooves 201, etching is performed only until the upper surface of the polysilicon plug 191 is exposed. Accordingly, unlike in the conventional case, the upper surface of the polysilicon plug 191 is protected from being damaged due to over-etching. Also, as the wiring grooves 201 expose the polysilicon plug 191, the polysilicon plug 191 and conductive materials formed in the wiring grooves 201 are electrically connected.

In FIG. 14, a silicon nitride film that is to serve as a stopper film during the formation of the wiring grooves 201 may be formed by etching between the BPSG film 181 and the BPSG film 182. In such a case, a 10 nm thick silicon nitride film is formed on the structure shown in FIG. 13, and the BPSG film 182 to be the second interlayer insulating film with a thickness of 200 nm is formed on the silicon nitride film. The resist pattern 163 is then formed on the BPSG film 182, and, with the resist pattern 163 serving as a mask, the BPSG film 182 is etched until the silicon nitride film is exposed on the condition that the etching rate of the BPSG film 182 is higher and the etching rate of the silicon nitride film is lower. Etching is then performed on the condition that the silicon nitride film can be etched, so as to remove the silicon nitride film. Thus, the wiring grooves 201 are formed in the BPSG film 182, so that the polysilicon plug 191 is exposed. After the formation of the wiring grooves 201, the resist film 163 is removed. As described above, since the silicon nitride film to serve as the stopper film against etching is formed, depth control can be easily performed during the etching of the wiring grooves 201, compared with a case where no stopper film is employed.

Next, the procedures for forming contact holes on the gate electrodes 142 and the diffusion region 171B are described.

Figure 17:
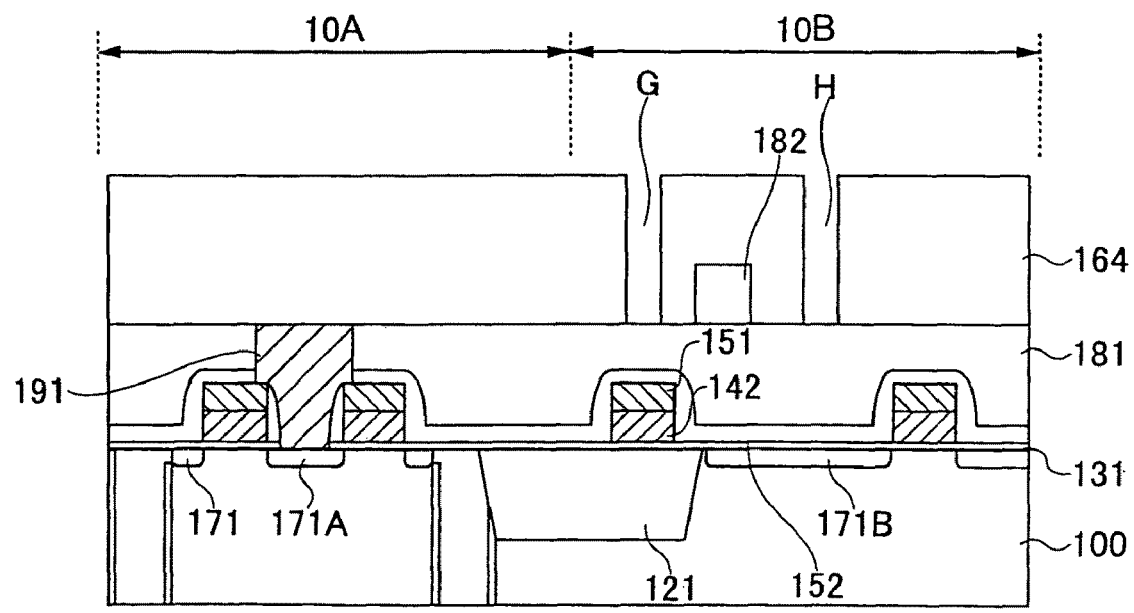

As shown in FIG. 17, a resist pattern 164 is formed on the BPSG film 181. The resist pattern 164 has an opening G to be connected to the corresponding gate electrode 142 in the peripheral circuit region 10B, and an opening H to be connected to the diffusion region 171B in the peripheral circuit region 10B. In the procedure shown in FIG. 18, with the resist film 164 serving as a mask, the BPSG film 181 is etched by the RIE technique. Thus, the polycide pattern that forms the gate electrode 142, and the diffusion region 171B formed in the silicon substrate 100 are exposed.

Figure 18:
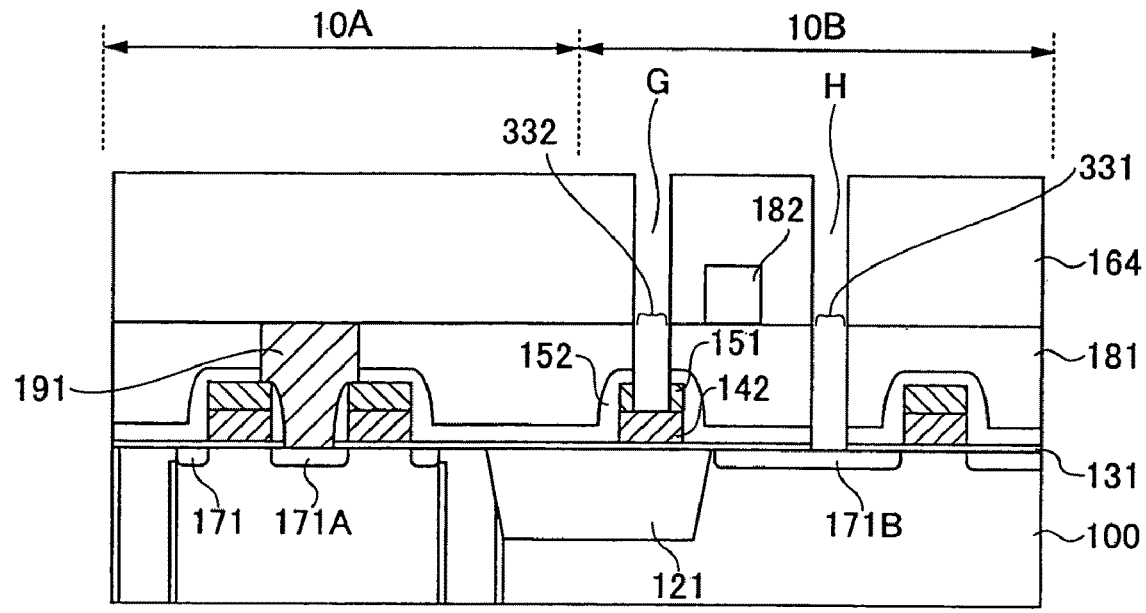

In the procedure shown in FIG. 18, a contact hole 332 is formed above the gate electrode 142. The contact hole 332 connects with the opening G formed in the resist pattern 164, extends through the silicon nitride film 152 and the silicon nitride film 151, and exposes the gate electrode 142. The depth of the contact hole 332 is approximately 500 nm.

Meanwhile, a contact hole 331 is formed above the diffusion region 171B. The contact hole 331 connects with the opening H formed in the resist pattern 164, penetrates the BPSG film 181, the silicon nitride film 152, and the gate oxide film 131, and exposes the diffusion region 171B. The depth of the contact hole 331 is approximately 700 nm.

After the formation of the contact holes 331 and 332, the resist pattern 164 is removed. Even if the contact holes 331 and 332 are formed at the same time, there is no need to worry about damage, because the difference in depth between the contact holes 331 and 332 is small, and the gate electrode 142 to be exposed through the contact hole 332 is formed on the isolation region 121 that is a thick insulating film.

Figure 19:
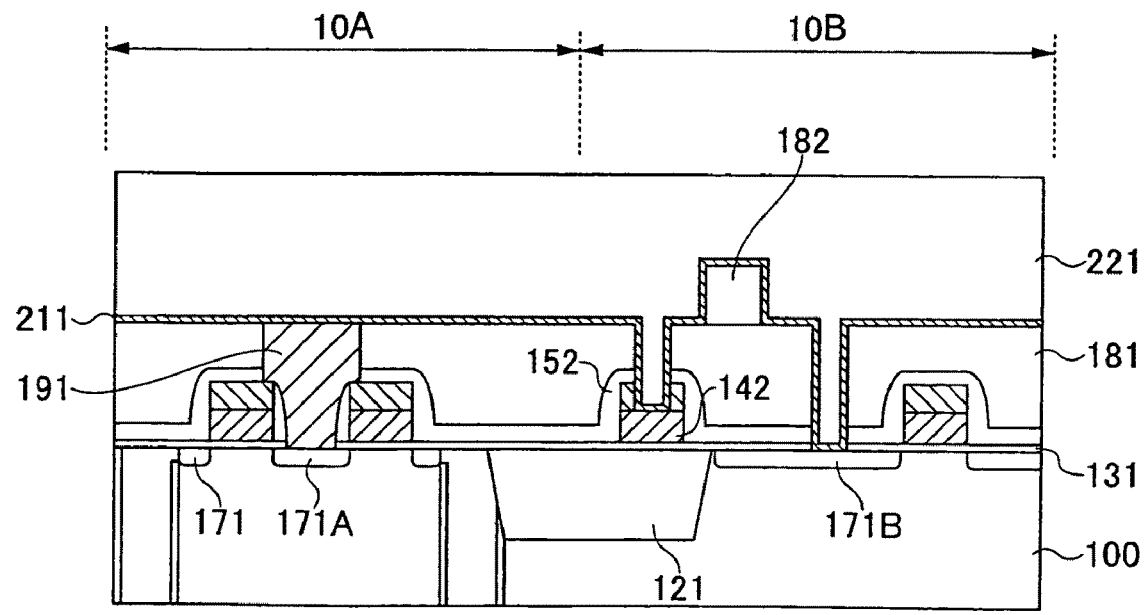

In the next procedure shown in FIG. 19, a TaN film 211 and a Cu film (not shown) are formed in that order in the wiring grooves 201 and the contact holes 331 and 332 by a sputtering device in a vacuum. With the Cu film serving as a seed layer, plating is performed to form a Cu film 221.

Figure 20:
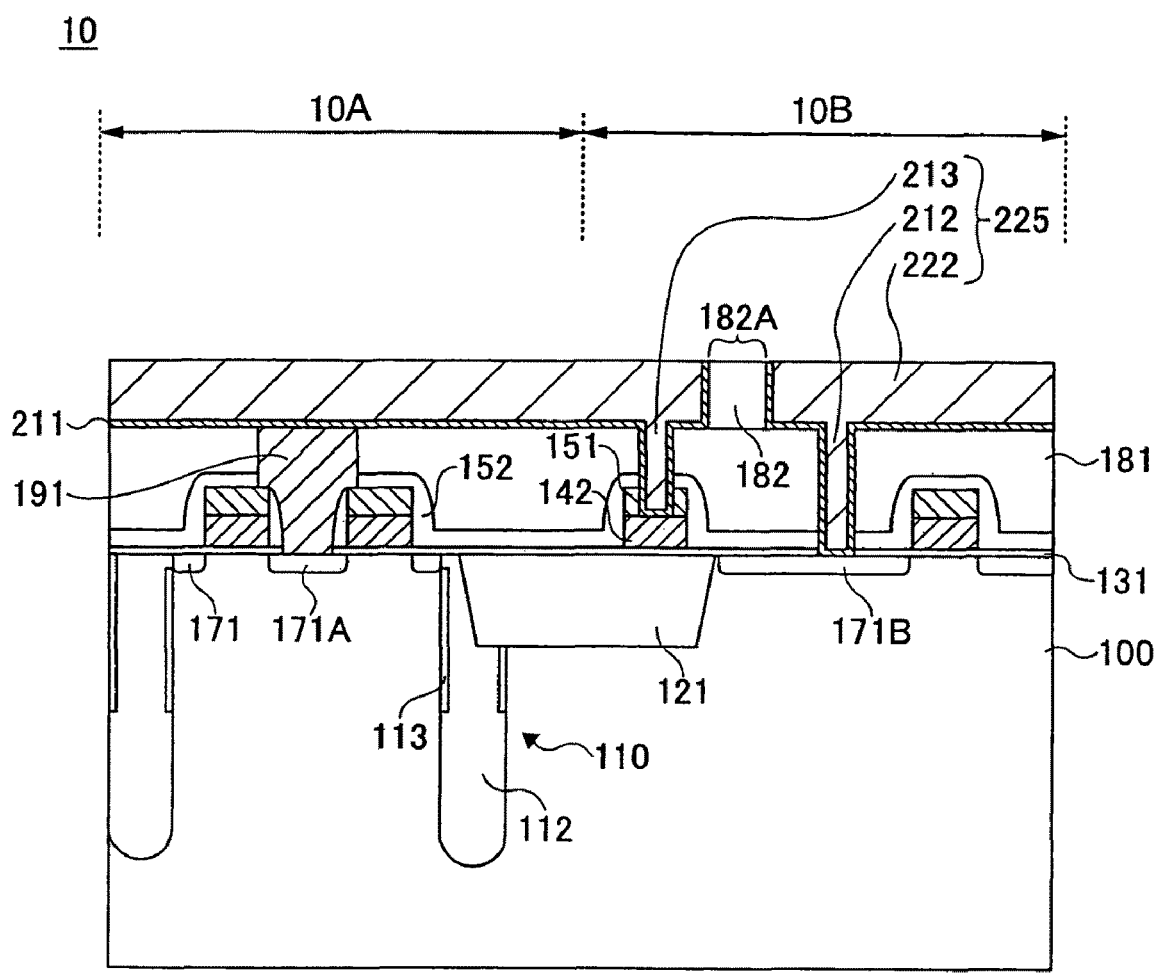

In the next procedure shown in FIG. 20, the Cu film 221 is polished by the CMP technique until the surface 182A of the BPSG film 182 is exposed. Thus, the Cu wiring pattern 222 that is in contact with the upper surface of the polysilicon plug 191, and the contact 213 that is in contact with the upper surface of the gate electrode 142 and the contact 212 that is in contact with the upper surfaced of the diffusion region 171B formed in the peripheral circuit region 10B and are connected to the Cu wiring pattern 222, can be formed at the same time. In short, in accordance with the present invention, the production procedures can be simplified, compared with the case where the Cu wiring pattern and the contact holes on the contact plug are formed separately from each other.

Also, in this embodiment, the polysilicon plug 191 is formed in the BPSG film 181 that is the first interlayer insulating film, and the wiring grooves 201 are formed in the BPSG film 181 so that the upper surface of the polysilicon plug 191 is exposed. Accordingly, there is no need to form a contact hole for electric connection on the polysilicon plug 191.

As already mentioned, in the case where contact holes of different depths are formed at the same time, the upper surface of the plug having the shallower contact hole formed thereon is likely to be damaged by etching. In this embodiment, however, there is no need to form a contact hole between the polysilicon plug 191 and the wiring pattern 222, because the polysilicon plug 191 is in contact with the wiring pattern 222. Accordingly, the polysilicon plug 191 is not damaged by etching during the formation of a contact hole. In connection with this matter, a contact hole that reaches the corresponding gate electrode 142 is not formed in the polysilicon plug 191. Also, as the wiring pattern 222 is in contact with the entire upper surface of the polysilicon plug 191, the contact area is large. Further, as the upper surface of the polysilicon plug 191 is not damaged, the adhesion strength can be increased, and the resistance can be reduced.

Second Embodiment

Figure 21:
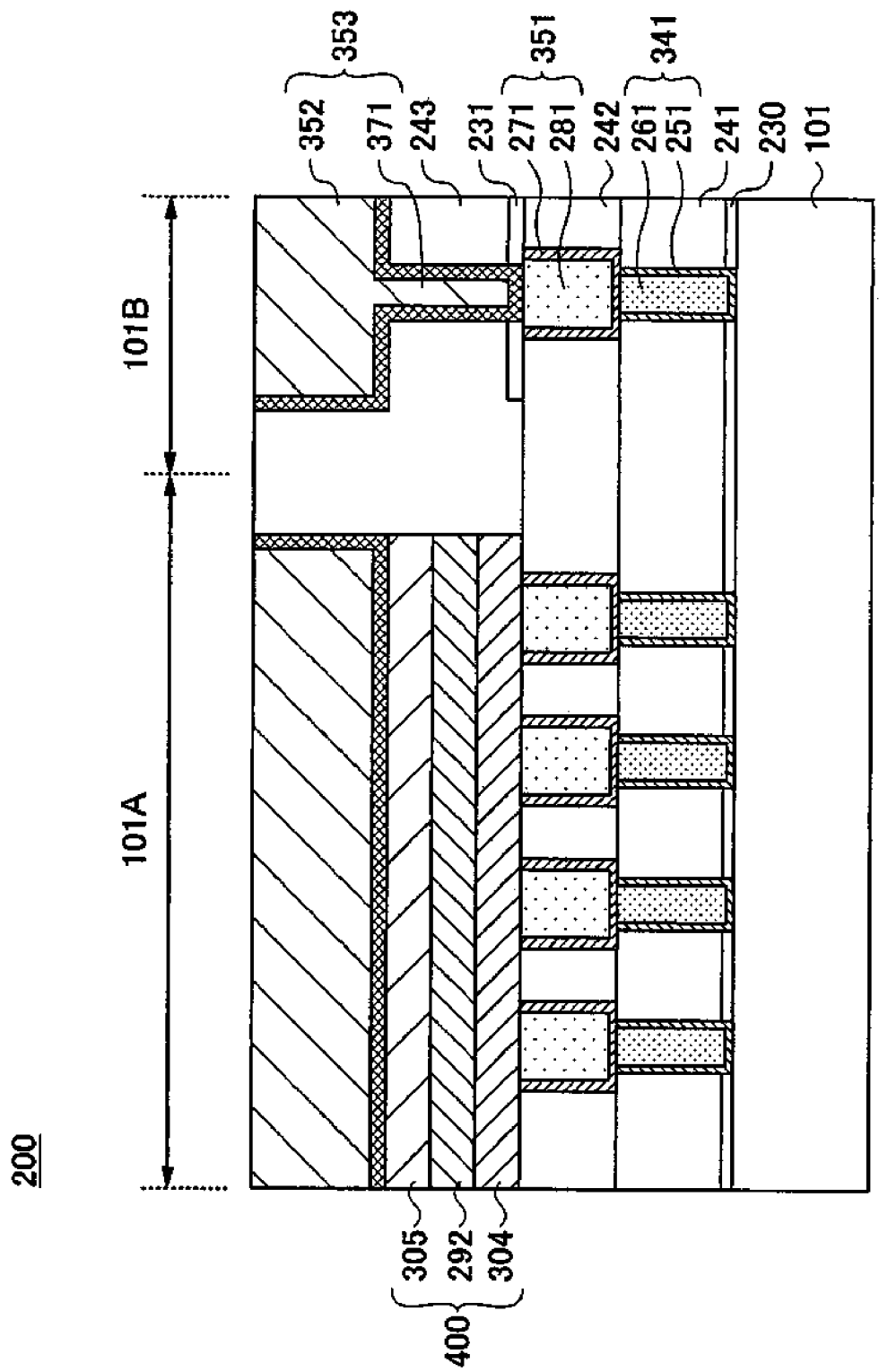
FIG. 21 is a cross-sectional view of a semiconductor device in accordance with a second embodiment of the present invention.

FIG. 21 illustrates the structure of a semiconductor device 200 in accordance with a second embodiment of the present invention. In FIG. 21, reference numeral 101A indicates a region in which a MIM capacitor is formed, and reference numeral 101B indicates a region in which other logic elements including interconnections are formed.

Referring to FIG. 21, the structure of the semiconductor device 200 in accordance with the second embodiment of the present invention is described.

As shown in FIG. 21, the semiconductor device 200 is formed on a silicon substrate 101, and includes: a transistor (not shown) that is formed on the silicon substrate 101 and includes gate electrodes and diffusion regions; a silicon nitride film 230 that covers the surface of the silicon substrate 101; a BPSG film 241 that is formed on the silicon nitride film 230; contact plugs 341 that are formed in the BPSG film 241; an interlayer insulating film 242 that is formed on the BPSG film 241 and the contact plugs 341; a wiring pattern 351 that is formed in the interlayer insulating film 242; a MIM capacitor 400 that is formed on the interlayer insulating film 242 and corresponds to the first region 101A; a silicon nitride film 231 that is formed on the interlayer insulating film 242 and corresponds to the second region 101B; an interlayer insulating film 243 that is formed on the interlayer insulating film 242 and covers the MIM capacitor 400 and the silicon nitride film 231; and a wiring pattern 353 that is formed by filling a wiring groove and a contact hole formed in the interlayer insulating film 243 with a conductive material.

The wiring pattern 353 includes a wire portion 352 and a via plug 371 that are made of the same conductive material and are formed at the same time.

The MIM capacitor 400 includes an upper electrode 305, a SiO film 292, and a lower electrode 304. The semiconductor device 200 employs the MIM capacitor 400 so as to reduce the parasitic resistance and parasitic capacitance and to increase the operating speed of analog circuits.

The bottom surfaces of the contact plugs 341 formed in the interlayer insulating film 241 are in contact with the transistor (not shown), and the upper surfaces are in contact with the wiring pattern 351. The wiring pattern 352 in the interlayer insulating film 243 in the first region 101A is in contact with the wiring pattern 351 in the interlayer insulating film 242 via the MIM capacitor 400. Meanwhile, the wiring pattern 352 in the interlayer insulating film 242 in the second region 101B is in contact with the wiring pattern 351 via the via plug 371.

In the semiconductor device 200, the wiring patterns 351 and 352, the MIM capacitor 400, the via plug 371, and the contact plugs 341 are connected to one another so as to form a circuit. When voltage is applied, the transistor is driven, and data reading and writing can be performed.

FIGS. 22 through 38 illustrate the procedures for producing the semiconductor device 200 shown in FIG. 21.

The following is a description of the procedures for producing the semiconductor device 200, with reference to FIGS. 22 through 38.

First, the procedures for forming the contact plugs 341 are described.

Figure 22:
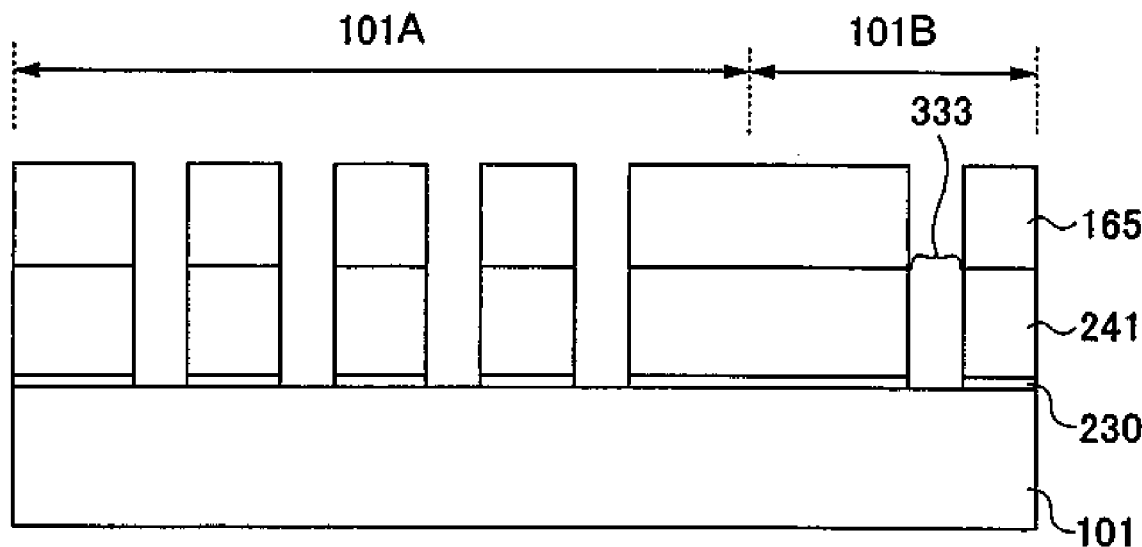
FIGS. 22 through 38 illustrate the procedures for producing the semiconductor device in accordance with the second embodiment.

As shown in FIG. 22, after the transistor (not shown) that includes gate electrodes and diffusion regions is formed on the silicon substrate 101, a 100 nm thick silicon nitride film 230 and a 900 nm thick BPSG film 241 are formed in that order, so as to cover the transistor on the silicon substrate 101. The BPSG film 241 is then polished by the CMP technique, so that the surface of the BPSG film 241 is flattened. After the flattening process, the thickness of the BPSG film 241 becomes 600 nm.

A resist pattern 165 that has openings corresponding to the contact plugs 341 to be formed in the BPSG film 241 is then formed on the BPSG film 241. With the resist pattern 165 serving as a mask, the silicon nitride film 230 and the BPSG film 241 are etched to form contact holes 333 through which the silicon substrate 101 is exposed.

After the formation of the contact holes 333, the resist film 165 is removed.

Figure 23:
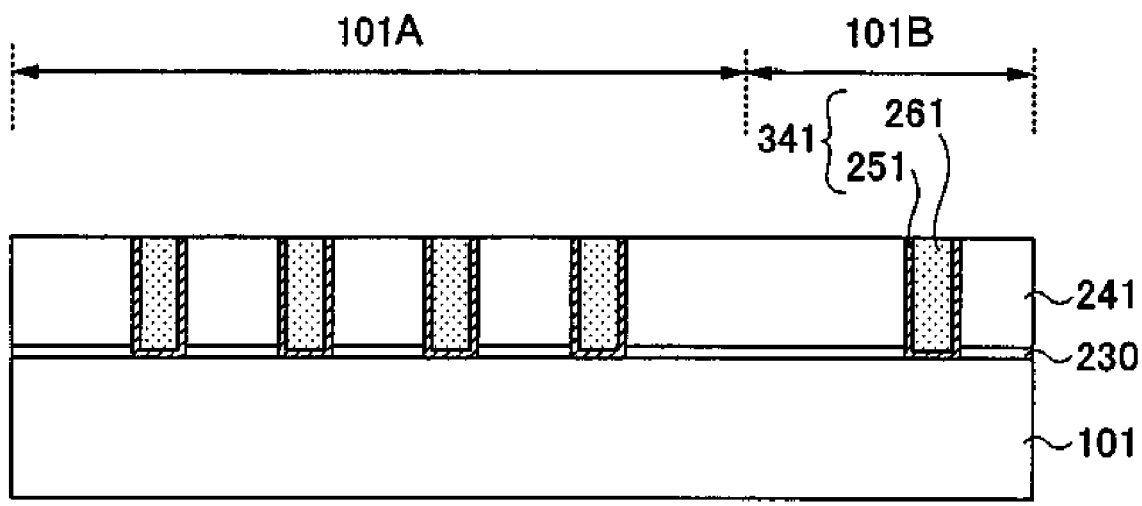

In the next procedure shown in FIG. 23, a Ti/TiN film 251 is formed on the interlayer insulating film 241, so as to cover the side wall surfaces and the bottom surfaces of the contact holes 333. A 400 nm thick tungsten film 261 is then formed on the interlayer insulating film 241, so as to fill the contact holes 333 via the Ti/TiN film 251. The excessive Ti/TiN film 251 and the tungsten film 261 on the interlayer insulating film 241 are polished and removed by the CMP technique so that the interlayer insulating film 241 is exposed. Thus, the contact plugs 341 each including the Ti/TiN film 251 and the tungsten film 261 are formed in the respective contact holes 333.

Next, the procedures for forming the wiring pattern 351 in the interlayer insulating film 242 are described.

Figure 24:
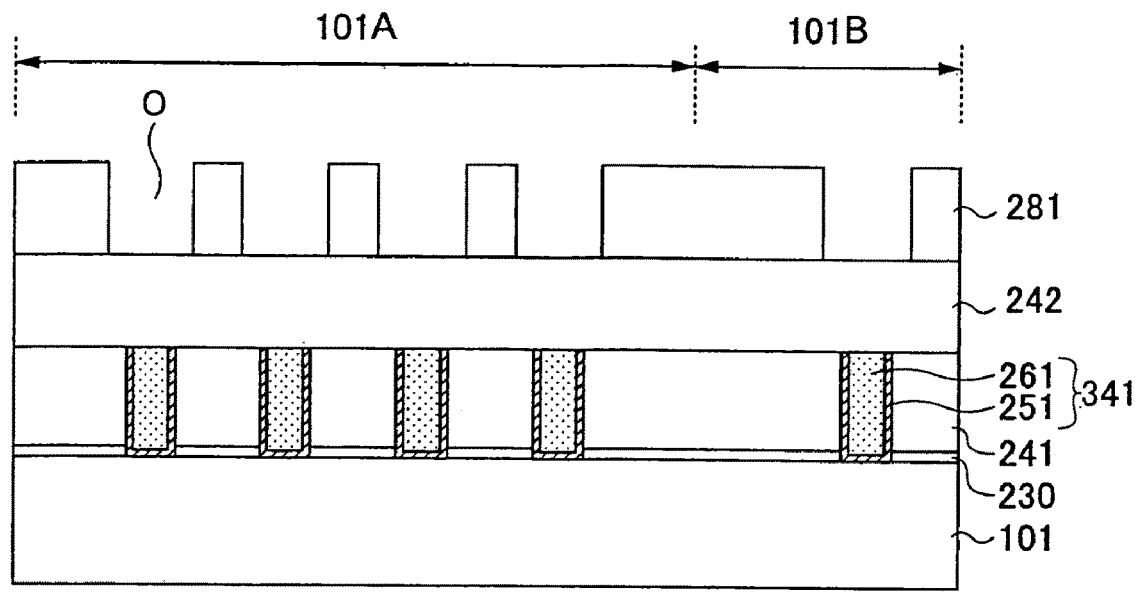

As shown in FIG. 24, the interlayer insulating film 242 is first formed by the CVD (chemical vapor deposition) technique on the structure shown in FIG. 23. The interlayer insulating film 242 is typically made of SiO film or FSG (fluoric silicate glass) film, but is not limited to those films. After the formation of the interlayer insulating film 242, a resist pattern 281 that has openings O corresponding to the wiring grooves to be produced is formed on the interlayer insulating film 242.

Figure 25:
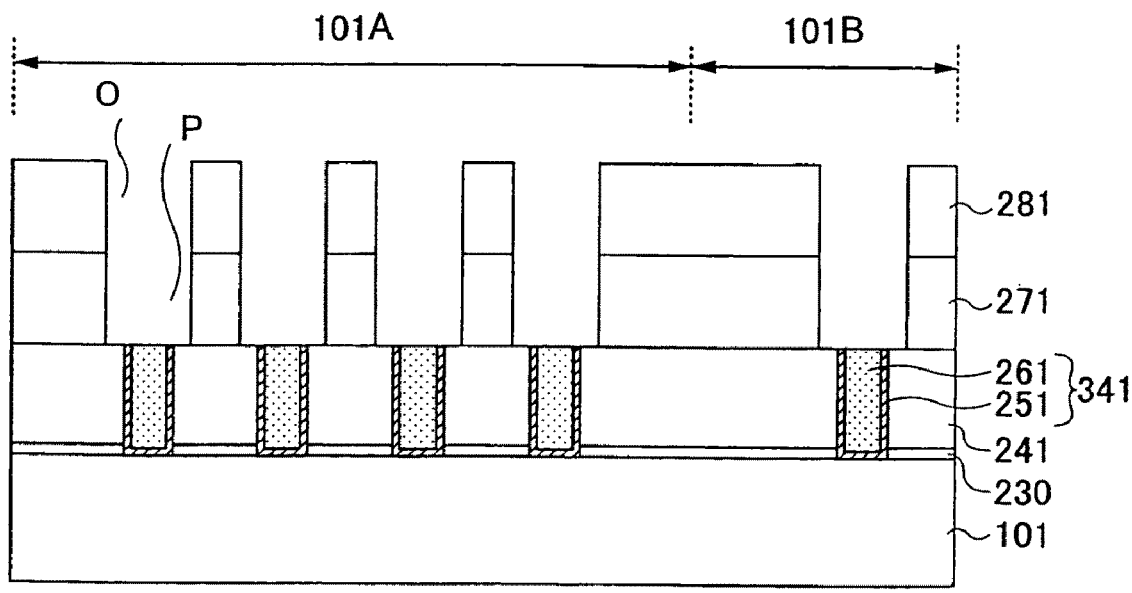

In the next procedure shown in FIG. 25, with the resist pattern 281 serving as a mask, the interlayer insulating film 242 is etched until the contact plugs 341 and the BPSG film 241 are exposed. Thus, openings P are formed as wiring grooves in the interlayer insulating film 242. After the formation of the openings P, the resist film 281 is removed.

Figure 26:
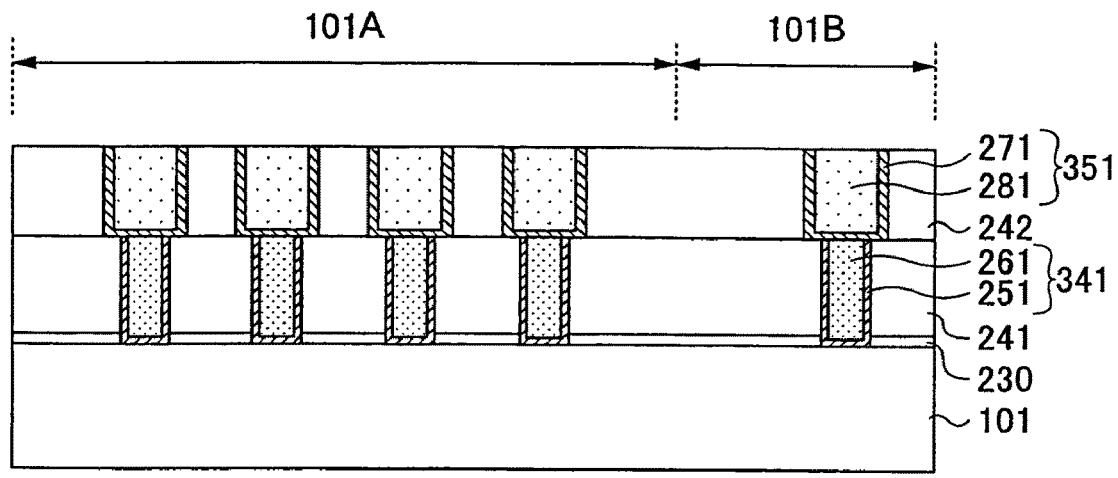

Next, as shown in FIG. 26, a TaN film and a Cu film (not shown) are successively formed on the interlayer insulating film 242 in that order by a sputtering device in a vacuum, so that the side wall surfaces and the bottom surfaces of the openings P are covered. With the Cu film serving as the seed layer, plating is performed to form a Cu film 281 that fills the openings P via the TaN film and the Cu film.

The Cu film and the TaN film formed on the interlayer insulating film 242 are then removed by the CMP technique. Thus, the Cu wiring pattern 351 is formed in the openings P.

Next, the procedures for forming a protection film on the wiring pattern 351 are described.

Figure 27:
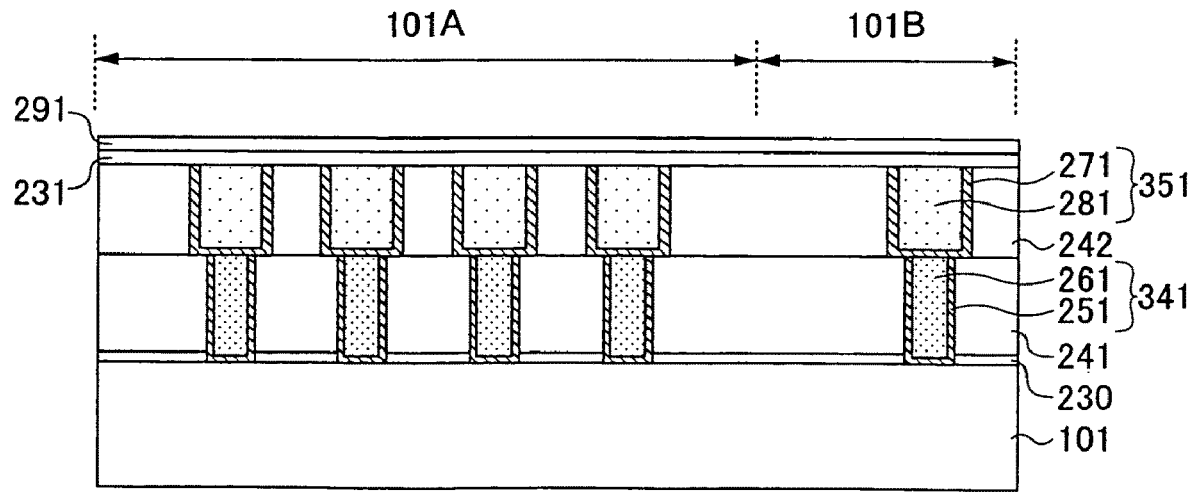

As shown in FIG. 27, a 70 nm thick silicon nitride film 231 is formed as a Cu diffusion preventing film on the interlayer insulating film 242 having the wiring pattern 351 formed therein. A 100 nm thick $SiO_2$ film 291 is then formed on the silicon nitride film 231.

Figure 28:
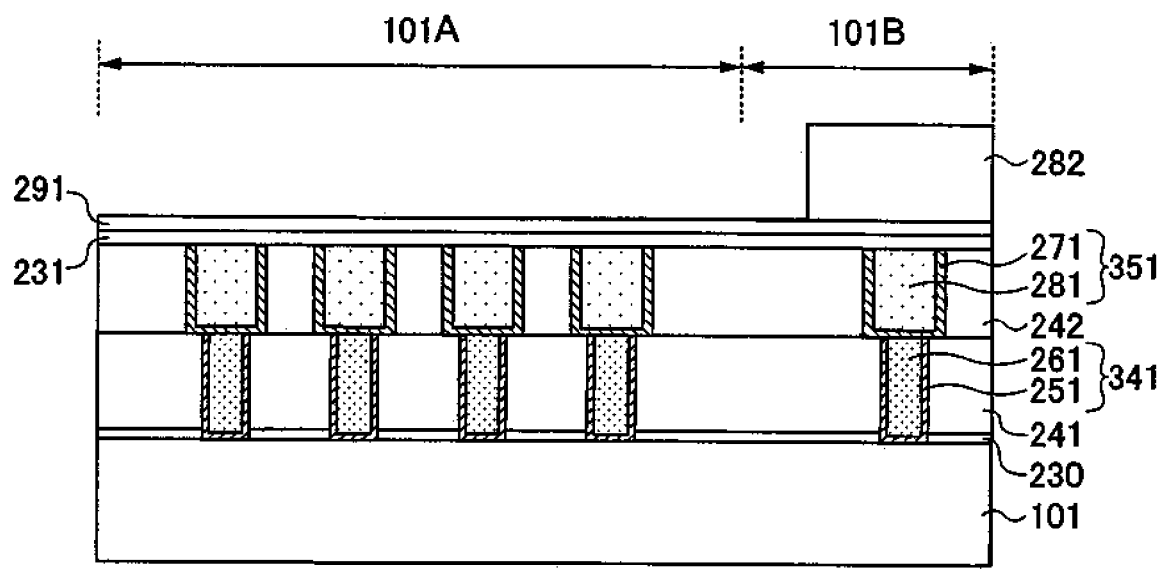
Figure 29:
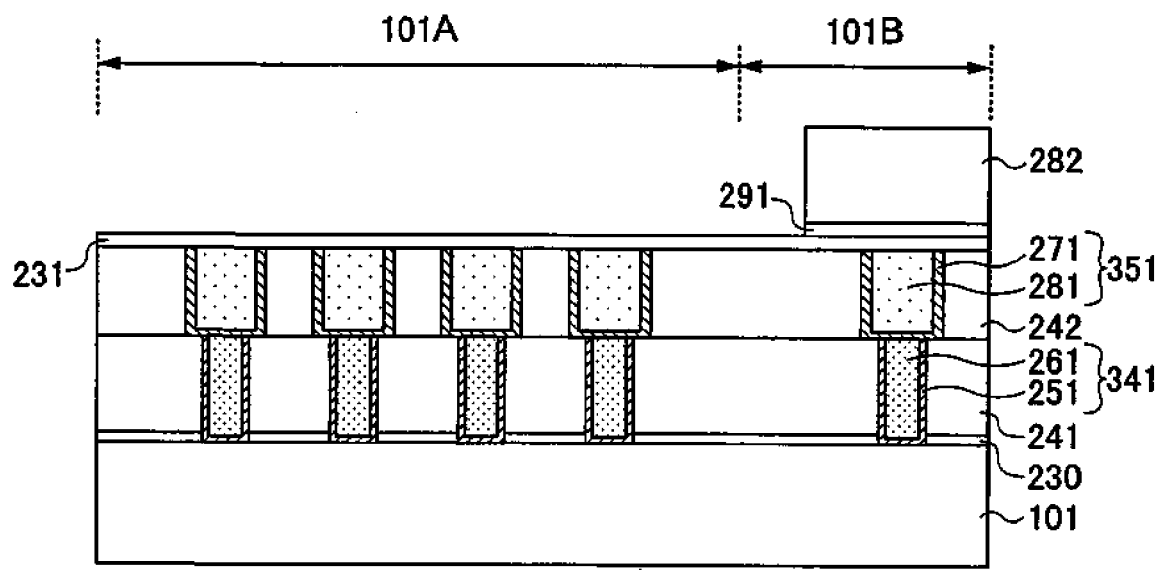
Figure 30:
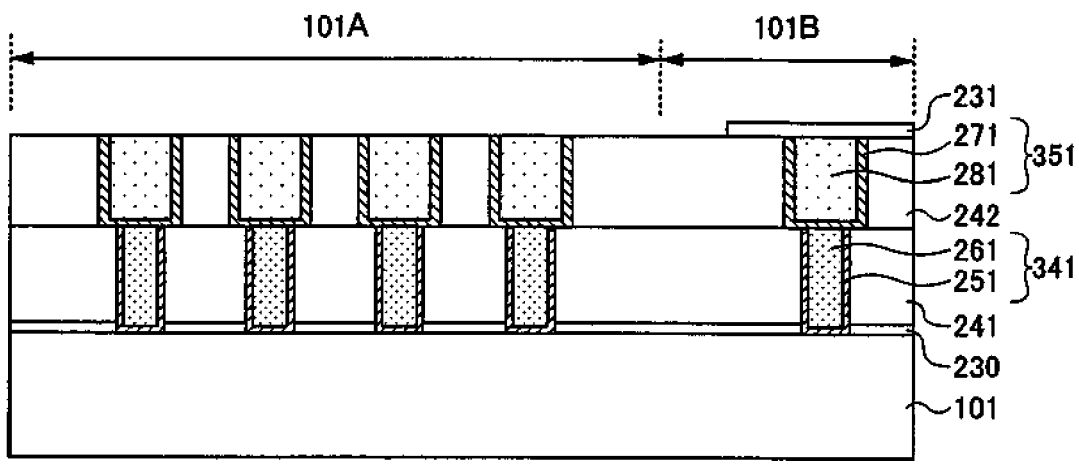

In the next procedure shown in FIG. 28, a resist pattern 282 is formed to cover the $SiO_2$ film 291 in the second region 101B. In the procedure shown in FIG. 29, with the resist pattern 282 serving as a mask, the $SiO_2$ film 291 is removed. The resist pattern 282 is then removed. With the patterned $SiO_2$ film 291 serving as a mask, the silicon nitride film 231 is etched so that the upper surfaces of the wiring pattern 351 and the interlayer insulating film 242 are exposed in the first region 101A, as shown in FIG. 30. Meanwhile, in the second region 101B, the wiring pattern 351 is covered with the silicon nitride film 231.

Next, the procedures for forming the MIM capacitor 400 are described.

Figure 31:
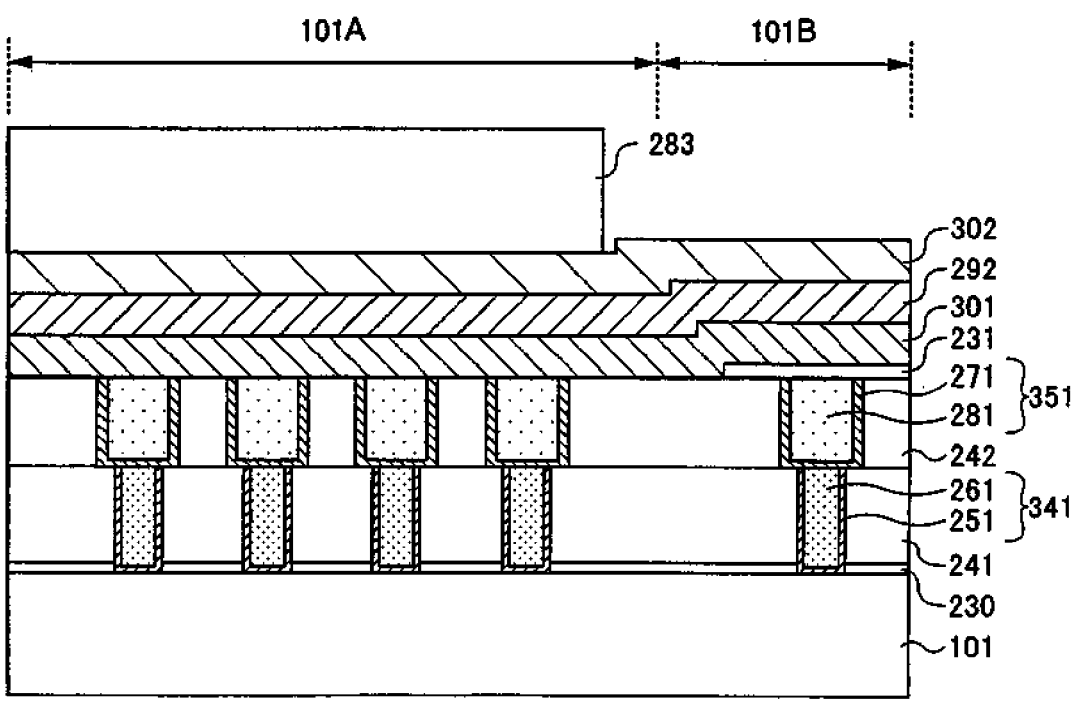

As shown in FIG. 31, a 200 nm thick TiN film 301, a 40 nm thick $SiO_2$ film 292, and a 150 nm thick TiN film 302 are formed in that order on the structure shown in FIG. 30. The TiN films 301 and 302 may be formed by a sputtering technique, for example, while the $SiO_2$ film 292 is formed by the CVD technique.

In the procedure shown in FIG. 31, a resist pattern 283 is further formed on the TiN film 302 in the region 101A, so that the MIM capacitor 400 can be formed in the first region 101A.

Figure 32:
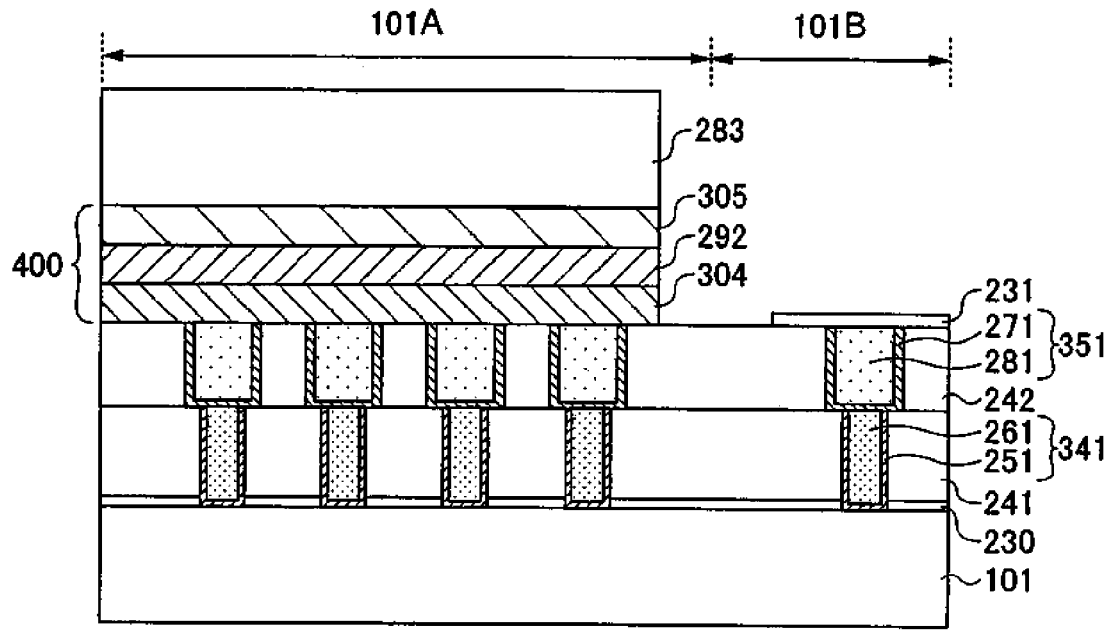

In the next procedure shown in FIG. 32, with the resist pattern 283 serving as a mask, etching is performed on the TiN film 305, the $SiO_2$ film 292, and the TiN film 304 by the RIE technique, until the upper surface of the interlayer insulating film 242 is exposed. Thus, the MIM capacitor 400 that has the TiN film 304 as the lower electrode, the $SiO_2$ film 292 as the capacitor insulating film, and the TiN film 305 as the upper electrode is formed in the first region 101A. After the formation of the MIM capacitor 400, the resist film 283 is removed. In the etching procedure shown in FIG. 32, the wiring pattern 351 in the interlayer insulating film 242 is not damaged, because the silicon nitride film 231 exists in the second region 101B.

Next, the procedures for forming the wiring grooves corresponding to the wiring pattern 352 in the interlayer insulating film 243 are described.

Figure 33:
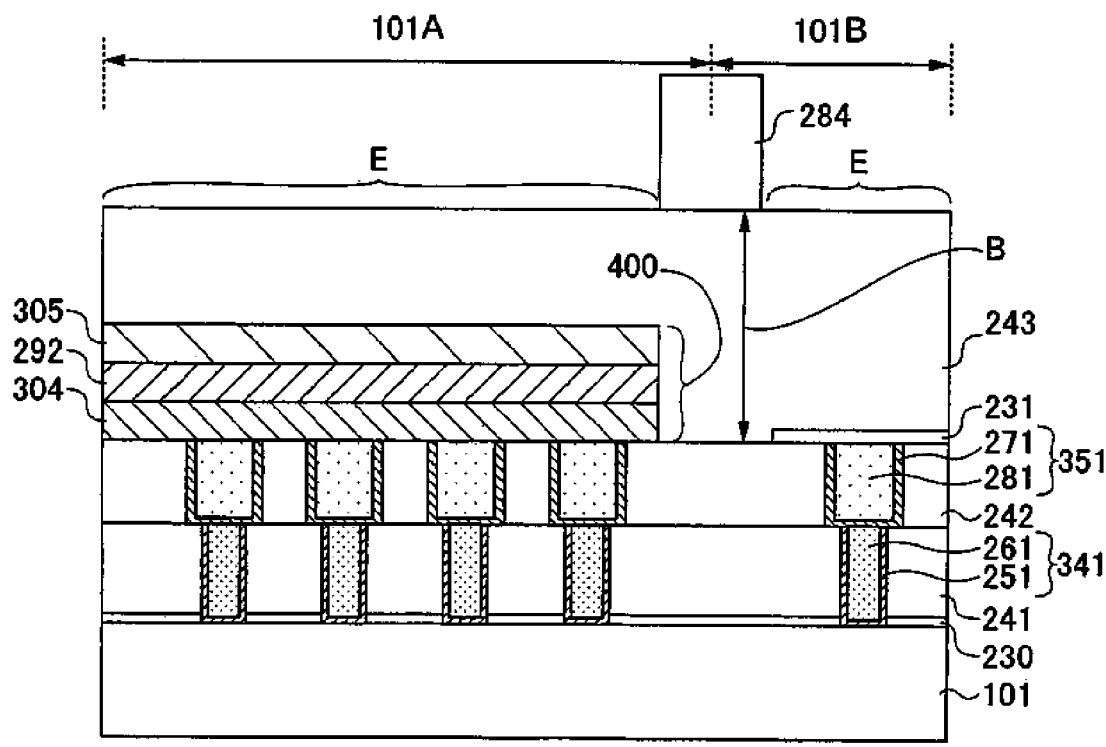

As shown in FIG. 33, a 1100 nm thick interlayer insulating film 243 that is made of silicon oxide is formed on the interlayer insulating film 242, so as to cover the MIM capacitor 400 in the first region 101A and the silicon nitride film 231 in the second region 101B. The interlayer insulating film 243 is then polished by the CMP technique, so that the thickness B shown in FIG. 33 becomes approximately 730 nm. As the interlayer insulating film 243, a HDP-SiO film or a FSG film that is formed by the CVD technique may be employed, but it is not limited to those materials.

In the procedure shown in FIG. 33, resist is then applied onto the interlayer insulating film 243. Openings E corresponding to the MIM capacitor 400 in the first region 101A and the silicon nitride film 231 in the second region 101B are then formed in the resist, thereby forming a resist pattern 284.

Figure 34:
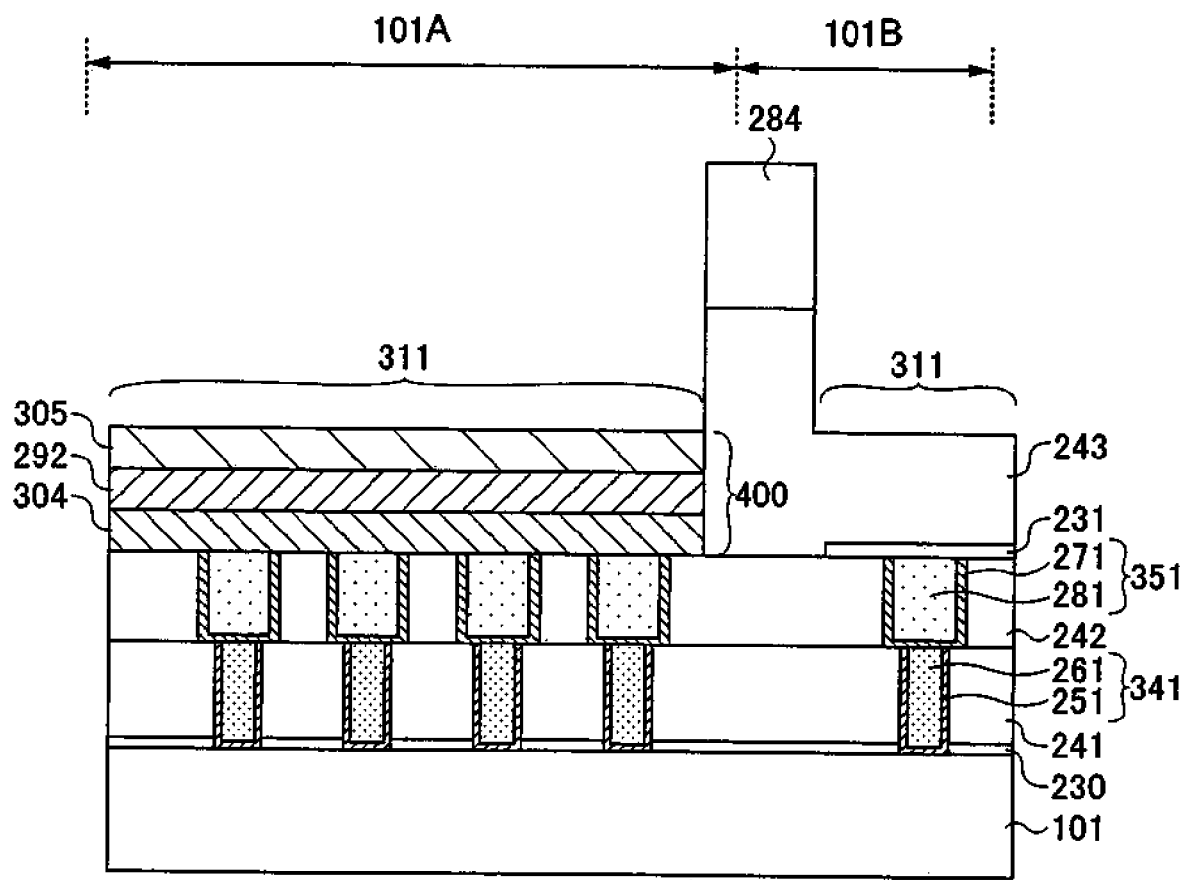

In the next procedure shown in FIG. 34, with the resist pattern 284 serving as a mask, the interlayer insulating film 243 is etched until the upper surface of the upper electrode 305 of the MIM capacitor 400 is exposed. Thus, wiring grooves 311 are formed in the interlayer insulating film 243. After the formation of the wiring grooves 311, the resist pattern 284 is removed.

In accordance with this embodiment, the wiring grooves 311 are formed to expose the upper surface of the upper electrode 305. Therefore, there is no need to form a via hole for electric connection on the upper surface of the upper electrode 305. Accordingly, the upper surface of the upper electrode 305 and MIM capacitor insulating film are not damaged by the excessive etching performed for forming a via hole.

Next, the procedures for forming the via plug 371 are described.

Figure 35:
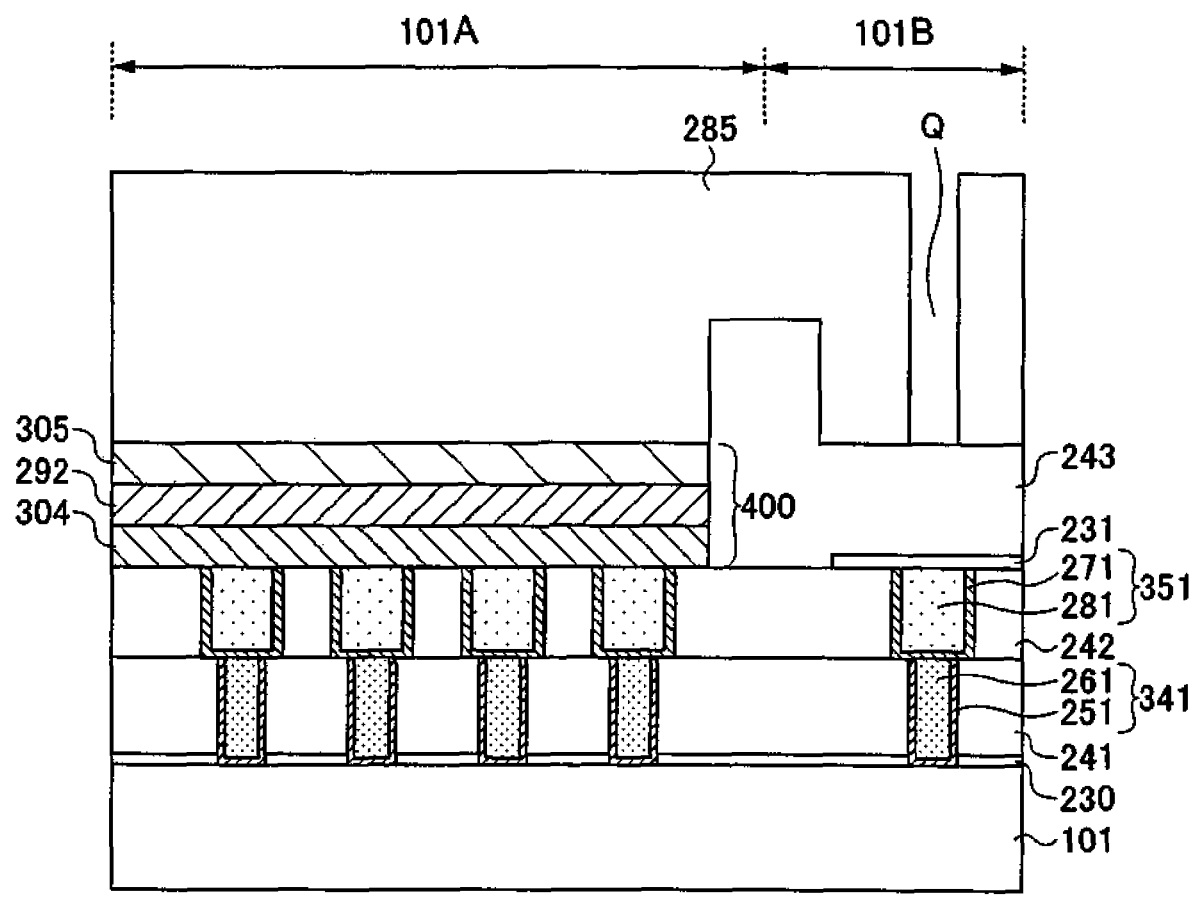

As shown in FIG. 35, after the resist film 284 is removed from the structure shown in FIG. 34, resist is applied onto the interlayer insulating film 243 in the second region 101B and the MIM capacitor 400 in the first region 101A. An opening Q corresponding to the wiring pattern 351 in the second region 101B is then formed. Thus, a resist pattern 285 is produced.

Figure 36:
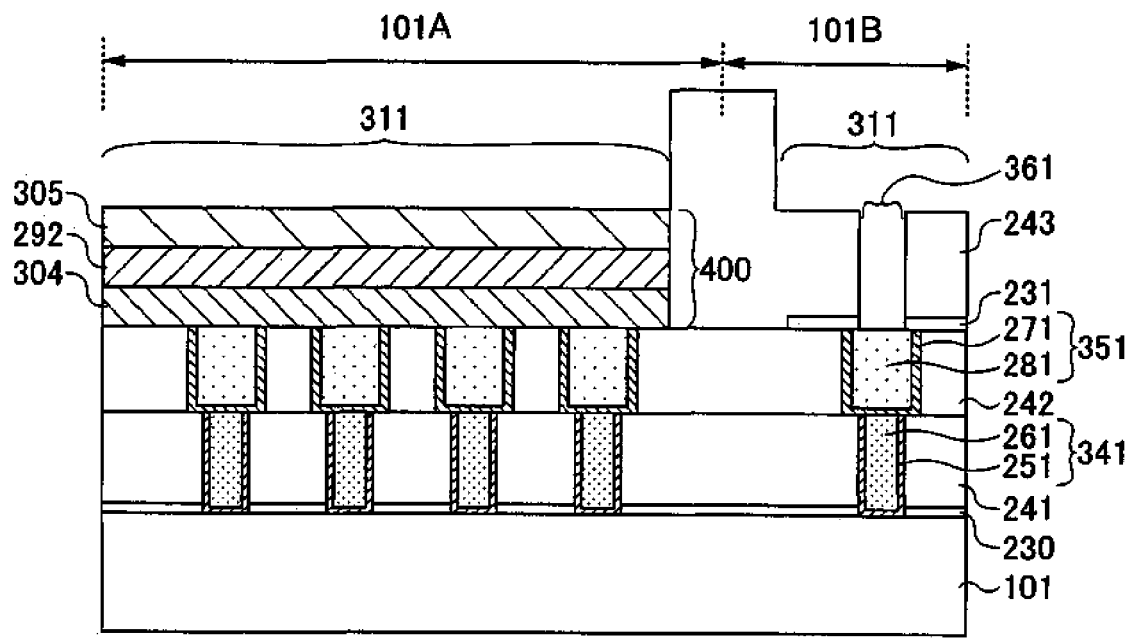

With the resist pattern 285 serving as a mask, etching is performed on the interlayer insulating film 243 and the silicon nitride film 231, thereby forming a via hole 361 in the corresponding wiring groove 311 as shown in FIG. 36. The via hole 361 exposes the wiring pattern 351 formed in the interlayer insulating film 242. After the formation of the via hole 361, the resist film 285 is removed.

Next, the procedures for filling the wiring grooves 311 and the via hole 361 with metal film are described.

Figure 37:
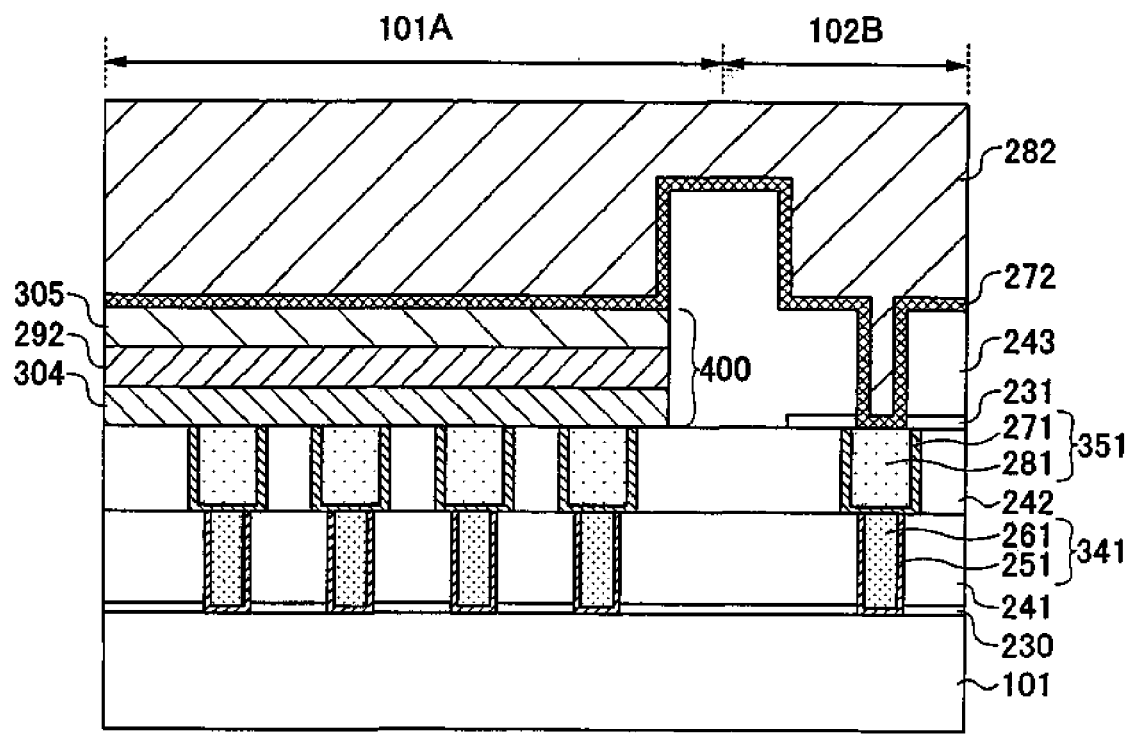

As shown in FIG. 37, a TaN film 272 and a Cu film (not shown) are formed in that order by a sputtering technique in a vacuum, so that the surfaces of the wiring grooves 311 and the via hole 361 shown in FIG. 36 are covered. With the Cu film serving as a seed layer, the wiring grooves 311 and the via hole 361 are filled with a Cu film 282 by a plating technique.

Figure 38:
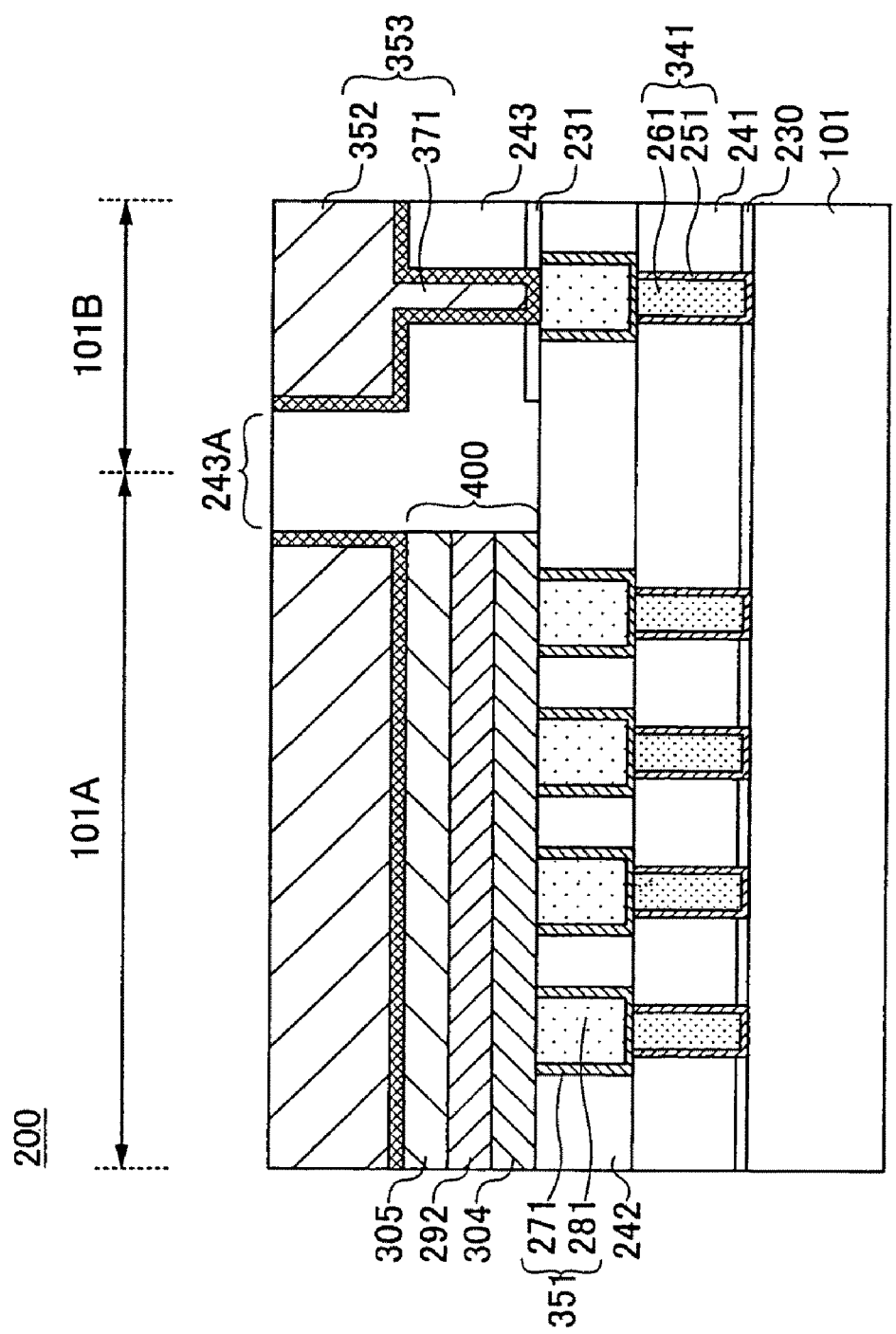

In the next procedure shown in FIG. 38, the Cu film 282 is polished by the CMP technique until the upper surface 243A of the interlayer insulating film 243 is exposed, and the wiring pattern 353 that includes the wiring pattern 352 and the via plug 371 is formed at the same time.

Since the wiring grooves 311 are formed on the upper surface of the upper electrode 305 in this embodiment, there is no need to form a via hole for electric connection on the upper electrode 305, and the upper electrode 305 and MIM insulation film are not damaged by the excessive etching performed to form the via hole 361. Also, as the wiring pattern 352 is in contact with the entire upper surface of the upper electrode 305, the contact area is increased, and the resistance is reduced. Further, as the upper surface of the upper electrode 305 is not damaged, the adhesion strength between the wiring pattern 352 and the upper electrode 305 can be increased.

Although the wiring pattern 352 is in contact with the entire upper surface of the upper electrode 305 in this embodiment, the wiring pattern 352 does not need to be in contact with the entire upper surface of the upper electrode 305. The same effect as that of this embodiment can be achieved when the contact area is larger than the contact area between the conventional via plug and the upper electrode 305.

With the present invention, the problem of severe degradation of dielectric integrity and hence long term reliability of the MIM insulation film, which would occur at the time of formation of the via hole as the upper electrode of the MIM undergoes excessive etching, is successfully attended to.

Third Embodiment

Figure 39A:
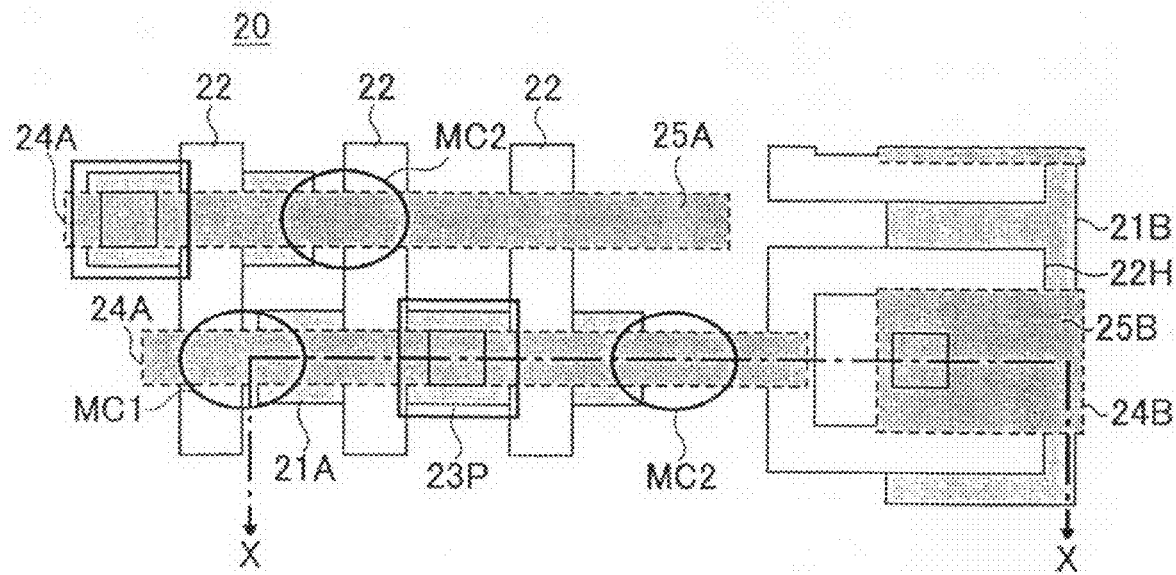
FIGS. 39A and 39B illustrate the structure of a semiconductor device in accordance with a third embodiment of the present invention.
Figure 39B:
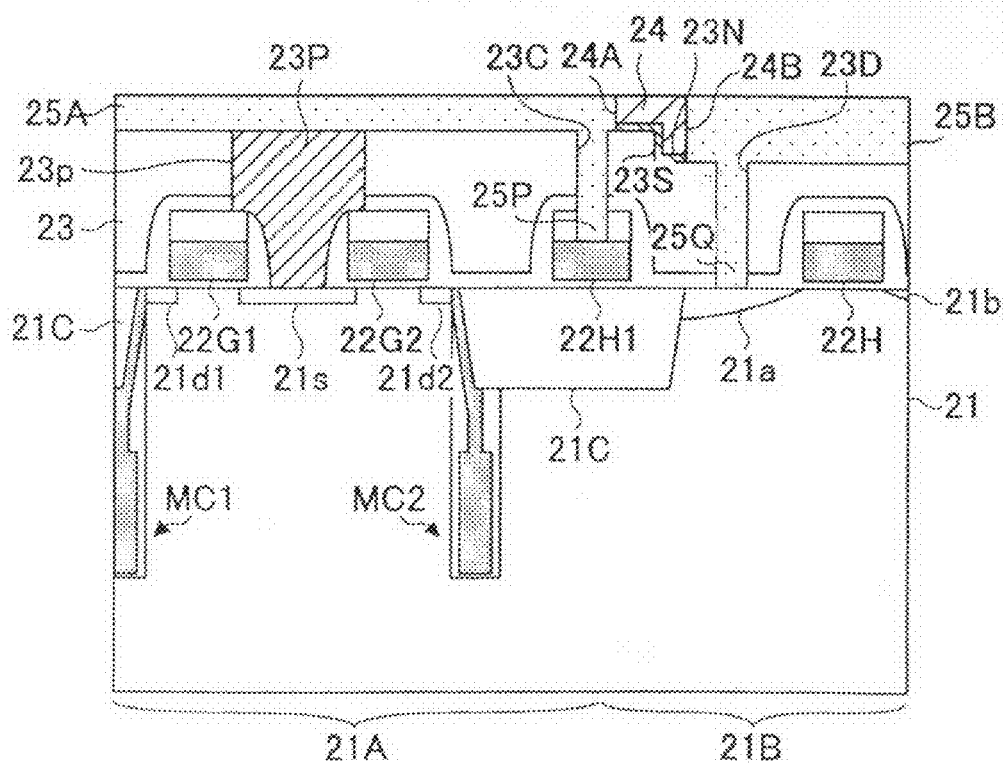

FIGS. 39A and 39B illustrate the structure of a DRAM integrated circuit device 20 in accordance with a third embodiment of the present invention. FIG. 39A is a plan view of the DRAM integrated circuit device 20, and FIG. 39B is a cross-sectional view of the DRAM integrated circuit device 20, taken along the dot-and-dash line of FIG. 39A.

Referring to FIG. 39A, the DRAM integrated circuit device 20 is formed on a silicon substrate 21. On the silicon substrate 21, a memory cell region 21A and a peripheral circuit region 21B are formed and are separated from each other by a device isolation region 21C having a STI structure or the like. In the memory cell region 21A, memory cells $MC_1$ and $MC_2$ each having the same structure as the above described trench capacitor 110 are formed. In the peripheral circuit region 21B, a peripheral circuit or a logical circuit is formed. On the memory cell region 21A, gate electrodes $22G_1$ and $22G_2$ that constitute part of word lines 22 are formed via the respective gate insulating films. Each of the gate electrodes $22G_1$ and $22G_2$ has a polycide structure in which a polysilicon film and a silicide layer are laminated on each other, and has side wall surfaces covered with a side wall insulating film and an upper surface covered with a thin insulating film that continues to the side wall insulating film.

In the silicon substrate 21 in the drawings, an n-type diffusion region 21s is formed between the gate electrodes $22G_1$ and $22G_2$, an n-type diffusion region $21d_1$ is formed on the outer side of the gate electrode $22G_1$, and an n-type diffusion region $21d_2$ is formed on the outer side of the gate electrode $22G_2$. The n-type diffusion region $21d_1$ is connected to the memory cell capacitor $MC_1$, while the n-type diffusion region $21d_2$ is connected to the memory cell capacitor $MC_2$.

Meanwhile, a gate electrode 22H is formed in the peripheral circuit region 21B. Part of the gate electrode 22H extends as a conductor pattern $22H_1$ on the device isolation region 22C. In the peripheral circuit region 21B, n-type or p-type diffusion regions 21a and 21b are formed on either side of the gate electrode 22H. Each of the gate electrode 22H and the conductor pattern $22H_1$ has both side walls covered with a side wall insulating film. The upper surface of each of the gate electrode 22H and the conductor pattern $22H_1$ is covered with a thin insulating film that is the same as the thin insulating film covering the gate electrodes $22G_1$ and $22G_2$.

In the DRAM integrated circuit device 20, an interlayer insulating film 23 is formed to cover the gate electrodes $22G_1$ and $22G_2$ and 22H and $22H_1$ on the silicon substrate 21. In the interlayer insulating film 23, a self-aligned contact hole 21p is formed between the gate electrodes $22G_1$ and $22G_2$, with the side wall insulating films of the gate electrodes $22G_1$ and $22G_2$ shaping the self-aligned contact hole 21p. The self-aligned contact hole 21p is filled with an $n^+$-doped polysilicon plug 23P. This polysilicon plug 23P is formed by filling the self-aligning contact hole 21p with a polysilicon film deposited on the interlayer insulating film 23, and then removing the polysilicon film on the interlayer insulating film 23 by the CMP technique. As a result of the CMP process, the upper surface of the polysilicon plug 23P is exposed through the surface of the interlayer insulating film 23, and forms the same plane as the upper surface of the interlayer insulating film 23.

As can be seen from the cross-sectional view of FIG. 39B, the surface portions of the interlayer insulating film 23 are removed through an etching process that is performed on the peripheral circuit region 21B as described later. As a result, a step portion 23S is formed in the boundary region between the memory cell region 21A and the peripheral circuit region 21B. In the step portion 23S, the surface of the interlayer insulating film 23 is covered with a SiN film 23N that is used as an etching stopper during the etching process.

Another interlayer insulating film 24 is formed on the interlayer insulating film 23 covered with the SiN film 23N. In the interlayer insulating film 24, a wiring groove 24A corresponding to the memory cell region 21A is formed, and a wiring groove 24B corresponding to the peripheral circuit region 21B is formed. The wiring grooves 24A and 24B expose the interlayer insulating film 23 at the bottom. However, as the step portion 23S is formed as described above, the wiring groove 24B is deeper than the wiring groove 24A.

In the DRAM integrated circuit device 20, a contact hole 23C that exposes the conductor pattern $22H_1$ is formed in the wiring groove 24A, and a contact hole 23D that exposes the diffusion region 21a is formed in the wiring groove 24B. The wiring grooves 24A and 24B, as well as the contact holes 23C and 23D, are filled with Cu film. A Cu wiring pattern 25A is formed in the wiring groove 24A, and a Cu wiring pattern 25B is formed in the wiring groove 24B. The Cu wiring pattern 25A includes a Cu plug 25P that fills the contact hole 23C, and the Cu wiring pattern 25B includes a Cu plug 25Q that fills the contact hole 23D.

The Cu wiring patterns 25A and 25B are formed by filling the wiring grooves 24A and 24B with Cu film and then removing excessive Cu film on the interlayer insulating film 24 by the dual damascene technique. Thus, the Cu wiring patterns 25A and 25B have flat surfaces that are in the same plane as the surface of the interlayer insulating film 24.

Although the DRAM integrated circuit device 20 has a multi-layer wiring structure including the wiring patterns 25A and 25B formed by the dual damascene technique, a contact plug to be in contact with the n-type diffusion region 21s in the DRAM memory cell transistor can be formed with the $n^+$-type polysilicon plug 23P. Accordingly, the contact resistance can be reduced, without an increase in the impurity concentration in the diffusion region 21s. As a result, the impurity concentration in the n-type diffusion regions $21d_1$ and $21d_2$ that are formed at the same time as the formation of the diffusion region 21s can be reduced, and an increase in capacitor leak current due to lattice defect in the diffusion regions $21d_1$ and $21d_2$ can be suppressed.

Also, since the wiring groove 24B in the peripheral circuit region 21B is deeper in this embodiment, the wiring pattern 25B formed in the wiring groove 24B is thicker, and the parasitic resistance in the wiring patterns can be effectively reduced. On the other hand, the wiring groove 24A in the memory cell region 21A is shallower. Accordingly, the wiring pattern 25A formed in the wiring groove 24A is thinner, and the parasitic capacitance can be effectively reduced. Even if the memory cell capacitors $MC_1$ and $MC_2$ are very small, the DRAM integrated circuit device 20 can perform information reading and writing with precision, and can increase the operating speed of the peripheral circuit or a logical circuit monolithically formed on the silicon substrate 21.

Also, since the polysilicon plug 23P is directly brought into contact with the multi-layer wiring structure in the DRAM integrated circuit device 20, the conductor pattern $22H_1$ and the diffusion region 21a in contact with the multi-layer wiring structure are formed in the vicinity of the surface of the silicon substrate 21, even though the silicon substrate 21 has a large height. As a result, a large difference in level exists. However, it is not difficult to expose the contact holes 23C and 23D, as described later. When these contact holes 23C and 23D are formed, very fine patterning can be obtained, using an exposure optical system with high resolution and a great numerical aperture.

In the following, the procedures for producing the DRAM integrated circuit device 20 are described, with reference to FIGS. 40A through 40G. In FIGS. 40A through 40G, the memory cell capacitors $MC_1$ and $MC_2$ are not shown.

Figure 40A:
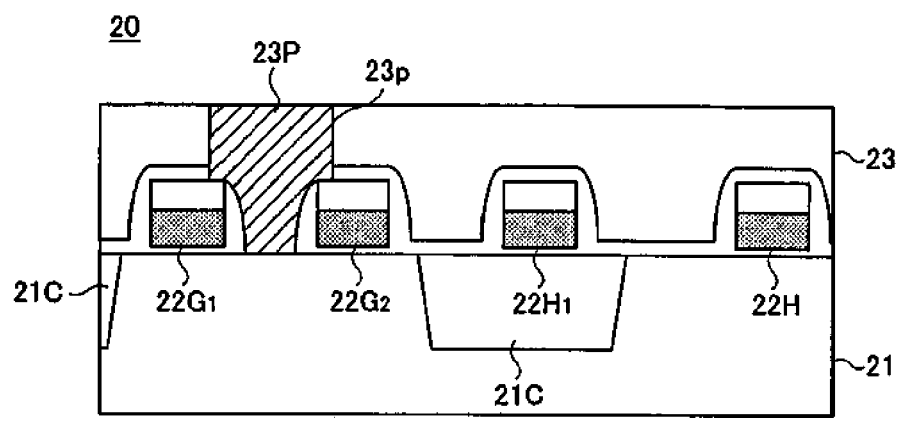
FIGS. 40A through 40G illustrate the procedure for producing the semiconductor device in accordance with the third embodiment.

In the procedure shown in FIG. 40A, the memory cell capacitors $MC_1$ and $MC_2$ (not shown), the device isolation region 21C, the gate electrodes $22G_1$, $22G_2$, and 22H, and the conductor pattern $22H_1$ are formed on the silicon substrate 21. The gate electrodes $22G_1$, $22G_2$, and 22H, and the conductor pattern $22H_1$ are then covered with the interlayer insulating film 23, and the self-aligned contact hole 23p is formed by a known technique. The self-aligned contact hole 23p is filled with n+-type polysilicon film, and excessive polysilicon film on the interlayer insulating film 23 is then removed by the CMP technique. Thus, the polysilicon plug 23P is formed in the contact hole 23p.

Figure 40B:
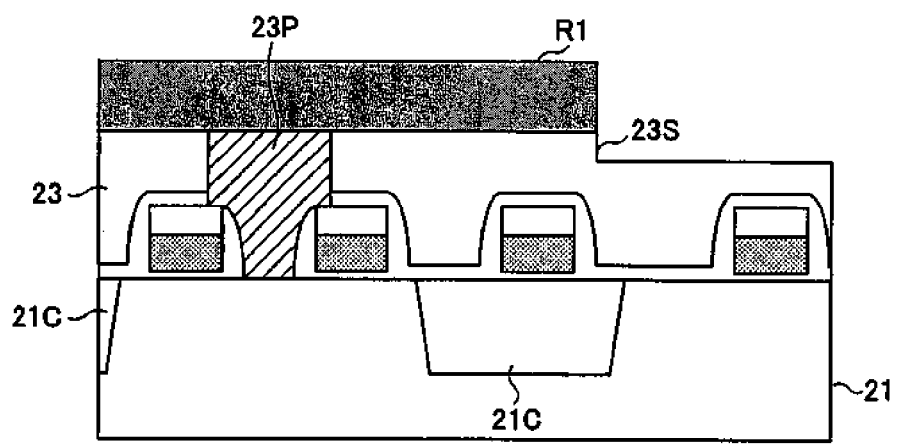

In the next procedure shown in FIG. 40B, with a resist pattern R1 serving as a mask, the interlayer insulating film 23 is partially etched so as to form the step portion 23S.

Figure 40C:
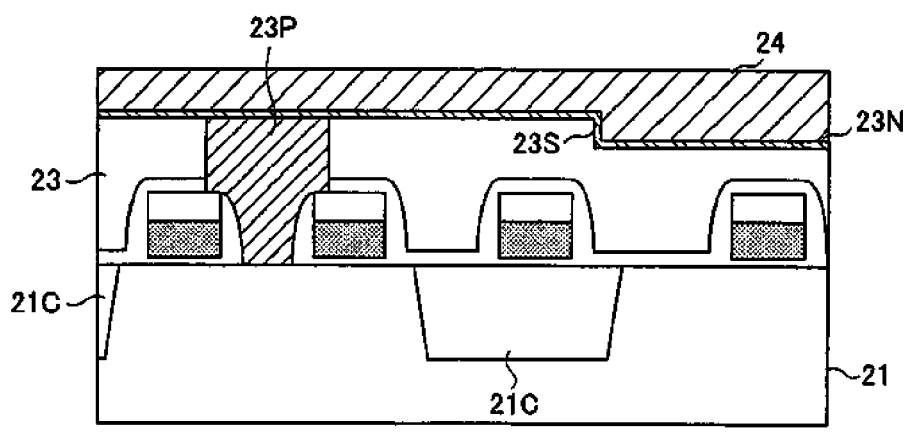

In the procedure shown in FIG. 40C, the SiN film 23N is formed on the interlayer insulating film 23 having the step portion 23S formed therein. After the interlayer insulating film 24 is deposited on the SiN film 23N, the top surface is flattened by the CMP technique.

Figure 40D:
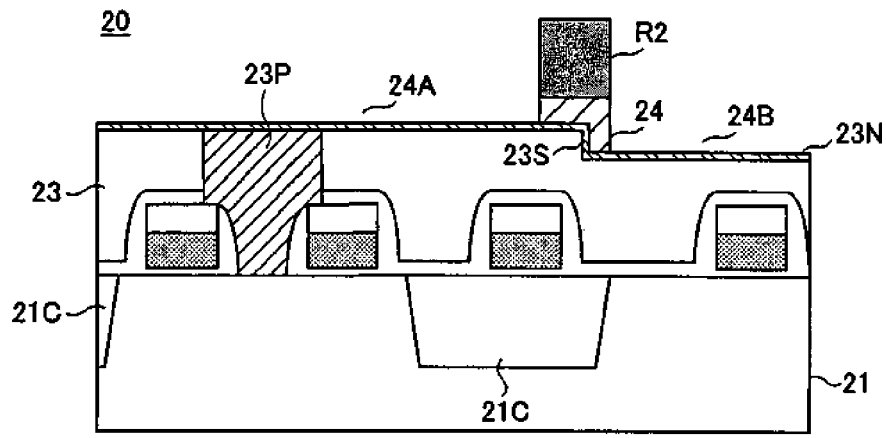

In the next procedure shown in FIG. 40D, with a resist pattern R2 serving as a mask and the SiN film 23N serving as an etching stopper, the interlayer insulating film 24 is dry-etched so as to form the shallow wiring groove 24A corresponding to the first region 21A and the deep wiring groove 24B corresponding to the second region 21B.

Figure 40E:
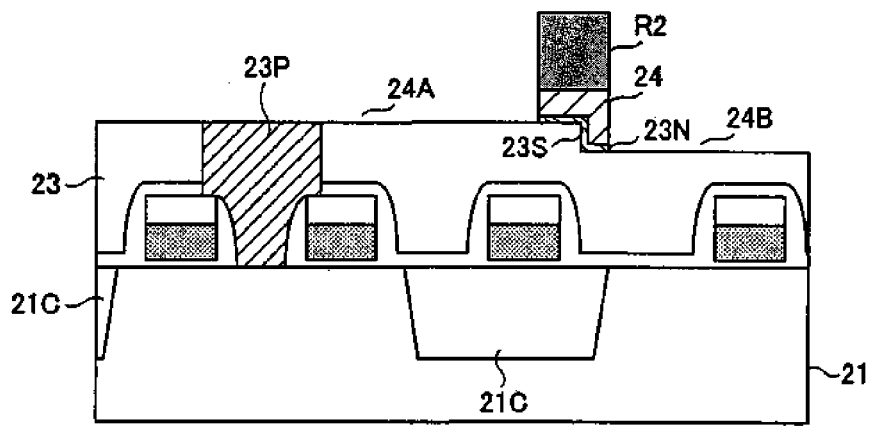

In the procedure shown in FIG. 40E, with the resist pattern R2 serving as a mask, the SiN film 23N is dry-etched so as to expose the upper surfaces of the interlayer insulating film 23 and the polysilicon plug 23P to the bottom of the wiring groove 24A, and the step portion 23S of the interlayer insulating film 23 to the bottom of the wiring groove 24B.

Figure 40F:
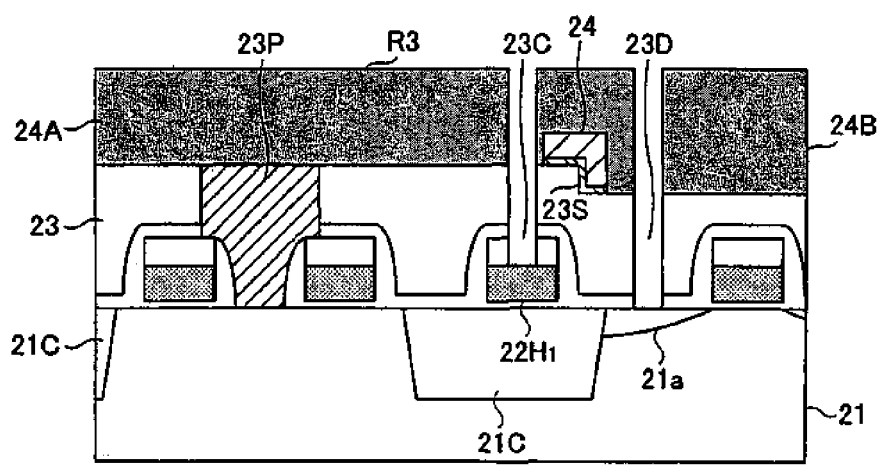

In the procedure shown in FIG. 40F, the resist pattern R2 is removed, and the next resist film is formed on the interlayer insulating film 24 so as to fill the wiring grooves 24A and 24B. The resist film is then patterned by a photolithography technique, so as to form a resist pattern R3. With the resist pattern R3 serving as a mask, the interlayer insulating film 23 exposed through the bottoms of the wiring grooves 24A and 24B is dry-etched. Thus, the contact holes 23C and 23D that expose the conductor pattern $22H_1$ and the diffusion region 21a, respectively, are formed.

Figure 40G:
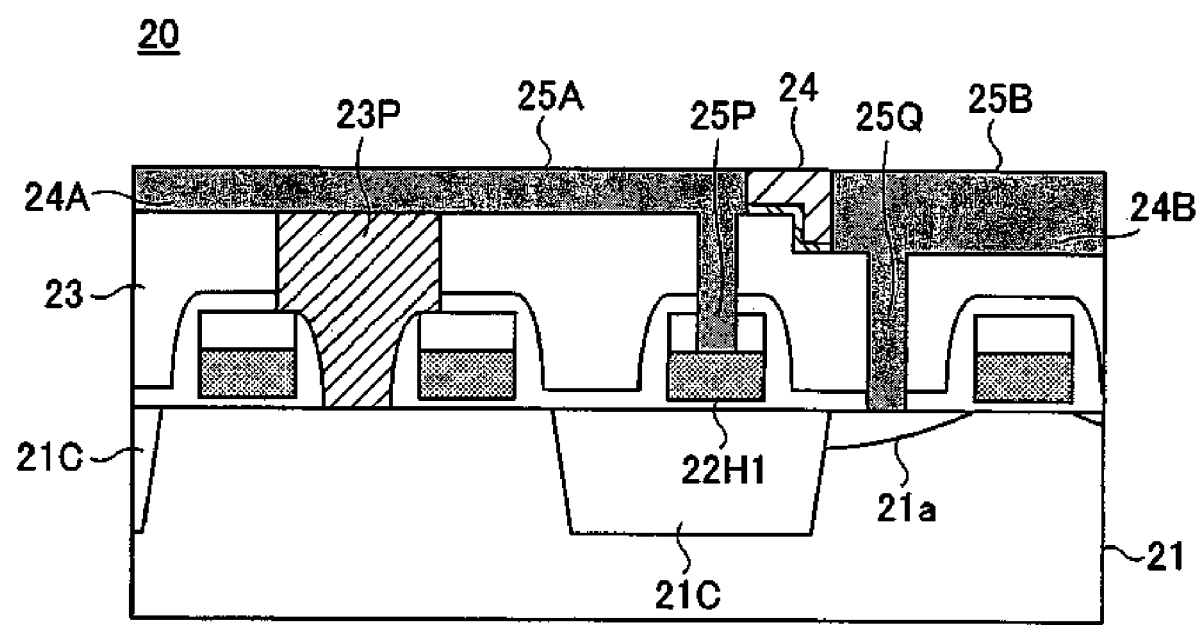

In the procedure shown in FIG. 40G, the resist pattern R3 is removed, and Cu film (not shown) is deposited on the interlayer insulating film 24, so that the wiring grooves 24A and 24B and the contact holes 23C and 23D are filled with the Cu film. Excessive Cu film on the interlayer insulating film 24 is then removed by the CMP technique. As a result, the wiring grooves 24A and 24B are filled with the Cu wiring patterns 25A and 25B, the contact hole 23C is filled with the Cu contact plug 25P that is part of the Cu wiring pattern 25A, and the contact hole 23D is filled with the Cu contact plug 25Q that is part of the Cu wiring pattern 25B. Thus, the structure shown in FIG. 39B is obtained.

As the polysilicon plug 23P is already exposed through the bottom of the wiring groove 24A when the contact holes 23C and 23D are formed in the procedure shown in FIG. 40F in this embodiment, there is no need to form a contact hole for the tall polysilicon plug 23P.

Also, the Cu wiring pattern 25A can be made thin, even though etching is not performed on an existing wiring pattern. Accordingly, the problem of deterioration in the electromigration resistance of the Cu grain boundaries due to selective etching can be avoided.

Fourth Embodiment

Figure 41:
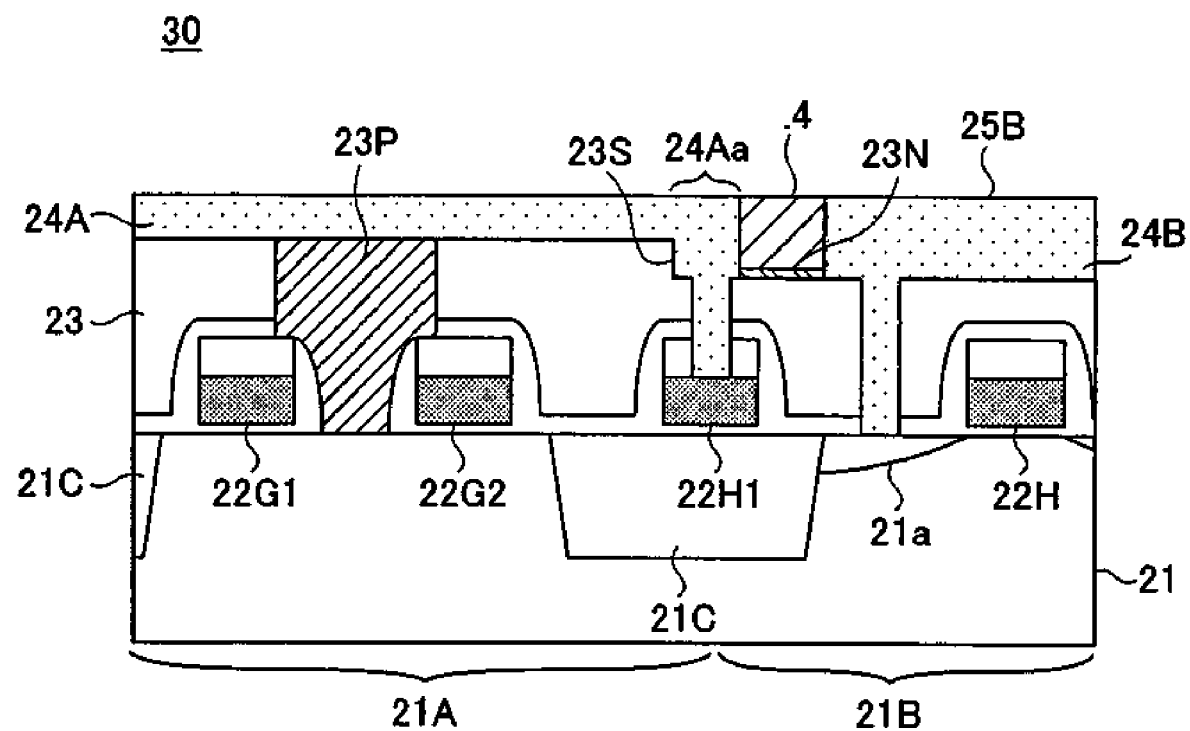
FIG. 41 illustrates the structure of a semiconductor device in accordance with a fourth embodiment of the present invention.

FIG. 41 illustrates the structure of a DRAM integrated circuit device 30 in accordance with a fourth embodiment of the present invention. In FIG. 41, the same components as those of the foregoing embodiments are denoted by the same reference numerals as those of the foregoing drawings, and therefore, explanation of them is omitted herein. In FIG. 41, the memory cell capacitors $MC_1$ and $MC_2$ are not shown either.

As shown in FIG. 41, on the device isolation region 21C, the step portion 23S is located closer to the memory cell region 21A. As a result, a deep portion 24Aa corresponding to the step portion 23S is formed in the wiring groove 24A. Other than that, the structure shown in FIG. 41 is the same as the structure shown in FIG. 40B.

Referring now to FIGS. 42A through 42G, the procedures for producing the DRAM integrated circuit device 30 shown in FIG. 41 are described.

Figure 42A:
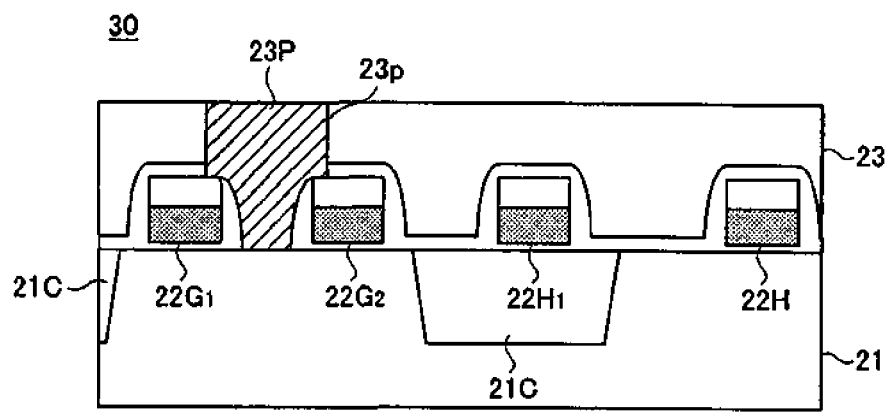
FIGS. 42A through 42G illustrate the procedures for producing the semiconductor device in accordance with the fourth embodiment.

The procedure shown in FIG. 42A is the same as the procedure shown in FIG. 40A. More specifically, the device isolation region 21C, the gate electrodes $22G_1$, $22G_2$, and 22H, and the conductor pattern $22H_1$ are formed on the silicon substrate 21. The gate electrodes $22G_1$, $22G_2$, and 22H, and the conductor pattern $22H_1$ are then covered with the interlayer insulating film 23, and the self-aligned contact hole 23p is formed by a known technique. The self-aligned contact hole 23p is filled with n+-type polysilicon film, and excessive polysilicon film on the interlayer insulating film 23 is then removed by the CMP technique. Thus, the polysilicon plug 23P is formed in the contact hole 23p.

Figure 42B:
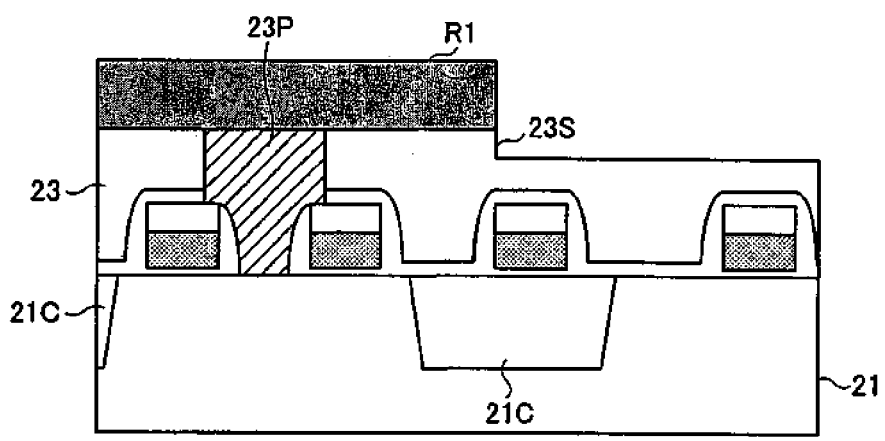

In the next procedure shown in FIG. 42B, with a resist pattern R1 serving as a mask, the step portion 23S is formed in the interlayer insulating film 23 in the same manner as in the procedure shown in FIG. 40B. In this embodiment, however, the step portion 23S on the device isolation region 21C is closer to the first region 21A than to the second region 21B. More specifically, the step portion 23S is located closer to the first region 21A than the conductor pattern $22H_1$ on the device isolation region 21C is.

Figure 42C:
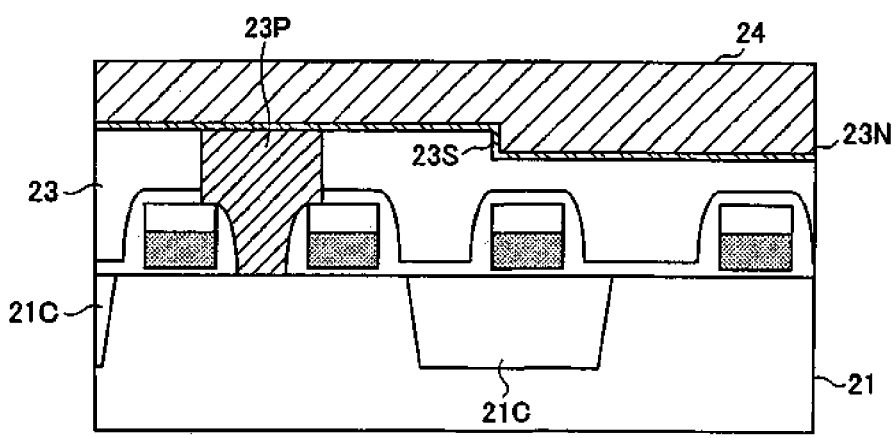

In the procedure shown in FIG. 42C, the SiN film 23N is formed on the interlayer insulating film 23 having the step portion 23S formed therein in the same manner as in the procedure shown in FIG. 40C. After the interlayer insulating film 24 is deposited on the SiN film 23N, the surface of the interlayer insulating film 24 is flattened by the CMP technique.

Figure 42D:
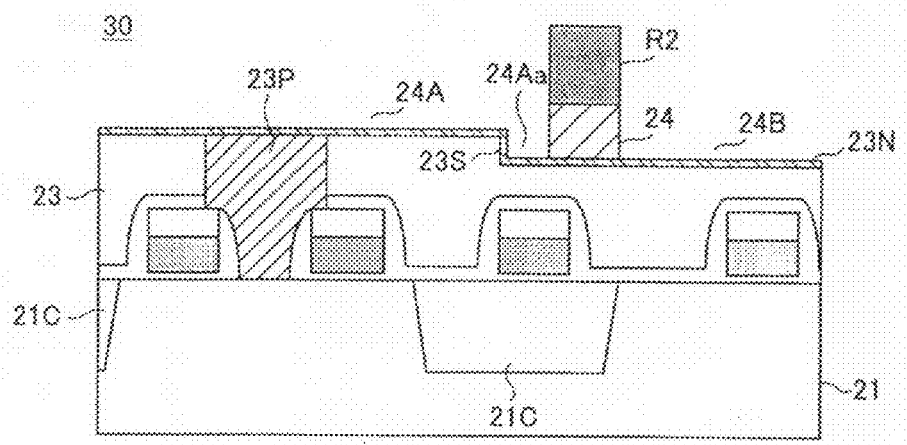

In the next procedure shown in FIG. 42D, with a resist pattern R2 serving as a mask and the SiN film 23N serving as an etching stopper, the interlayer insulating film 24 is dry-etched so as to form the wiring groove 24A corresponding to the first region 21A and the wiring groove 24B corresponding to the second region 21B. Since the step portion 23S is closer to the first region 21A than the resist pattern R2 is in this embodiment, the groove portion 24Aa having the same depth as the wiring groove 24B is formed in the wiring groove 24A.

Figure 42E:
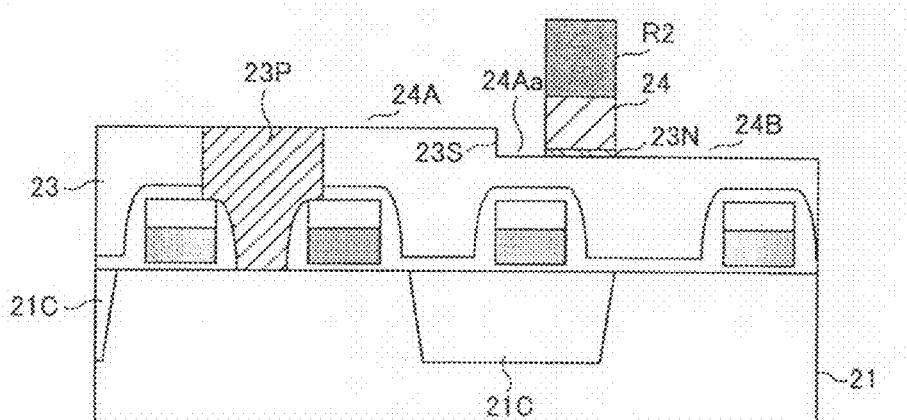

In the next procedure shown in FIG. 42E, with the resist pattern R2 serving as a mask, the SiN film 23N that is exposed through the bottoms of the wiring grooves 24A and 24B and the groove portion 24Aa is dry-etched away. In the procedure shown in FIG. 42F, the resist pattern R2 is removed, and the next resist film is formed on the interlayer insulating film 24 so as to fill the wiring grooves 24A and 24B and the groove portion 24Aa.

The resist film is then patterned by a photolithography technique, so as to form resist windows corresponding to the contact holes 23C and 23D, thereby producing a resist pattern R3. With the resist pattern R3 serving as a mask, the interlayer insulating film 23 is patterned so that the contact holes 23C and 23D are formed in the interlayer insulating film 23.

Figure 42F:
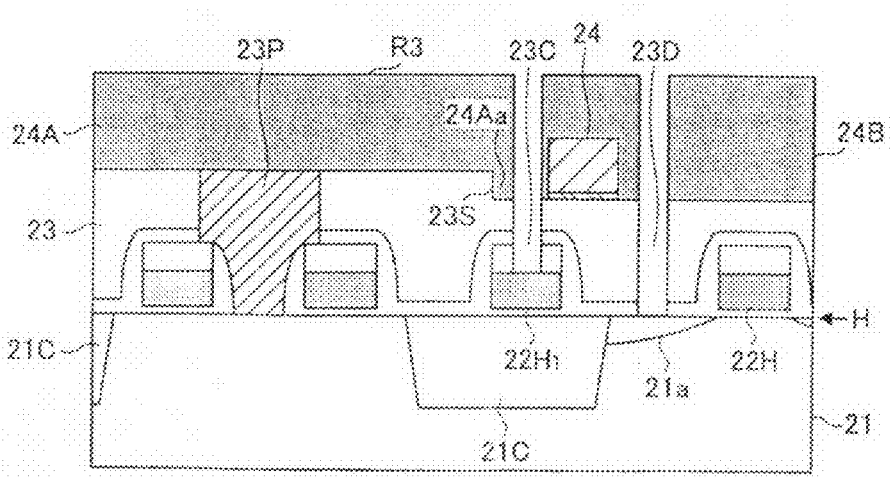
Figure 42G:
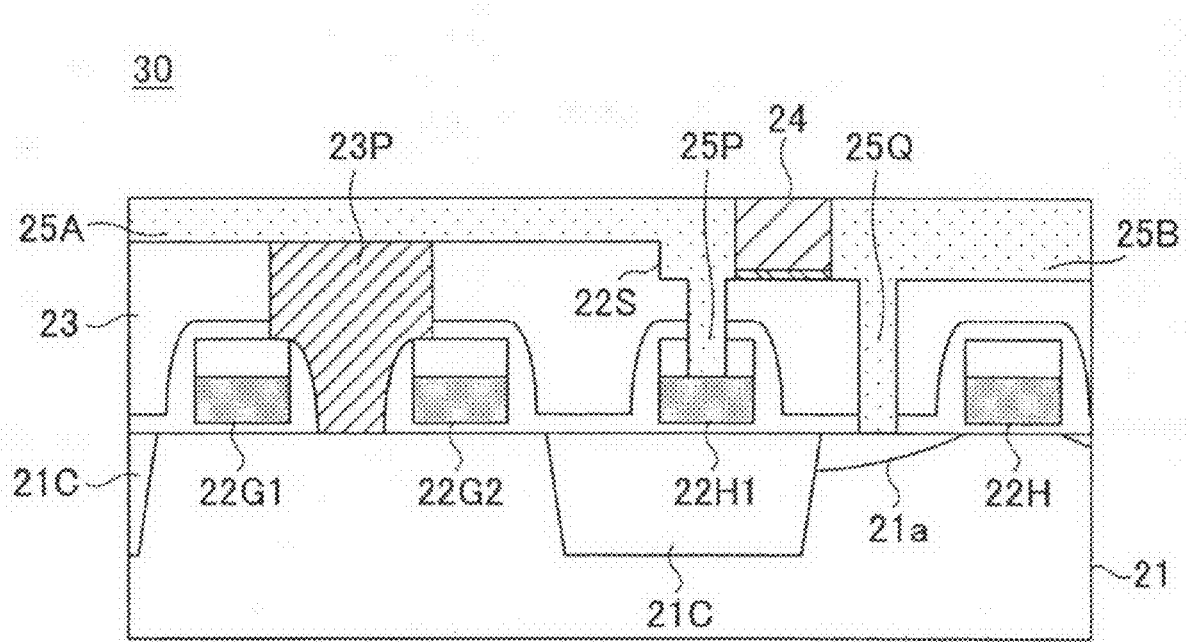

In the procedure shown in FIG. 42G, the resist pattern R3 is removed, and the wiring grooves 24A and 24B and the groove portion 24Aa is filled with Cu film (not shown). Excessive Cu film on the interlayer insulating film 24 is then removed by the CMP technique. Thus, a structure equivalent to the DRAM integrated circuit device 30 shown in FIG. 41 is obtained.

In this embodiment, when the contact holes 23C and 23D are formed in the interlayer insulating film 23 by the photolithography technique in the procedure shown in FIG. 42F, the formation of these contact holes can be performed on the same plane H. Accordingly, the problem with the depth of focus due to the step portion 23S can be completely avoided, even though the step portion 23S exits in the interlayer insulating film 23. Thus, a photolithography technique utilizing a high-resolution optical system with a great numerical aperture and a small depth of focus can be employed to form the very small contact holes 23C and 23D.

Fifth Embodiment

Figure 43A:
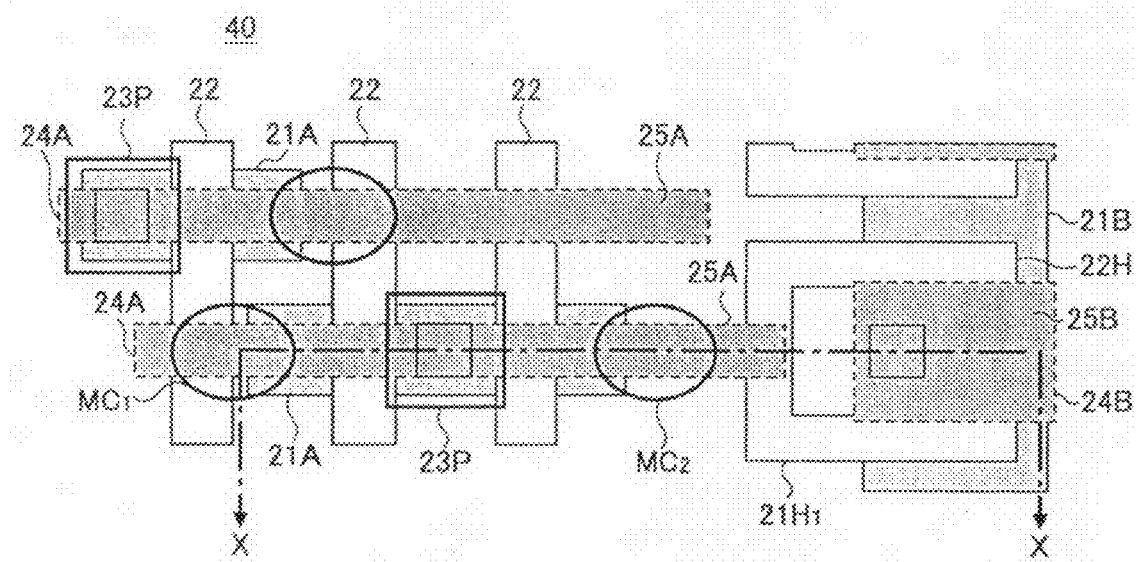
FIGS. 43A and 43B illustrate the structure of a semiconductor device in accordance with a fifth embodiment of the present invention.
Figure 43B:
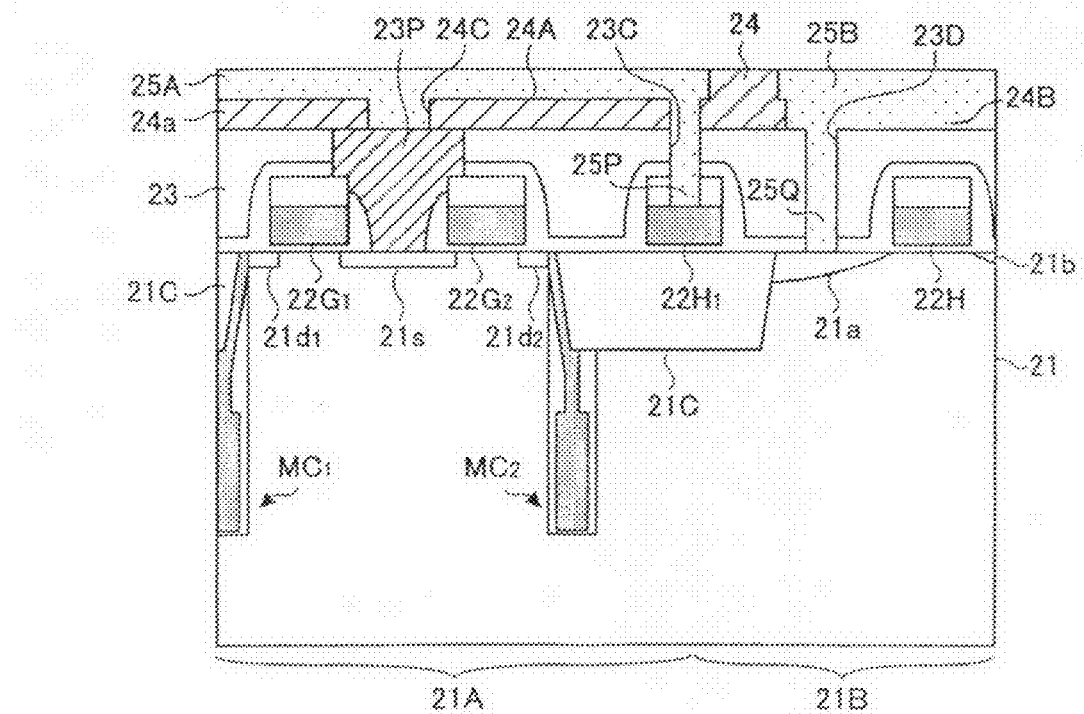

FIGS. 43A and 43B illustrate the structure of a DRAM integrated circuit device 40 in accordance with a fifth embodiment of the present invention. In FIGS. 43A and 43B, the same components as those of the foregoing embodiments are denoted by the same reference numerals as those of the foregoing drawings, and therefore, explanation of them is omitted herein.

As shown in FIGS. 43A and 43B, the DRAM integrated circuit device 40 has the same structure as the above described DRAM integrated circuit device 20, except that the interlayer insulating film 24 is not etched to expose the interlayer insulating film 23 and the bottom portion 24a of the interlayer insulating film 24 is left on the interlayer insulating film 23. Therefore, the wiring pattern 25A to fill the wiring groove 24A is brought into contact with the polysilicon plug 23P via a contact hole 24C formed in the bottom portion 24a.

The wiring groove 24B, on the other hand, is designed to expose the surface of the interlayer insulating film 23. Therefore, the bottom of the wiring groove 24B is lower than the bottom of the wiring groove 24A by the thickness of the bottom portion 24a of the interlayer insulating film 24.

In this structure, even if the interlayer insulating film 23 is relatively thin and the polysilicon plug 23P is relatively short accordingly, the height of the wiring pattern 25A to be formed in the wiring groove 24A is lowered to reduce the parasitic capacitance of the wiring pattern 25A. At the same time, the height of the wiring pattern 25B to be formed in the wiring groove 24B is increased to reduce the resistance of the wiring pattern 25B.

Referring now to FIGS. 44A through 44D, the procedures for producing the DRAM integrated circuit device 40 shown in FIGS. 43A and 43B are described. In FIGS. 44A through 44D, the memory cell capacitors $MC_1$ and $MC_2$ are not shown.

Figure 44A:
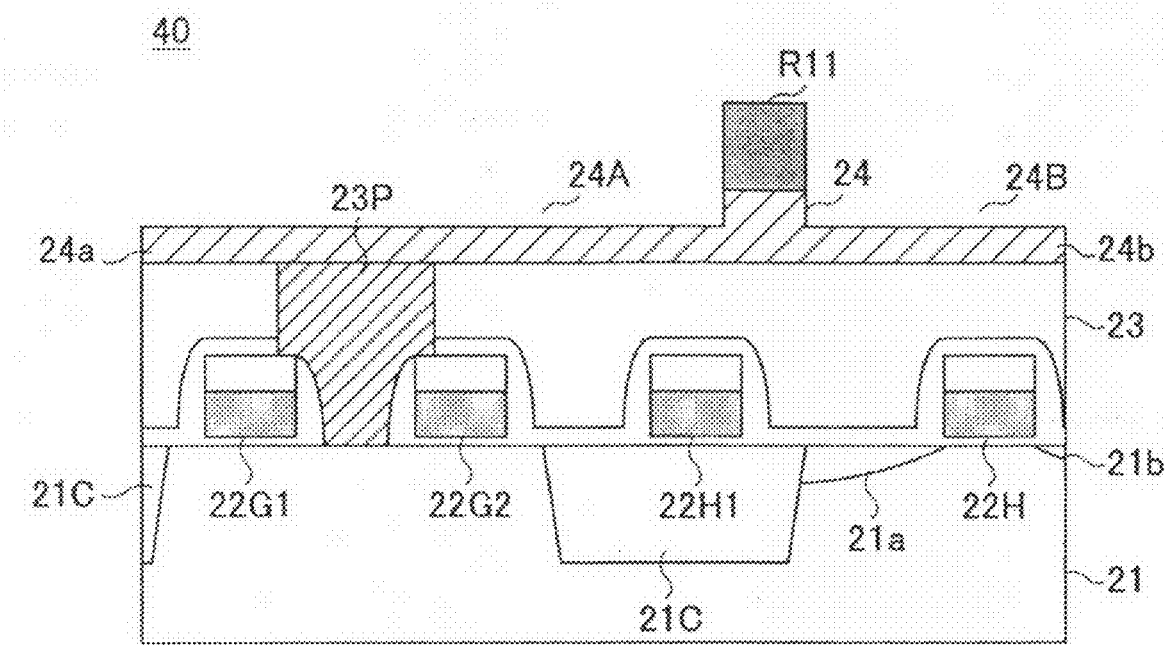
FIGS. 44A through 44D illustrate the procedures for producing the semiconductor device in accordance with the fifth embodiment.

In this embodiment, after the procedure shown in FIG. 40A is carried out, the interlayer insulating film 24 is formed on the interlayer insulating film 23 in the procedure shown in FIG. 44A. With a resist pattern R11 serving as a mask, the interlayer insulating film 24 is dry-etched in the first region 21A so that the bottom portion 24a is left on the interlayer insulating film 23. Thus, the wiring groove 24A is formed in the interlayer insulating film 24. As can be seen from FIG. 44A, the dry-etching is performed to leave the bottom portion 24a at the bottom of the wiring groove 24A. In this dry-etching procedure, the interlayer insulating film 24 is also etched in the second region 21B, so as to form the wiring groove 24B. In the situation shown in FIG. 44A, an insulating film 24b with the same thickness as the bottom portion 24a exists as part of the interlayer insulating film 24 at the bottom of the wiring groove 24B.

Figure 44B:
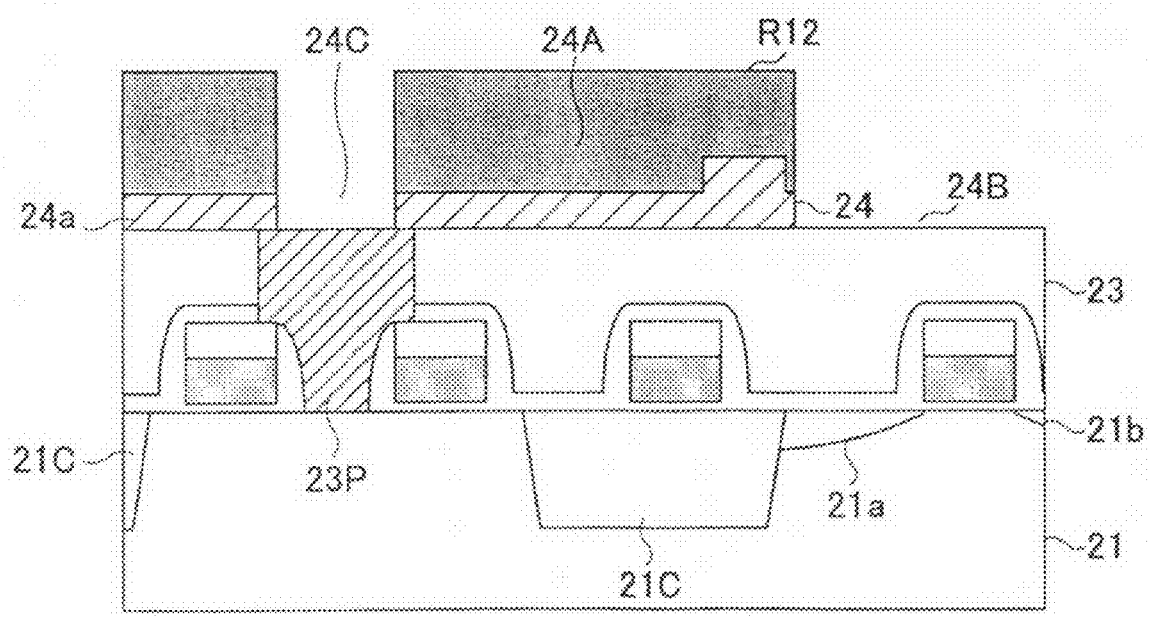

In the next procedure shown in FIG. 44B, the resist pattern R11 is removed, and another resist pattern R12 is formed. With the resist pattern R12, the contact hole 24C to expose the polysilicon plug 23P is formed on the bottom of the wiring groove 24A. The contact hole 24C extends through the bottom portion 24a. At the same time, the bottom portion 24b of the wiring groove 24B is dry-etched to expose the interlayer insulating film 23 to the bottom of the wiring groove 24B.

Figure 44C:
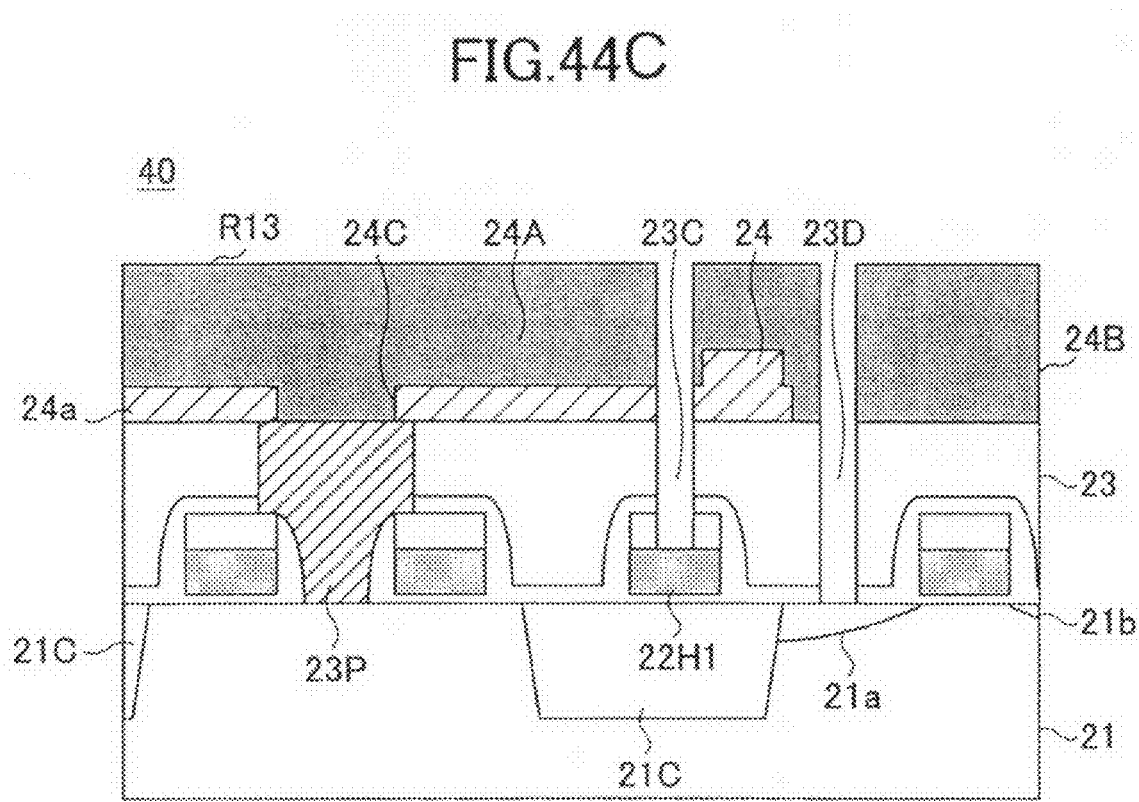

In the next procedure shown in FIG. 44C, the resist pattern R12 is removed, and another resist film is formed to fill the wiring grooves 24A and 24B and the contact hole 24C. The resist film is then exposed and developed, so as to form a resist pattern R13 that has resist windows corresponding to the conductor pattern $22H_1$ and the diffusion region 21a. In the procedure shown in FIG. 44C, with the resist pattern R13 serving as a mask, the interlayer insulating films 24a and 23 are patterned to form the contact hole 23C that exposes the conductor pattern $22H_1$ and the contact hole 23D that exposes the diffusion region 21a.

Figure 44D:
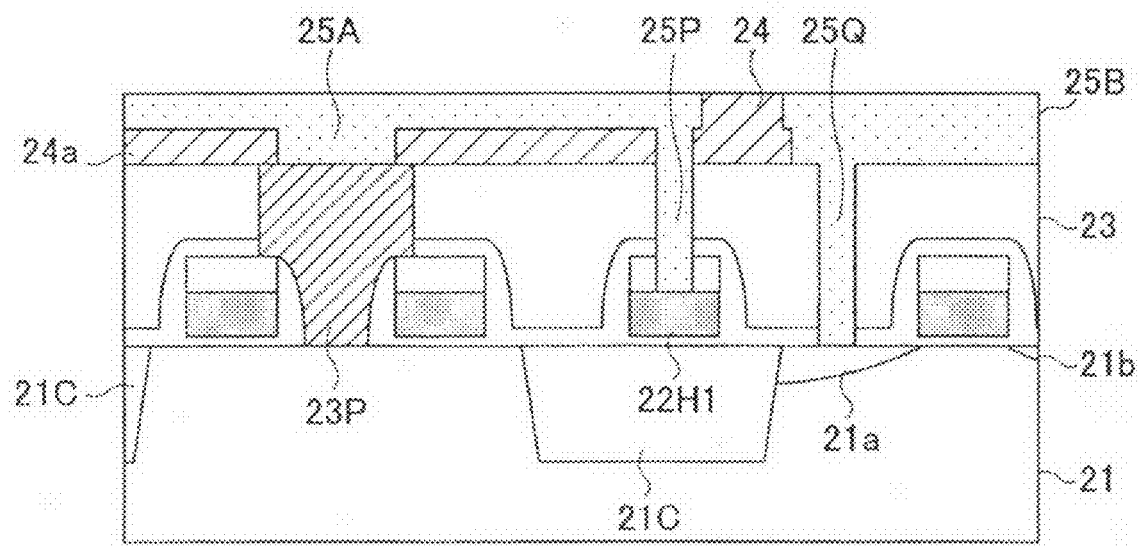

In the procedure shown in FIG. 44D, the resist pattern R13 is removed, and the wiring grooves 24A and 24B and the contact holes 23C, 23D and 24D are filled with Cu film. Excessive Cu film on the interlayer insulating film 24 is then removed. As a result, the Cu wiring pattern 25A is brought into contact with the polysilicon plug 23P via the contact hole 24C in the wiring groove 24A, and part of the wiring pattern 25A fills part of the contact hole 23C so as to form the contact plug 25P. Also, part of the Cu wiring pattern 25B in the wiring groove 24B fills the contact hole 23D, so as to form the contact plug 25Q.

In this embodiment, the contact hole 24C on the polysilicon plug 23P is produced in a different procedure from the procedure for forming the contact holes 23C and 23D. Accordingly, the polysilicon plug does not suffer any excessive etching to form contact holes and no damage is caused.

As described above, the difference in depth between the wiring grooves 24A and 24B is realized by the insulating film 24a that forms the bottom of the wiring groove 24A in this embodiment. By increasing the film thickness of the insulating film 24a, a sufficient difference in depth can be maintained between the wiring grooves 24A and 24B even if the height of the polysilicon plug 23P is relatively small.

Sixth Embodiment

FIGS. 45A through 45D illustrate the procedures for producing a DRAM integrated circuit device 50 in accordance with a sixth embodiment of the present invention. In FIGS. 45A through 45D, the same components as those of the foregoing embodiments are denoted by the same reference numerals as those of the foregoing drawings, and therefore, explanation of them is omitted herein. In this embodiment, explanation of the memory cell capacitors $MC_1$ and $MC_2$ is also omitted.

Figure 45A:
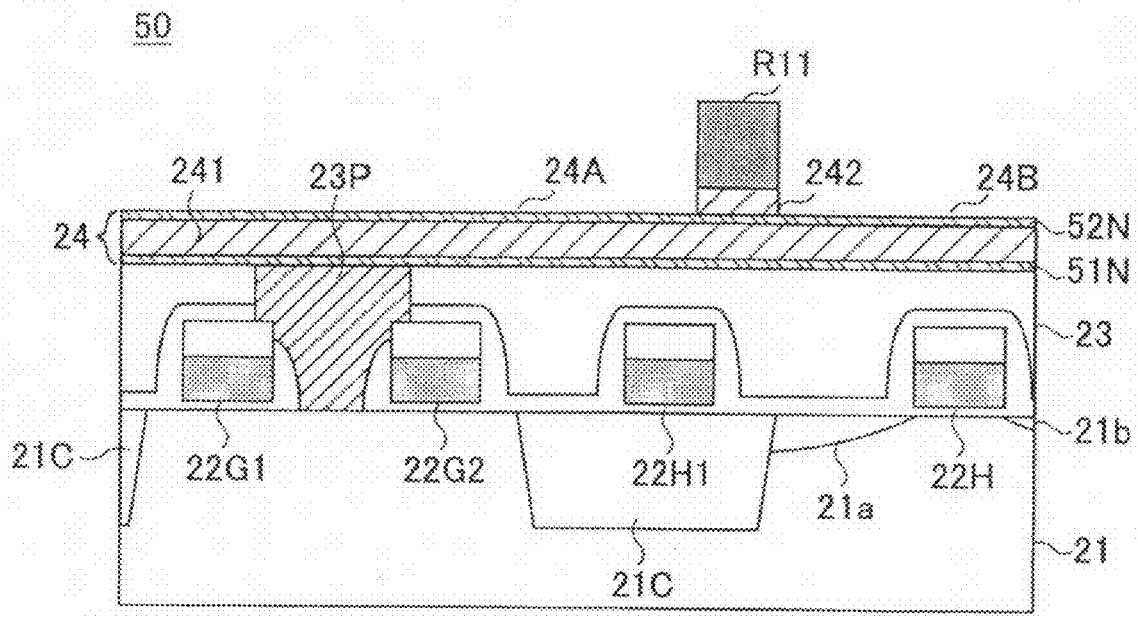
FIGS. 45A through 45D illustrate the procedures for producing a semiconductor device in accordance with a sixth embodiment of the present invention.

The procedure shown in FIG. 45A is equivalent to the procedure shown in FIG. 44A. In this embodiment, however, a SiN film 51N is interposed between the interlayer insulating films 23 and 24, and the interlayer insulating film 24 is formed with a laminated structure of insulating films $24_1$ and $24_2$ having a SiN film 52N interposed in between.

In the procedure shown in FIG. 45A, with the SiN film 52N serving as an etching stopper, the insulating film $24_2$ of the interlayer insulating film 24 is dry-etched, and the wiring groove 24A corresponding to the memory cell region 21A has the same depth as the wiring groove 24B corresponding to the peripheral circuit region 21B.

Figure 45B:
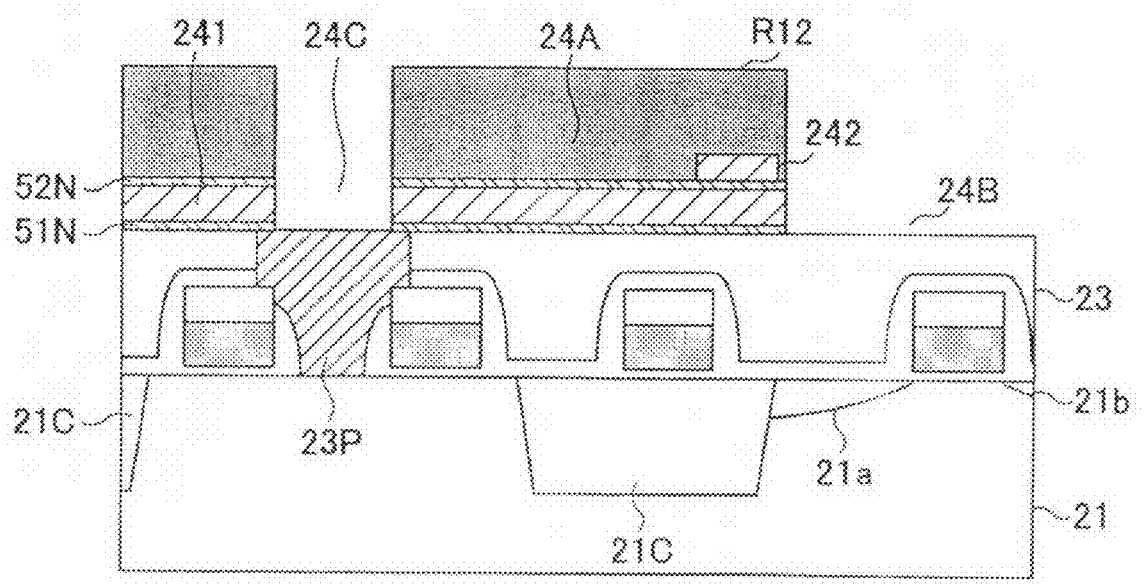

In the next procedure shown in FIG. 45B, the resist pattern R11 is removed in the same manner as in the procedure shown in FIG. 44B. With the resist pattern R12 serving as a mask, the SiN film 52N, the interlayer insulating film $24_1$, and the SiN film 51N are dry-etched in that order, so that an opening 24C to expose the polysilicon plug 23P is formed at the bottom of the wiring groove 24A. At the same time, the wiring groove 24B is further etched, so that the surface of the interlayer insulating film 23 is exposed through the bottom of the wiring groove 24B.

Figure 45C:
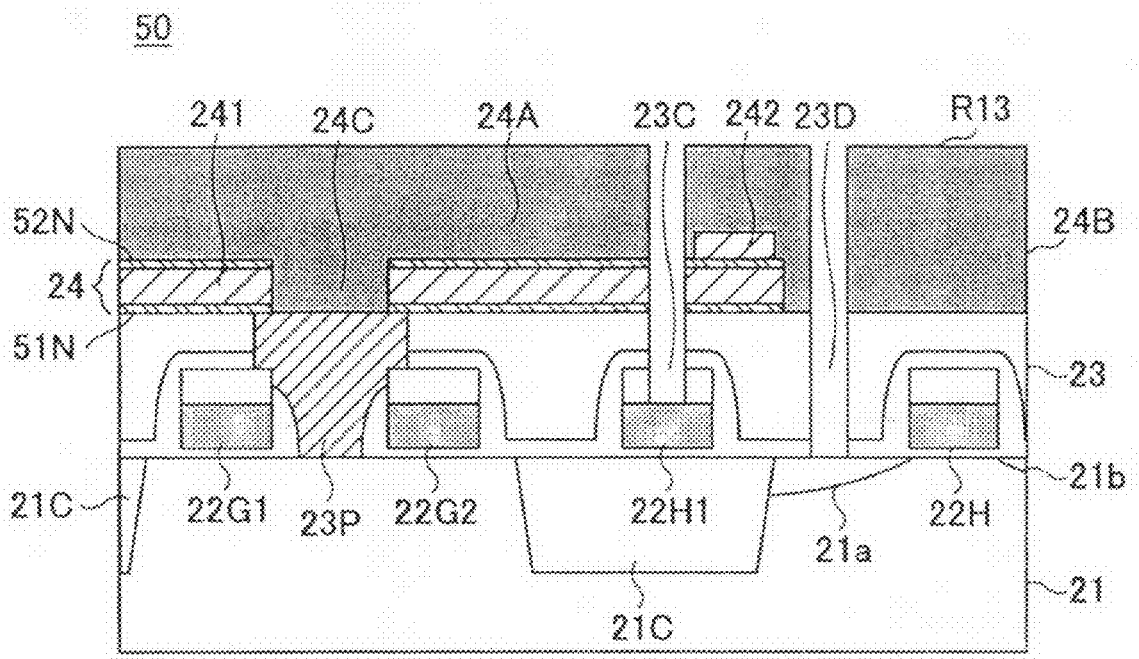
Figure 45D:
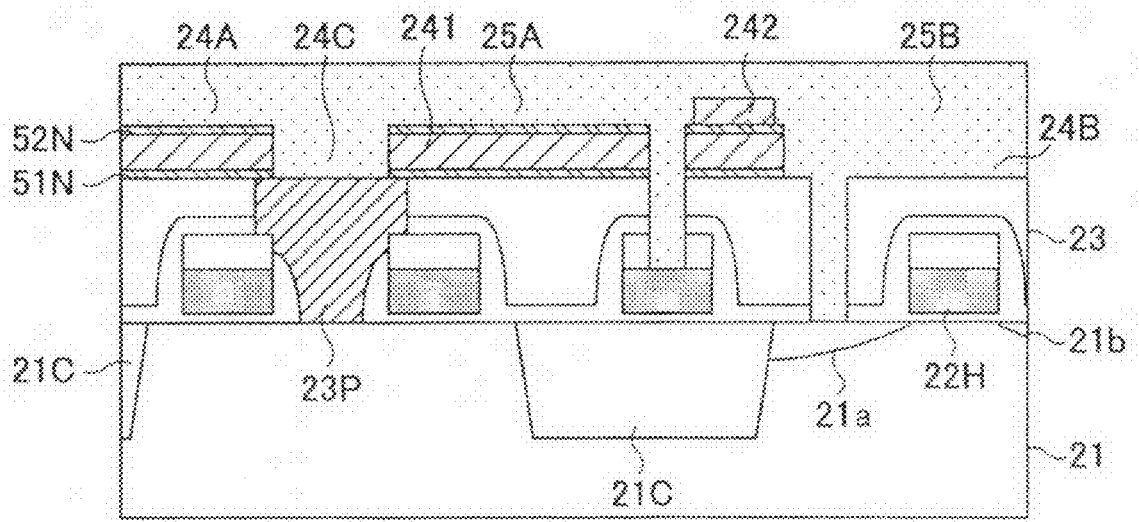

In the procedure shown in FIG. 45C, the contact holes 23C and 23D are formed with the resist pattern R13 in the same manner as in the procedure shown in FIG. 44C. In the procedure shown in FIG. 45D, the Cu wiring pattern 25A is formed to fill the wiring groove 24A and the contact holes 23C and 24C, and the Cu wiring pattern 25B is formed to fill the wiring groove 24B and the contact hole 23D in the same manner as in the procedure shown in FIG. 44D.

In this embodiment, the SiN films 52N and 51N function as etching stopper films when the wiring grooves 24A and 24B are formed, and the depths of the wiring grooves 24A and 24B can be accurately adjusted, regardless of processing time.

Seventh Embodiment

FIGS. 46A through 46E illustrate the procedures for producing a DRAM integrated circuit device 60 in accordance with a seventh embodiment of the present invention. In FIGS. 46A through 46E, the same components as those of the foregoing embodiments are denoted by the same reference numerals as those of the foregoing drawings, and therefore, explanation of them is omitted herein. In this embodiment, explanation of the memory cell capacitors $MC_1$ and $MC_2$ is also omitted.

Figure 46A:
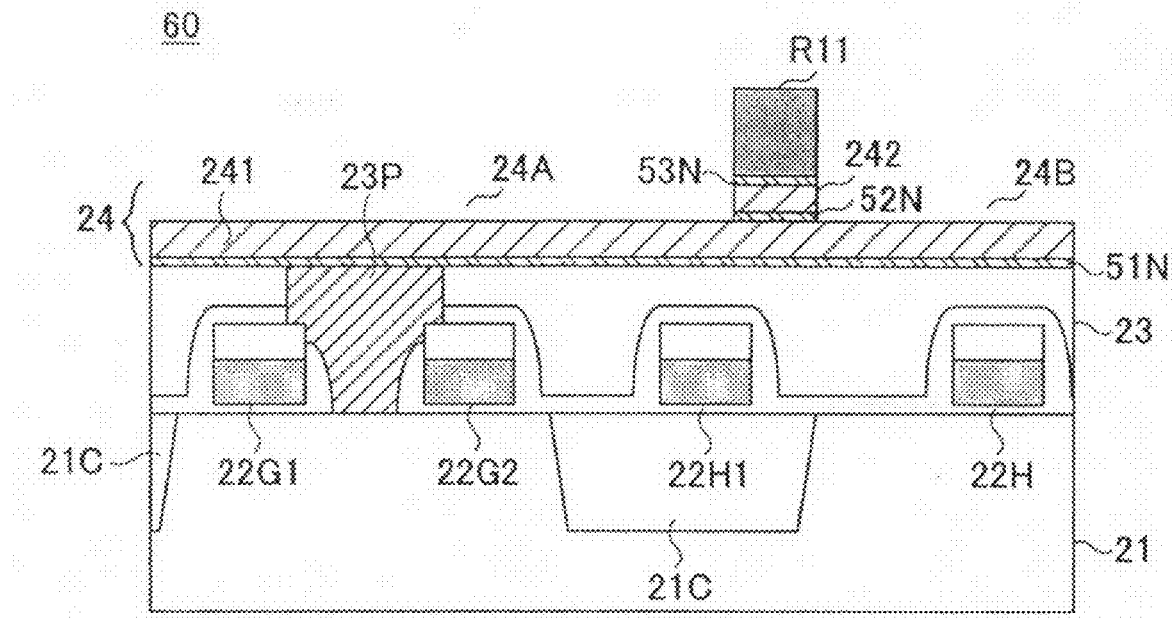
FIGS. 46A through 46E illustrate the procedures for producing a semiconductor device in accordance with a seventh embodiment of the present invention.

The procedure shown in FIG. 46A is equivalent to the procedure shown in FIG. 45A. In this embodiment, however, another insulating film 53B is formed on the insulating film $24_2$.

As in the procedure shown in FIG. 45A, in the procedure shown in FIG. 46A, the wiring grooves 24A and 24B with the same depths are formed, with the SiN film 52N serving as an etching stopper. In the procedure shown in FIG. 46B, with a resist pattern R22 (described later) serving as a mask, the contact hole 24C is formed in the insulating film $24_1$, so as to expose the SiN film 51N.

Figure 46B:
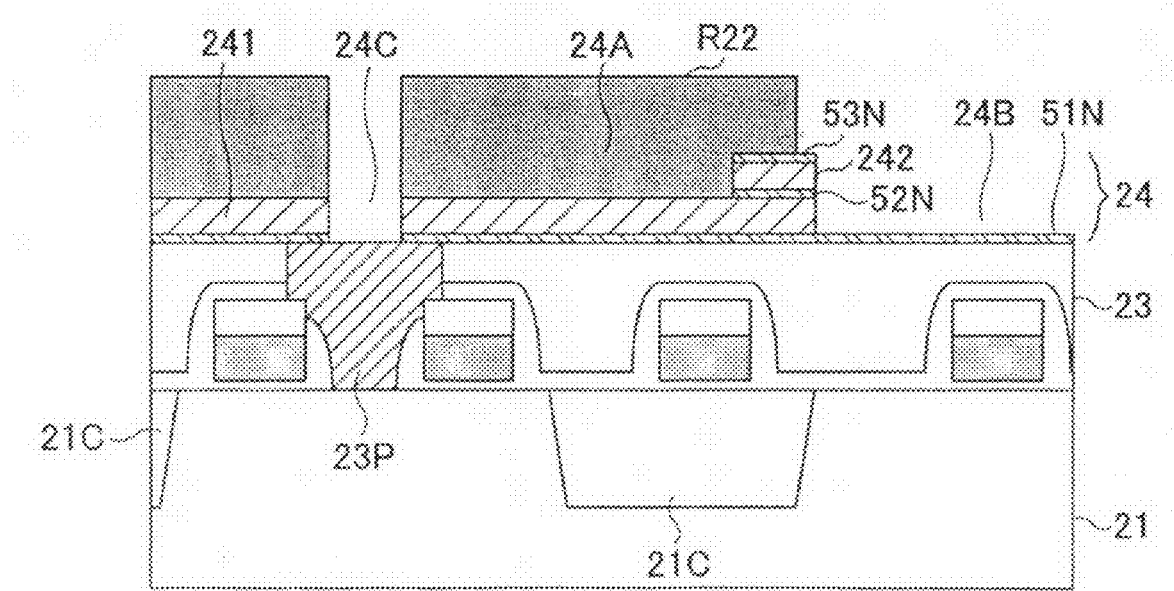

In the procedure shown in FIG. 46B, the resist pattern R22 is formed between the wiring grooves 24A and 24B, and partially exposes the insulating film $24_2$ covered with the SiN film 53N. At the same time as the formation of the contact hole 24C, the insulating film $24_1$ in the wiring groove 24B is etched in a self-aligning manner, with the SiN film 53N serving as a hard mask. As a result, the SiN film 51N is exposed as an etching stopper film.

Figure 46C:
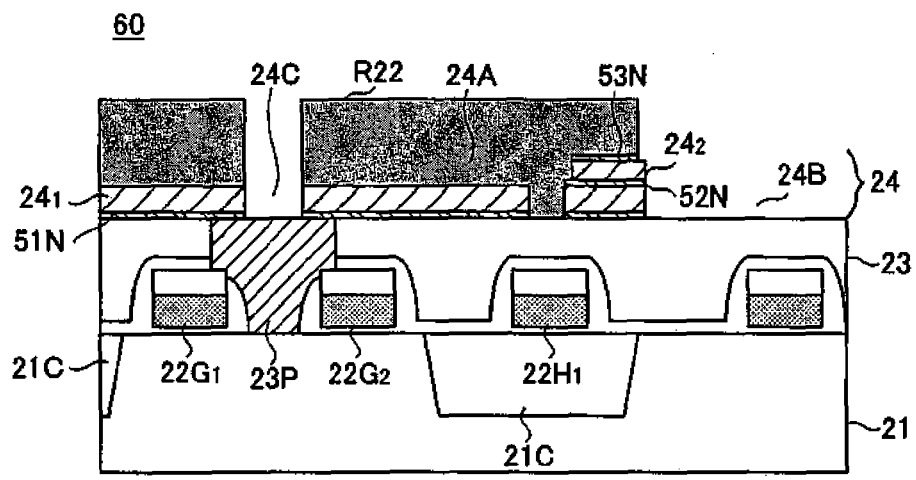

In the next procedure shown in FIG. 46C, the SiN film 51N exposed through the bottom of the contact hole 24C and the bottom of the wiring groove 24B is removed through an etching process using the resist pattern R22 as a mask.

Figure 46D:
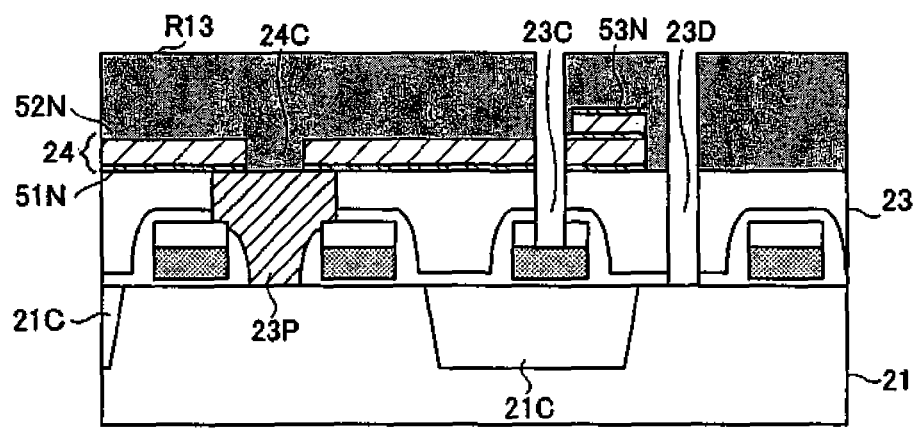
Figure 46E:
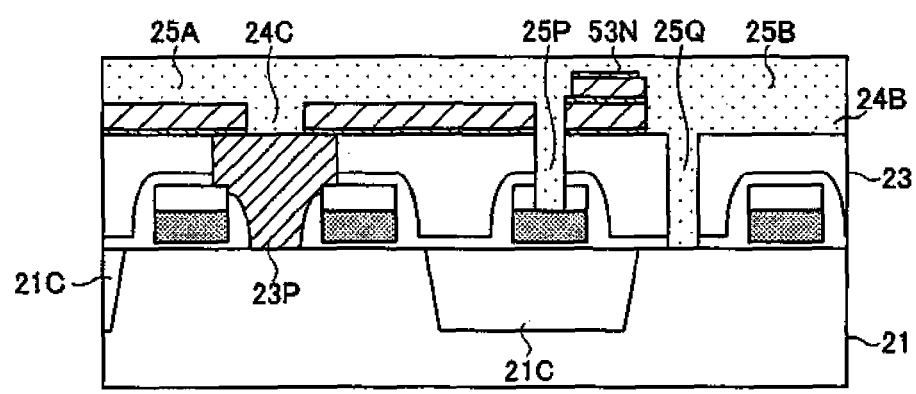

In the procedure shown in FIG. 46D, the contact holes 23C and 23D are formed in accordance with the resultant structure of the procedure shown in FIG. 46, with the resist pattern R13 serving as a mask. In the procedure shown in FIG. 46E, the resist pattern R13 is removed. The wiring grooves 24A and 24B, the contact holes 23C, 23D, and 24C are filled with Cu film. Excessive Cu film is then removed by the CMP technique. As a result, the Cu wiring pattern 25A that fills the contact hole 24C is formed in the wiring groove 24A, and the Cu wiring pattern 25B that fills the contact holes 23C and 23D and includes the contact plugs 25P and 25Q is formed in the wiring groove 24B.

Figure 47A:
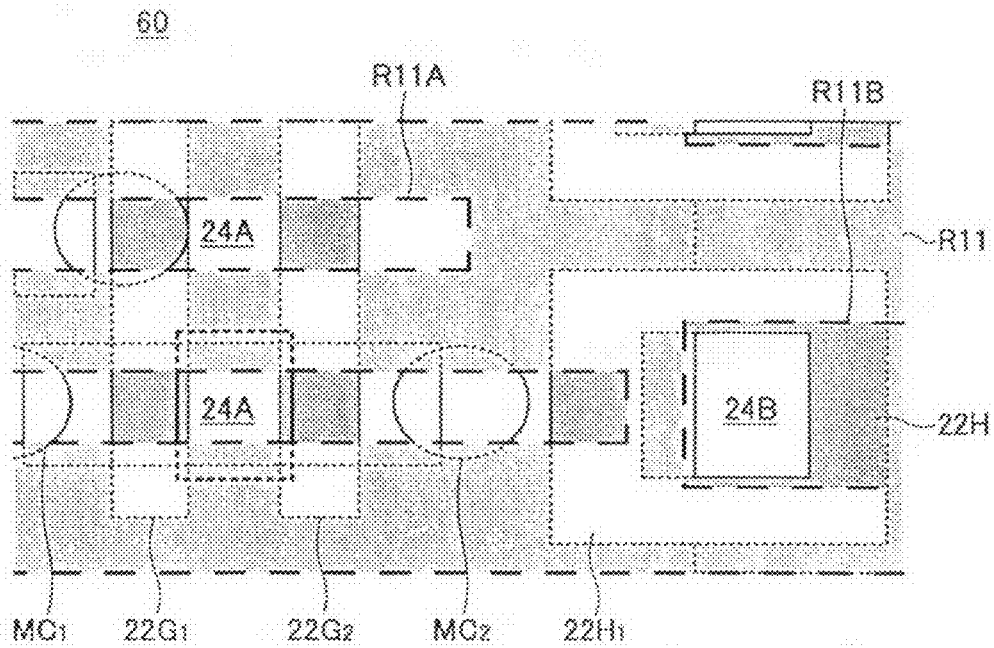
FIGS. 47A and 47B illustrate the structure of a semiconductor device in accordance with an eighth embodiment of the present invention.
Figure 47B:
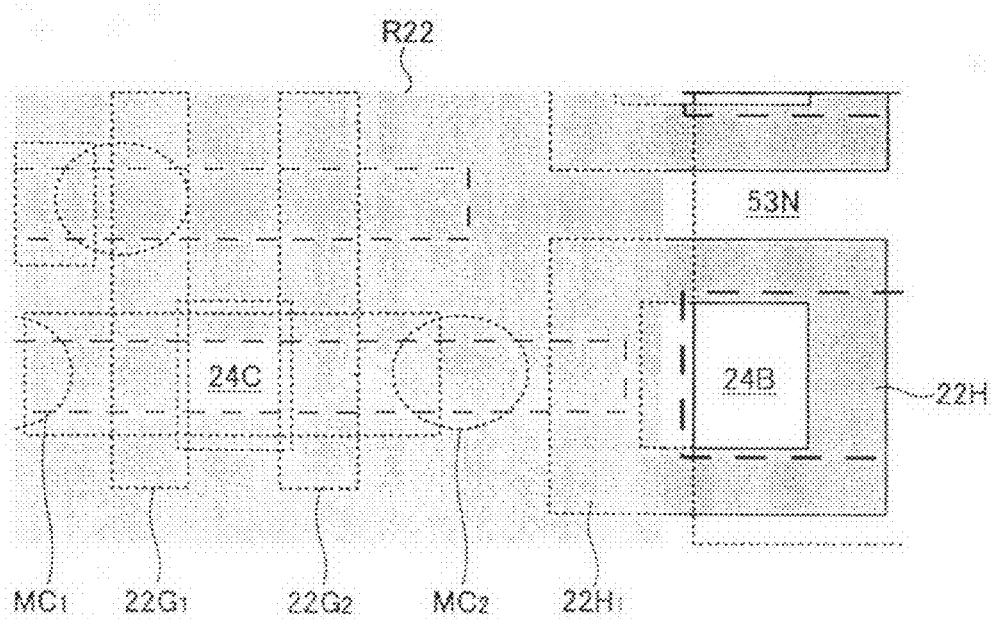

FIG. 47A is a plan view of the resist pattern R11 used in the procedure shown in FIG. 46A. FIG. 47B is a plan view of the resist pattern R22 used in the procedures shown in FIGS. 46B and 46C.

As shown in FIG. 47A, the resist pattern R11 includes a resist window R11A corresponding to the wiring groove 24A and a resist window R11B corresponding to the wiring groove 24B. In the procedure shown in FIG. 46A, openings corresponding to the shapes of the wiring grooves 24A and 24B are formed in the SiN film 53N formed on the interlayer insulating film $24_2$.

Meanwhile, as shown in FIG. 47B, the resist pattern R22 covers the memory cell region 21A and the device isolation region 21C, but does not cover the peripheral circuit region 21B. Also, the resist pattern R22 includes only a resist window corresponding to the contact hole 24C.

In the peripheral circuit region 21B, the insulating film $24_2$ is covered with the SiN film 53N having the opening corresponding to the wiring groove 24B. Accordingly, when the dry-etching procedures shown in FIGS. 46B and 46C are carried out in such a situation, the SiN film 53N functions as a hard mask, and only the region corresponding to the wiring groove 24B is etched.

In this embodiment, the resist pattern R22 formed in the peripheral circuit region 21B and used in the procedures shown in FIGS. 46B and 46C is not necessarily formed in conformity with the resist pattern R11 used in the previous procedure. Accordingly, the process for producing a semiconductor device can be greatly simplified.

Eighth Embodiment

FIGS. 48A through 48D illustrate the procedures for producing a DRAM integrated circuit device 50 in accordance with an eighth embodiment of the present invention. In FIGS. 48A through 48D, the same components as those of the foregoing embodiments are denoted by the same reference numerals as those of the foregoing drawings, and therefore, explanation of them is omitted herein.

Figure 48A:
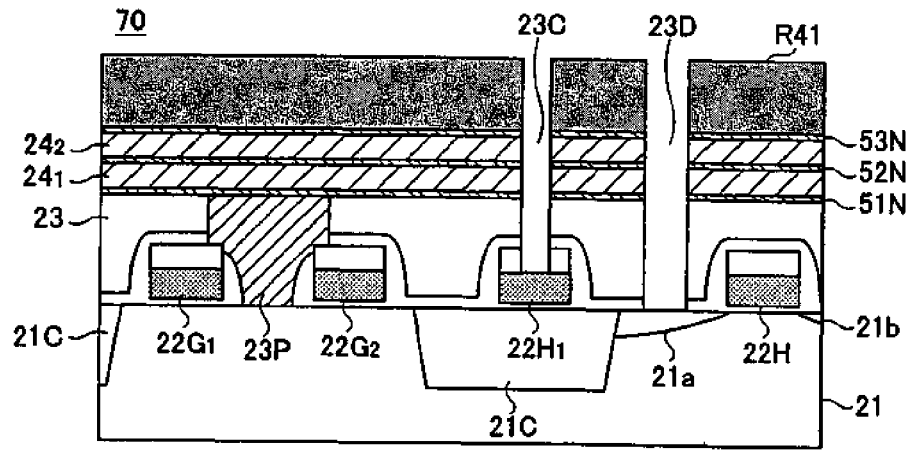
FIGS. 48A through 48D illustrate the procedures for producing the semiconductor device in accordance with the eighth embodiment.

As shown in FIG. 48A, the SiN film 51N, the insulating film 24₁, the SiN film 52N, the insulating film 24₂, and the SiN film 53N are stacked on the structure shown in FIG. 42A in that order. A resist pattern R41 is further formed on the SiN film 53N. The resist pattern R41 has resist windows corresponding to the conductor pattern 22H₁ and the diffusion region 21a. With the resist pattern R41 serving as a mask, the SiN film 53N, the insulating film 24₂, the SiN film 52N, the insulating film 24₁, the SiN film 51N, and the interlayer insulating film 23 are etched in that order. As a result, the contact hole 23C that exposes the conductor pattern 22H₁, and the contact hole 23D that exposes the diffusion region 21a are formed in the interlayer insulating film 23.

Figure 48B:
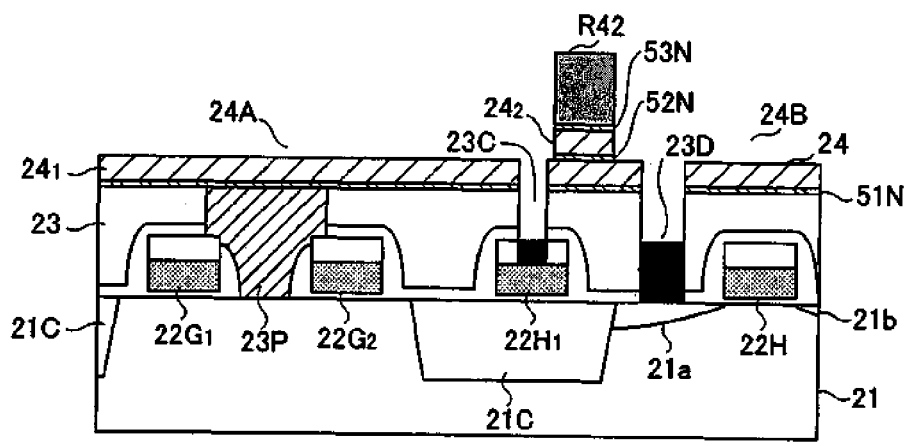

In the next procedure shown in FIG. 48B, the resist film R41 is removed, and a resist pattern R42 is formed on the SiN film 53N having the contact holes 23C and 23D formed therein. The resist pattern R42 has resist windows corresponding to the wiring grooves 24A and 24B. With the resist pattern R42 serving as a mask, the SiN film 52N and the insulating film 24₁ are patterned. As a result, the wiring groove 24A corresponding to the memory cell region 21A, and the wiring groove 24B corresponding to the peripheral circuit region 21B are formed. In the procedure shown in FIG. 48B, the SiN film 53N at the bottoms of the wiring grooves 24A and 24B is removed by an etching process also using the resist pattern R42 as a mask. In the procedure shown in FIG. 48B and the procedure shown in FIG. 48C, the contact holes 23C and 23D are filled with resin film, so as to protect the conductor pattern 22H₁ and the diffusion region 21a exposed through the contact holes 23C and 23D.

Figure 48C:
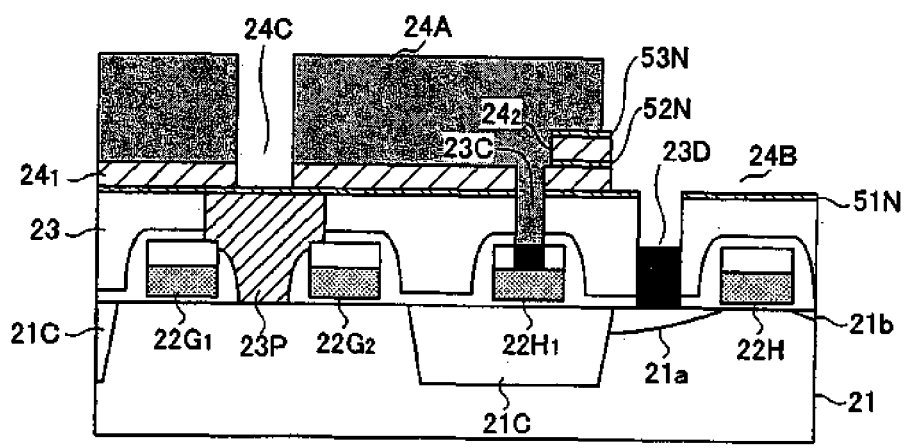

In the next procedure shown in FIG. 48C, the resist pattern R42 is removed, and a resist pattern R43 corresponding to the resist pattern R22 used in the procedure shown in FIG. 47B is formed to fill the wiring groove 24A.

In the procedure shown in FIG. 48C, the insulating film 24₁ is dry-etched via the resist window formed in the resist pattern R43, until the SiN film 51N is exposed. Thus, the contact hole 24C that exposes the polysilicon plug 23P is formed in the wiring groove 24A.

At the same time as the formation of the contact hole 24C in the procedure shown in FIG. 48C, the insulating film 24₁ in the wiring groove 24B is etched. As a result, the depth of the wiring groove 24B is increased so as to expose the SiN film 51N.

Figure 48D:
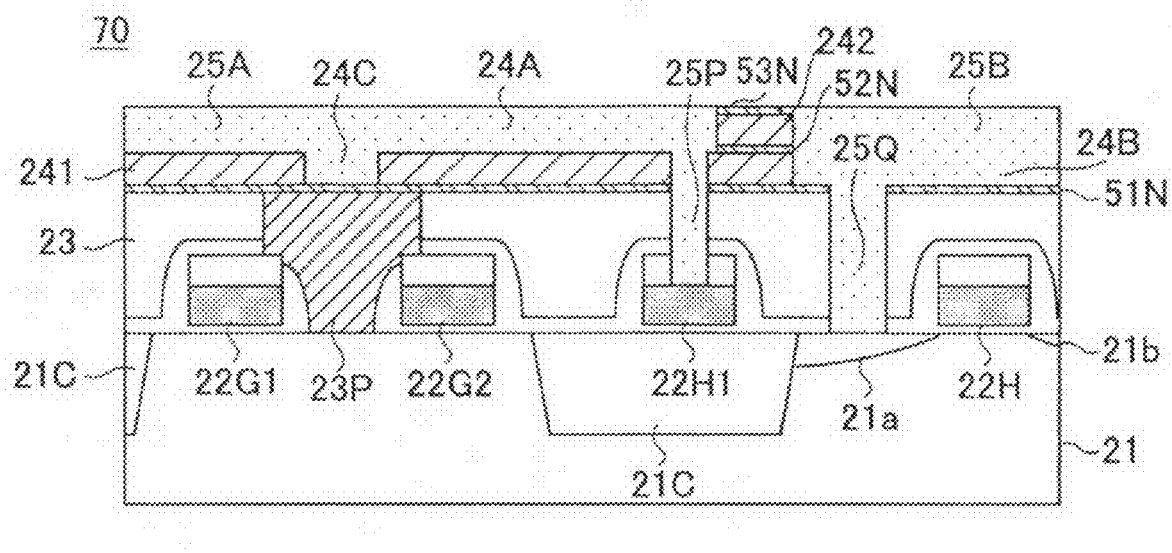

In the procedure shown in FIG. 48D, the resist pattern R43 and the protecting resin film in the contact holes 23C and 23D are removed. The wiring grooves 24A and 24B and the contact holes 23C, 23D, and 24C are filled with Cu film. Excessive Cu film on the SiN film 53N is then removed by the CMP technique. As a result, the Cu wiring patterns 25A and 25B are formed in the wiring grooves 24A and 24B, respectively. The Cu wiring pattern 25A fills the contact hole 24C, and the Cu plug 25P that is part of the Cu wiring pattern 25A fills the contact hole 23C. Further, the Cu plug 25Q that is part of the Cu wiring pattern 25B fills the contact hole 23D.

In the above described manner, the contact holes 23C and 23D can be formed beforehand in accordance with the present invention and the photoresist patterns for the contact holes 23C and 23D are formed at the same height. Thus, a photolithography technique utilizing a high-resolution optical system with a great numerical aperture and a small depth of focus can be employed to form the very small contact holes 23C and 23D.

Ninth Embodiment

Referring now to FIGS. 49A through 49F, the procedures for producing a semiconductor device 80 with a MIM capacitor in accordance with a ninth embodiment of the present invention are described.

Figure 49A:
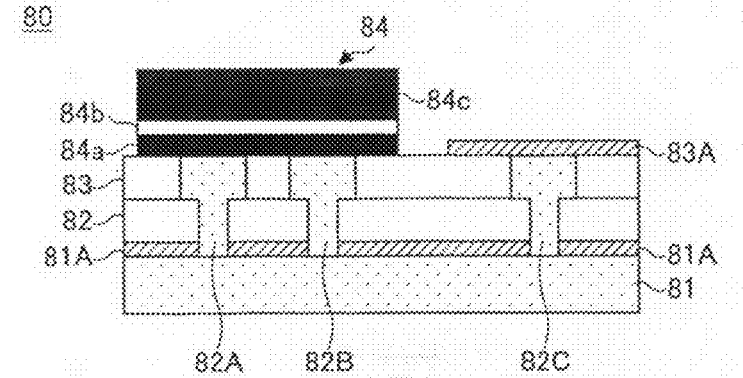
FIGS. 49A through 49F illustrate the procedures for producing a semiconductor device in accordance with a ninth embodiment of the present invention.

As shown in FIG. 49A, the semiconductor device 80 has a wiring pattern 81 that is covered with a SiN barrier film 81A on a silicon substrate (not shown). The SiN barrier film 81A is covered with an interlayer insulating film 82. Further, another interlayer insulating film 83 is formed on the interlayer insulating film 82. In the interlayer insulating films 82 and 83, via plugs 82A, 82B, and 82C that reach the wiring pattern 81 are formed.

The interlayer insulating film 83 has a flat surface, through which the upper surfaces of the via plugs 82A, 82B, and 82C are exposed. In the example shown in FIG. 49A, the via plug 82C is covered with a SiN film 83A formed on the interlayer insulating film 83.

A MIM capacitor 84 that has a laminated structure of a lower electrode 84a, a capacitor insulating film 84b, and an upper electrode 84c is formed on the interlayer insulating film 83. In the example shown in FIG. 49A, the lower electrode 84c on the interlayer insulating film 83 is in contact with the via plugs 82A and 82B.

As described above, in the structure shown in FIG. 49A, the upper electrode 84c of the MIM capacitor 84 is located in a higher position than the upper surface of the via plug 82C embedded in the interlayer insulating film 83.

Figure 49B:
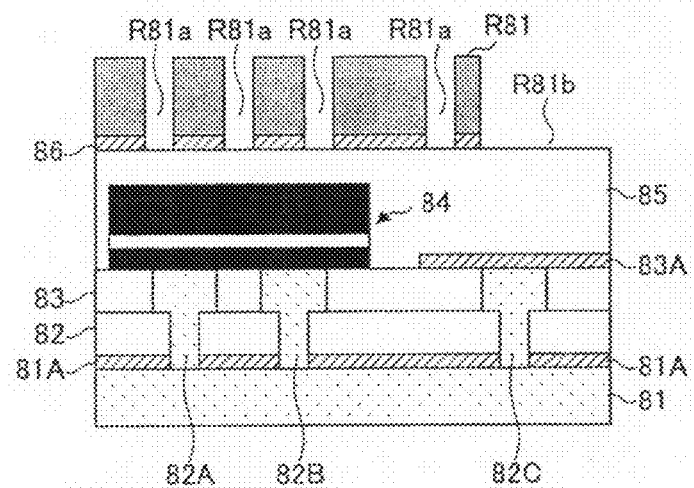
Figure 49C:
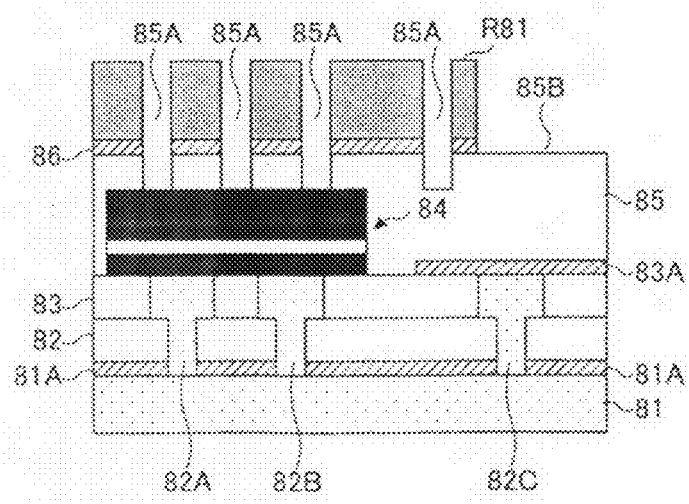

In the next procedure shown in FIG. 49B, the MIM capacitor 84 is covered with another interlayer insulating film 85 formed on the interlayer insulating film 83. After the surface of the interlayer insulating film 85 is flattened by the CMP technique, a resist pattern R81 is formed on the interlayer insulating film 85. The resist pattern R81 has resist windows R81a corresponding to the wiring pattern for the upper electrode 84c of the MIM capacitor 84, and a resist window R81b corresponding to the wiring pattern for the via plug 82C.

Further, in the procedure shown in FIG. 49B, the SiN film 86 is patterned, with the resist pattern R81 serving as a mask. In the next procedure shown in FIG. 49C, the interlayer insulating film 85 is patterned, with the resist pattern R81 serving as a mask. As a result, wiring grooves 85A corresponding to the resist windows R81a, and a wiring groove 85B corresponding to the resist window R81b are formed with the same depths in the interlayer insulating film 85.

Figure 49D:
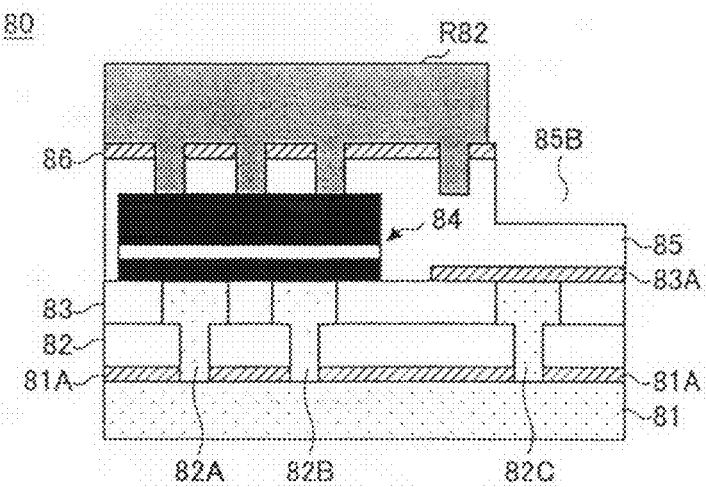

In the next procedure shown in FIG. 49D, the resist pattern R81 is removed, and another resist pattern R82 is formed to cover the wiring grooves 85A. With the resist pattern R82 serving as a mask, and with the SiN film 86 (patterned in the procedure shown in FIG. 49B) serving as a hard mask in the region not covered with the resist pattern R82, the interlayer insulating film 85 is dry-etched so as to increase the depth of the wiring groove 85B.

Figure 49E:
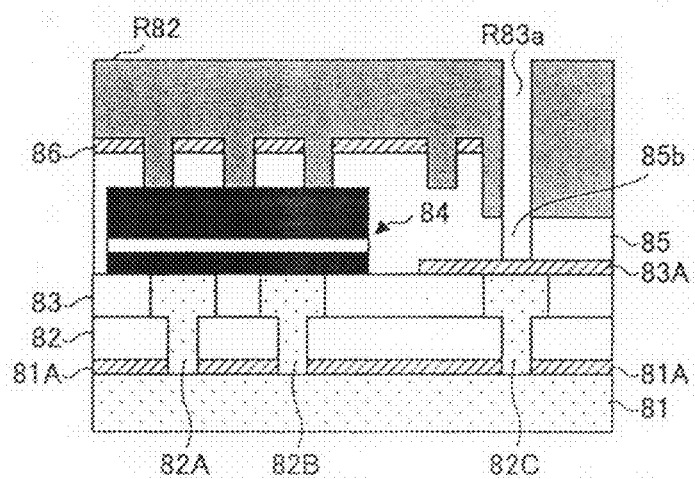

In the next procedure shown in FIG. 49E, the resist pattern R82 is removed, and another resist film is formed to fill the wiring grooves 85A and the wiring groove 85B.

In the procedure shown in FIG. 49E, the resist film is exposed and developed, so as to form a resist pattern R83 that has a resist window R83a corresponding to the via plug 83C. With the resist pattern R83 serving as a mask, the interlayer insulating film 85 is dry-etched, so as to form a via hole 85b in the wiring groove 85B.

Figure 49F:
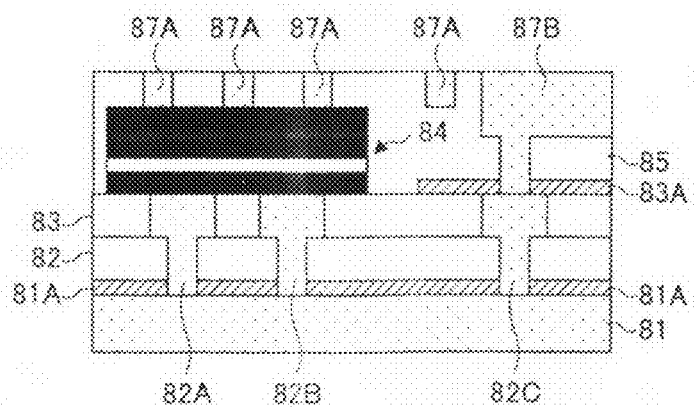

In the next procedure shown in FIG. 49F, the resist pattern R83 is removed, and the SiN film 83A exposed through the bottom of the via hole 85b, and the SiN film 86 formed on the surface of the interlayer insulating film 85 are also removed. The wiring grooves 85A and 85B, as well as the via hole 85b, are filled with Cu film. Excessive Cu film on the interlayer insulating film 85 is then removed by the CMP technique. As a result, the shallow wiring grooves 85A are filled with a Cu wiring pattern 87A, and the deep wiring groove 85B is filled with a Cu wiring pattern 87B.

Tenth Embodiment

Referring now to FIGS. 50A through 50E, the procedures for producing a semiconductor device 90 with a MIM capacitor in accordance with a tenth embodiment of the present invention are described. In FIGS. 50A through 50E, the same components as those of the foregoing embodiments are denoted by the same reference numerals as those in the foregoing drawings, and therefore, explanation of them is omitted.

Figure 50A:
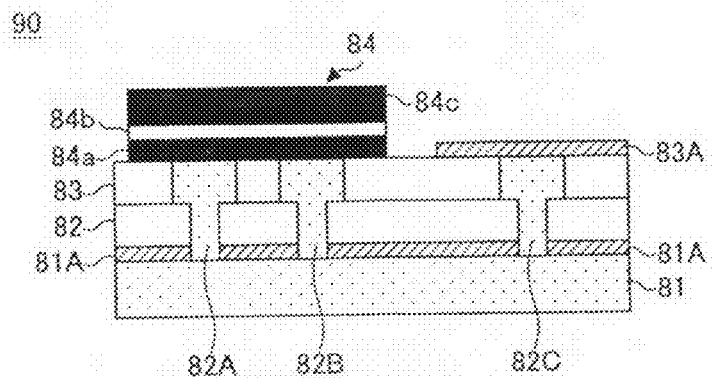
FIGS. 50A through 50E illustrate the procedures for producing a semiconductor device in accordance with a tenth embodiment of the present invention.

The structure shown in FIG. 50A is the same as the structure shown in FIG. 49A. In this embodiment, however, the MIM capacitor 84 is not designed to have a great height. Therefore, the thickness of the upper electrode 84c of the MIM capacitor 84 formed on the interlayer insulating film 83 is made approximately the same as the thickness of the lower electrode 84a in the procedure shown in FIG. 50A.

Figure 50B:
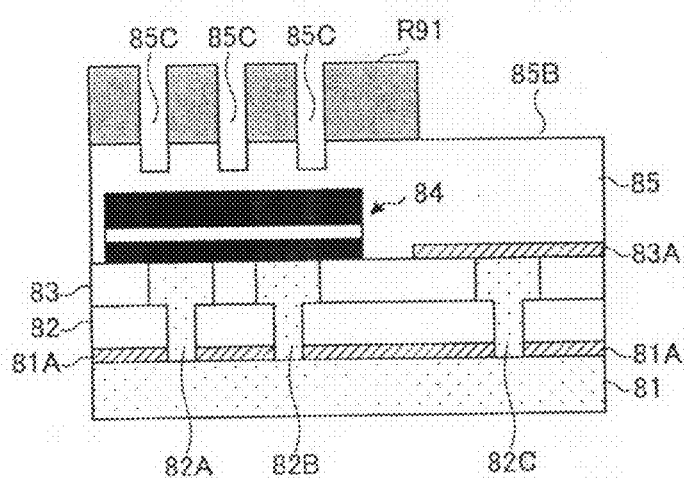

In the procedure shown in FIG. 50B, the interlayer insulating film 85 with a great thickness is formed on the structure shown in FIG. 50A, and a resist pattern R91 is formed on the interlayer insulating film 85. With the resist pattern R91 serving as a mask, the interlayer insulating film 85 is patterned. As a result, the wiring grooves 85A for the wiring pattern to be formed on the MIM capacitor 84 are formed in the interlayer insulating film 85, and the wiring groove 85B for the wiring pattern to be connected to the via plug 82C is formed. Also, wiring grooves 85C corresponding to contact holes to be formed in part of the wiring grooves 85A are formed. The wiring grooves 85C are designed to have such a depth as not to expose the upper electrode 84c of the MIM capacitor 84.

Figure 50C:
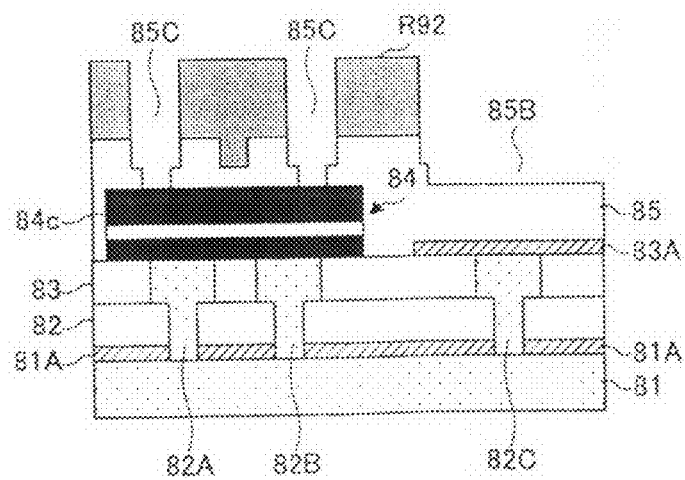

In the next procedure shown in FIG. 50C, the resist pattern is removed, and another resist pattern R92 is formed to cover the wiring grooves 85A. With the resist pattern R92 serving as a mask, dry etching is performed so as to increase the depth of the wiring groove 85B and the depth of each of the wiring grooves 85C corresponding to the contact holes. Thus, the upper electrode 84c of the MIM capacitor 84 is exposed. As a result, the wiring grooves 85C form the contact holes that expose the upper electrode 84c of the MIM capacitor 84 in the interlayer insulating film 85.

Figure 50D:
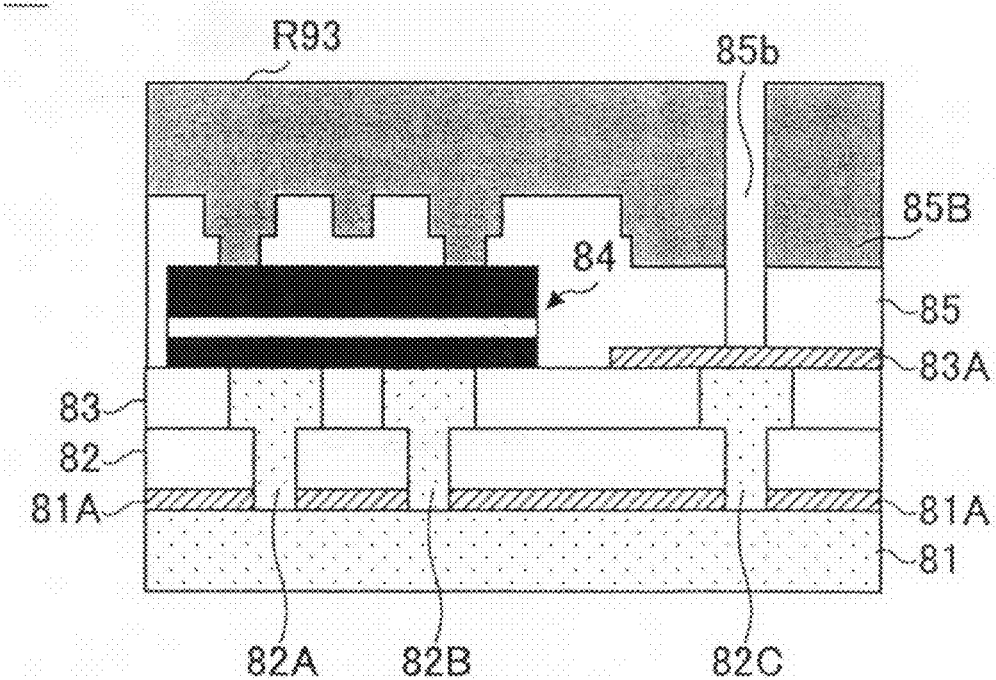

In the next procedure shown in FIG. 50D, the resist pattern R92 is removed, and a resist film is formed to fill the wiring grooves 85A and 85B and the contact holes 85C. The resist film is exposed and developed, so as to form a resist pattern R93 that has a resist window corresponding to the via plug 82C. In the procedure shown in FIG. 50D, with the resist pattern R93 serving as a mask, the interlayer insulating film 85 in the wiring groove 85B is patterned, so as to form a contact hole 85b that exposes the SiN film 83A covering the via plug 82C.

Figure 50E:
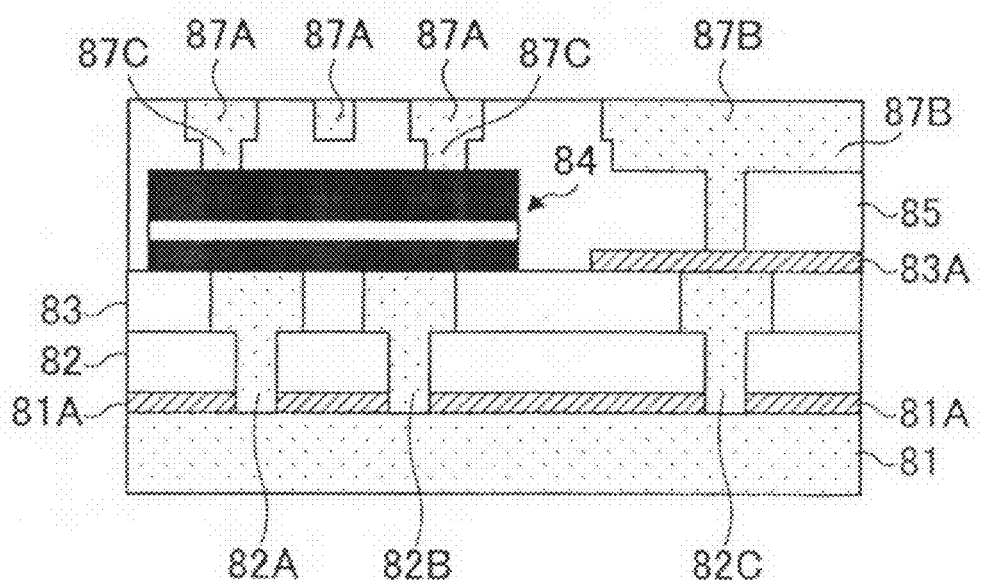

In the next procedure shown in FIG. 50E, the resist pattern R93 is removed, and the contact hole 85b is removed. Cu film is then deposited on the interlayer insulating film 85, so as to fill the wiring grooves 85A and 85B and the contact holes 85C. Excessive Cu film on the interlayer insulating film 85 is then removed by the CMP technique. As a result, a structure in which the Cu wiring pattern 87A is formed in the wiring grooves 85A, and the Cu wiring pattern 87B is formed in the wiring groove 85B. In this structure, however, part of the Cu wiring pattern 87A is in contact with the upper electrode 84c of the MIM capacitor 84 via Cu contact plugs 87C that fill the respective contact holes 85C.

In this embodiment, the depth of the Cu wiring pattern 87B is also greater than the depth of the Cu wiring pattern 87A that is in contact with the MIM capacitor 84.

Although the present invention has been described by way of preferred embodiments, it is not limited to them, and various modification and changes can be made to the above embodiments, without departing from the scope of the present invention.

What is claimed:

1. A method of producing a semiconductor device, comprising the steps of:
   forming a first interlayer insulating film on a substrate;
   forming an opening in the first interlayer insulating film, the opening penetrating the first interlayer insulating film, so as to expose a first conductive region formed on the substrate;
   forming a second conductive region in the opening in such a manner that the second conductive region has an upper surface located in a higher position than a third conductive region that is formed on the substrate;
   forming a second interlayer insulating film on the first interlayer insulating film, so as to cover the second conductive region;
   forming a wiring groove in the second interlayer insulating film, the wiring groove exposing the upper surface of the first interlayer insulating film, so as to expose the second conductive region;
   forming a contact hole or a plurality of contact holes in the wiring groove by etching the first interlayer insulating film, so as to expose the third conductive region;
   filling the wiring groove, including the contact hole or the plurality of contact holes, with a conductive material; and
   forming a wiring pattern made of the conductive material in the wiring groove, and a contact plug or a plurality of contact plugs made of the conductive material in the contact hole or in the plurality of contact holes, after removing the conductive material on the second interlayer insulating film by a chemical mechanical polishing technique.

2. The method as claimed in claim 1, further comprising the step of:
   forming a step portion in relation to the portion exposing the second conductive region, by etching the surface of the first interlayer insulating film at the portion in which the contact hole or the plurality of contact holes are to be formed, prior to the step of forming the second interlayer insulating film.

3. The method as claimed in claim 1, wherein the semiconductor device is a DRAM integrated circuit device that has a capacitor formed in the substrate.

* * * * *